United States Patent
Li et al.

(10) Patent No.: US 12,538,721 B2
(45) Date of Patent: Jan. 27, 2026

(54) SEQUENCING CHIP AND MANUFACTURING METHOD THEREFOR

(71) Applicant: BGI SHENZHEN, Guangdong (CN)

(72) Inventors: Shifeng Li, Guangdong (CN); Tengyue Li, Guangdong (CN); Yuan Li, Guangdong (CN); Zhaohui Wang, Guangdong (CN); Xueqin Jiang, Guangdong (CN); Jiacheng Chen, Guangdong (CN); Aoli Wang, Guangdong (CN); Fuxing Huang, Guangdong (CN); Xiaogang Song, Guangdong (CN); Lingling Peng, Guangdong (CN); Handong Li, Guangdong (CN); Wenwei Zhang, Guangdong (CN)

(73) Assignee: BGI SHENZHEN, Guangdong (CN)

( * ) Notice: Subject to any disclaimer, the term of this patent is extended or adjusted under 35 U.S.C. 154(b) by 1231 days.

(21) Appl. No.: 17/377,114

(22) Filed: Jul. 15, 2021

(65) Prior Publication Data
US 2021/0384031 A1    Dec. 9, 2021

Related U.S. Application Data

(63) Continuation of application No. PCT/CN2019/073332, filed on Jan. 28, 2019.

(51) Int. Cl.
  *H01L 21/02* (2006.01)
  *C12Q 1/6869* (2018.01)
  *H01L 21/78* (2006.01)

(52) U.S. Cl.
  CPC ........ *H01L 21/02274* (2013.01); *H01L 21/78* (2013.01); *C12Q 1/6869* (2013.01)

(58) Field of Classification Search
None
See application file for complete search history.

(56) References Cited

U.S. PATENT DOCUMENTS

| 5,891,630 A | 4/1999 | Eggers et al. |
| 2004/0209301 A1 | 10/2004 | You et al. |

(Continued)

FOREIGN PATENT DOCUMENTS

| CN | 1538163 A | 10/2004 |
| CN | 101323879 A | 12/2008 |

(Continued)

OTHER PUBLICATIONS

Australian Notice of Acceptance mailed Feb. 15, 2023 in Australian Application No. 2019426202, a foreign counterpart of U.S. Appl. No. 17/377,114, 4 pages.

(Continued)

*Primary Examiner* — David Sample
(74) *Attorney, Agent, or Firm* — Lee & Hayes, P.C.

(57) ABSTRACT

Provided are a chip matrix, a sequencing chip, and a manufacturing method thereof. The chip matrix includes: a wafer layer (111), the wafer layer (111) having cutting lines that are evenly distributed thereon; a first silicon oxide layer (112), the first silicon oxide layer (112) being made of silicon oxide and formed on an upper surface of the wafer layer (111); a transition metal oxide layer (113), the transition metal oxide layer (113) being made of transition metal oxide and formed on an upper surface of the first silicon oxide layer (112). The chip matrix has characteristics such as resistances against high temperature, high humidity and other harsh environments. Meanwhile, by changing pH, surfactant and other components of a solution containing (Continued)

sequences to be sequenced, a surface functional region of the chip matrix can specifically adsorb a sequence to be sequenced.

21 Claims, 41 Drawing Sheets

(56) References Cited

U.S. PATENT DOCUMENTS

| | | | |
|---|---|---|---|
| 2009/0011943 | A1 | 1/2009 | Drmanac et al. |
| 2014/0080133 | A1 | 3/2014 | Chen et al. |
| 2016/0178569 | A1 | 6/2016 | Hoffman et al. |
| 2019/0088463 | A1* | 3/2019 | Li .................. H01L 21/02422 |
| 2020/0048698 | A1 | 2/2020 | Cai et al. |
| 2021/0164032 | A1 | 6/2021 | Pang et al. |

FOREIGN PATENT DOCUMENTS

| | | |
|---|---|---|
| CN | 101363870 A | 2/2009 |
| CN | 103221810 A | 7/2013 |
| CN | 107008513 A | 8/2017 |
| CN | 107118960 A | 9/2017 |
| CN | 108220412 A | 6/2018 |
| DE | 102015116495 A1 | 3/2017 |
| JP | 2020534673 A | 11/2020 |
| WO | WO2003/052097 A1 | 6/2003 |
| WO | WO2012/122418 A1 | 9/2012 |
| WO | WO2015/021080 A2 | 2/2015 |
| WO | WO2018/156246 A1 | 8/2018 |
| WO | WO2018/175341 A1 | 9/2018 |
| WO | WO2019/060177 A1 | 3/2019 |

OTHER PUBLICATIONS

Chinese Office Action mailed Feb. 22, 2023 for Chinese Application No. 201980090338.1, a foreign counterpart to U.S. Appl. No. 17/377,114, 18 pages.
Japanese Office Action mailed Feb. 16, 2023 in Japanese Application No. 2021-541150, a foreign corresponding application of U.S. Appl. No. 17/377,114, 12 pages, translated.
Singapore Office Action mailed Mar. 23, 2023 in Singapore Application No. 11202108115X, a foreign counterpart to U.S. Appl. No. 17/377,114, 7 pages.
Korean Office Action dated Apr. 27, 2023 in Korean Application No. 9-5-2023-039367155, a foreign corresponding application of U.S. Appl. No. 17/377,114, 10 pages.
Australian Office Action dated Oct. 26, 2022 in Australian Application No. 2019426202, a foreign corresponding application of U.S. Appl. No. 17/377,114, 4 pages.
Canadian Office Action dated Sep. 27, 2022 in Canadian Application No. 3,125,496, a foreign corresponding application of U.S. Appl. No. 17/377,114, 6 pages.
European Extended Search Report mailed Jul. 15, 2022 in European Application No. 19913626.8, a foreign corresponding application of U.S. Appl. No. 17/377,114, 8 pages.
Japanese Office Action mailed Aug. 2, 2022 in Japanese Application No. 2021-54115, a foreign corresponding application of U.S. Appl. No. 17/377,114, 14 pages, translated.
International Search Report and Written Opinion mailed Oct. 23, 2019 in International Application No. PCT/CN2019/073332, 12 pages.

* cited by examiner

SEQUENCING CHIP AND MANUFACTURING METHOD THEREFOR

CROSS-REFERENCE TO RELATED APPLICATIONS

The present application is a continuation of International Application No. PCT/CN2019/073332 filed Jan. 1, 28, 2019, which is incorporated herein by reference in its entirety.

TECHNICAL FIELD

The present disclosure relates to the field of biotechnology, and particularly, to a sequencing chip and a manufacturing method therefor.

BACKGROUND

The microarray sequencing chip is one of the prerequisites for high-throughput sequencing. In the current DNA Nano Ball (DNB) sequencing technology, DNBs are required to be fixed on a sequencing chip for subsequent sequencing biochemical reactions. As an example, for the sequencing chips now in use, nearly 200 million DNB-binding sites are provided on a surface of each chip. In order to stably fix the DNBs to the binding sites, the surface of the sequencing chip is required to subject to an amination treatment. In addition, regions on the chip surface other than binding sites are required to subjected other treatments, in order to reduce non-specific adsorption as much as possible, reduce background optical signal, and improve sequencing quality. Accordingly, one of the basic tasks for achieving high-quality sequencing is to manufacture sequencing chips with microarrays efficiently and with lost cost.

The existing method for manufacturing sequencing chip mainly includes the following steps. A nano-array patterned photoresist layer is first formed on a silicon wafer through a semiconductor process. The patterned layer may include multiple units with the same structure, and each unit can serve as one sequencing chip. Then the wafer including the patterned layer is subjected to a chemical vapor deposition to form an amination layer in a functional region of the wafer. Through an assembly process, the wafer is divided into individual chips, which are assembled into sequencing chips suitable for sequencing.

The process of forming the patterned photoresist layer on the silicon wafer includes: providing a silicon wafer, and forming a silicon oxide layer on a surface of the silicon wafer; then forming a hexamethyldisiloxane (HMDS) layer on the silicon oxide layer through chemical vapor deposition (CVD) or spin coating, and forming a patterned photoresist layer through standard photolithography, developing, and oxygen plasma etching processes. In the patterned photoresist layer, a part of the photoresist layer, which has been etched away through developing and subjected to the oxygen plasma treatment, can expose the underlying silicon oxide layer. The patterned photoresist layer includes a plurality of units with the same nano-array structure, and each unit can form a sequencing chip.

The process of forming an amination layer in the functional region includes: performing an amination treatment on the silicon wafer formed with the patterned photoresist layer through chemical vapor deposition. As results, the amination layer is formed on the silicon oxide layer in a region where the photoresist is absent and the silicon oxide is exposed, while the amination layer is formed on the photoresist layer in other regions that are covered by the photoresist.

The assembly process includes: coating the wafer that has been subjected to the amination treatment with a second protective photoresist layer, cutting the wafer through a wafer dicing process to form multiple individual chips, removing the photoresist on the individual chips to form a functionalized array pattern including aminated regions and HMDS regions that are alternately arranged on the surface, and assembling the chip with a frame and a cover glass through glue or other adhesives and forming a sequencing chip containing a fluid channel and liquid inlet and outlet. The fluid channel is formed between the cover glass and the silicon chips and is isolated by the glue or adhesive, and the liquid inlet and outlet can be located on the frame or the cover glass.

After the sequencing chip is formed, the DNB sample to be sequenced is injected into the fluid channel via the liquid inlet and outlet, and contacts the functionalized array of the silicon chip including the alternately arranged aminated regions and the HMDS regions. The DNBs can be selectively adsorbed by the aminated regions and repelled by the HMDS regions, and thus they can be arranged in an array to form a DNB array on the surface. By acquiring the signal emitted by the DNB array with an optical method, the arrangement of the bases on the DNBs can be identified for sequencing applications.

The sequencing chip prepared as above can be used for sequencing in such a manner that DNBs are selectively adsorbed by the aminated regions and HMDS regions on the surface of the silicon chips. However, the aminated region and the HMDS region are a monomolecular layer on the surface of the silicon oxide, and the monomolecular layer on the surface may be easily damaged through physical and chemical contact (such as surface scratching, high temperature or contacts with other chemical reactive reagent) in the process of assembling or usage, thereby affecting the performance of the sequencing chip, or even causing scrapping of the chip. In this regard, the efficiency of generating valid data may be affected when using the sequencing chip for sequencing applications, the yield of the sequencing chip can also be reduced, which lowers the output of the sequencing chip, and indirectly increases the cost of the sequencing chip.

Therefore, it is urgent to develop an efficient, low-cost, and environmentally friendly sequencing chip.

SUMMARY

In view of the drawbacks of the existing sequencing chips mentioned above, the present disclosure provides a new sequencing chip structure and a manufacturing method, which is more stable and reliable, and have better performance. In the present disclosure, instead of using the monomolecular layer to form a DNB array, a patterned array (well-like or spot-like) of metal oxide regions and silicon oxide regions that are alternately present on a surface of a silicon wafer is adopted to selectively adsorb DNBs and to form a DNB array for sequencing. The sequencing chip of the present disclosure is also prepared by a semiconductor process. First, a patterned array of transition metal oxide regions and silicon oxide regions that are alternately present is formed on a wafer, then the wafer is cut into a plurality of individual chips by a dicing process, and a sequencing chip is formed by assembling one single chip. The DNB-binding site regions (i.e., functional regions, or transition metal oxide regions) and the DNB non-binding site regions (i.e., non-functional regions, silicon oxide regions) on the chip surface can be selectively modified by utilizing the difference in surface properties between a transition metal oxide surface and a silicon oxide surface. Moreover, in order to further improve the specific binding of the functional regions of the chip surface (the DNB-binding site regions) to the DNBs, applicants also propose for the first time to introduce amino groups onto the transition metal oxide. In addition, applicants also propose for the first time to modify the non-functional regions of the chip surface (i.e., the DNB non-binding site regions) with a copolymer having a good biocompatibility (such as polyethylene glycol-based compounds), in order to reduce the DNB-binding of the non-functional regions on the chip surface and to further improve the specific DNB-binding of the functional regions on the chip surface. In this way, the quality of sequencing can be improved. The sequencing chip of the present disclosure has the advantages in that, the surface of the silicon wafer is an array formed by the metal oxide regions and the silicon oxide regions that are alternately arranged, which is more stable and reliable than an array formed by a monomolecular layer. Thus, a data output efficiency of the sequencing chip can be improved, the output of the sequencing chip is enhanced, and the cost can be reduced. In addition, the present disclosure also provides preferred structural sizes of the sequencing chip based on optical simulation results, and these preferred structural sizes can intensify the signal emitted by the sample to be tested, thereby improving the performance of the sequencing chip.

In a first aspect of the present disclosure, the present disclosure provides a chip matrix. According to an embodiment of the present disclosure, the chip matrix includes: a wafer layer having cutting lines that are evenly distributed on the wafer layer; a first silicon oxide layer, the first silicon oxide layer being made of silicon oxide and formed on an upper surface of the wafer layer; and a transition metal oxide layer, the transition metal oxide layer being made of a transition metal oxide and formed on an upper surface of the first silicon oxide layer.

Unless otherwise specified, the "chip matrix" in the present disclosure refers to a wafer that can be divided into sequencing chip units. For example, the chip matrix according to the embodiments of the present disclosure can be divided into chip units, the chip units can be further assembled into a sequencing chip body, and a sequencing chip is formed by the sequencing chip body and a supporting frame with a liquid inlet and outlet.

The chip matrix according to the embodiments of the present disclosure has a transition metal oxide layer made of a transition metal oxide and a silicon oxide layer made of silicon oxide. The transition metal oxide and the silicon oxide have different properties. Therefore, the sequences to be sequenced, especially DNBs can be selectively adsorbed on the transition metal oxide regions of the chip matrix according to the embodiments of the present disclosure, by changing pH, surfactant composition or others of a solution containing the sequences to be tested. In this case, the chip matrix according to the embodiments of the present disclosure can be divided into two regions, i.e., a sequence-binding site region (i.e., functional region) and a sequence non-binding site region (i.e., non-functional region). It is understandable that, the transition metal oxide layer on the sequencing matrix serves as the functional region that specifically binds to the sequences to be sequenced, while the silicon oxide layer that cannot bind to the sequences to be sequenced serves as the non-functional region. In addition, the binding site regions and non-binding site regions of the sequencing sequence can be selectively modified to further enhance the transition metal oxide region's capability of selectively adsorbing the sequences to be tested. The chip matrix according to the embodiments of the present disclosure has the characteristics such as resistance against high temperature, high humidity and other harsh environments.

In a second aspect of the present disclosure, the present disclosure provides a sequencing chip. According to an embodiment of the present disclosure, the sequencing chip includes a chip body, the chip body includes a plurality of chip units, and the plurality of chip units is obtained by cutting the aforementioned chip matrix along the cutting lines of the wafer layer. Applicants found that the sequences to be sequenced can be selectively adsorbed on the transition metal oxide layer by changing pH and surfactant composition of the solution containing the sequences to be sequenced, especially DNBs. The sequencing chip according to the embodiments of the present disclosure is more stable and the sequencing results thereof is more reliable, thereby significantly improving the data output efficiency of the sequencing chip, increasing the output of the sequencing chip, and significantly reducing the sequencing cost.

In a third aspect of the present disclosure, the present disclosure provides a method for manufacturing the aforementioned chip matrix. According to the embodiments of the present disclosure, the method includes: performing surface modification on the wafer layer. The surface modification includes: treating a surface of the wafer layer with a transition metal oxide to form the transition metal oxide layer. The transition metal oxide layer is formed on an upper surface of the first silicon oxide layer, the first silicon oxide layer is provided on the upper surface of the wafer layer, and the silicon oxide layer is made of silicon oxide, and the wafer layer has cutting lines evenly distributed on the wafer layer. The method according to the embodiments of the present disclosure is simple to operate and environmentally friendly.

In a fourth aspect of the present disclosure, the present disclosure provides a method for manufacturing a sequencing chip. According to the embodiments of the present disclosure, the method includes: assembling a chip unit. The chip unit is obtained by cutting a chip matrix along cutting lines of a wafer layer of the chip matrix, and the chip matrix is as defined above or obtained by the method described above. The method according to the embodiments of the present disclosure is simple to operate, and the production yield of the sequencing chips is high.

In a fifth aspect of the present disclosure, the present disclosure provides a sequencing method. According to the embodiments of the present disclosure, the method includes: performing sequencing using a sequencing chip, the sequencing chip is as defined above or manufactured by the method described above. According to the method of the embodiments of the present disclosure, the sequencing results are more accurate and the cost is lower.

BRIEF DESCRIPTION OF DRAWINGS

FIGS. 1-5 are cross-sectional views of respective processes in a preparation of a sequencing chip including a patterned transition metal oxide layer with "spot" structures according to an aspect of the present disclosure, in which FIG. 1 is a cross-sectional view of a wafer structure 1-10 according to an embodiment of the present disclosure, in which a transition metal oxide layer film having arrayed "spot" structures is formed on a silicon oxide layer of a wafer;

FIG. 2 is a cross-sectional view of multiple individual chips 1-20 formed after the wafer 1-10 shown in FIG. 1 is subjected to a dicing process according to an embodiment of the present disclosure;

FIG. 3 is a cross-sectional view of a sequencing chip 1-30 formed by assembling the chip shown in FIG. 2 according to an embodiment of the present disclosure;

FIG. 4 is a sequencing chip 1-40 according to an embodiment of the present disclosure, which is formed after the sequencing chip 1-30 in FIG. 3 is subjected to a surface functionalization modification;

FIGS. 6-11 are cross-sectional views of respective processes in a preparation of a sequencing chip according to another aspect of the present disclosure, the sequencing chip including a patterned transition metal oxide layer with arrayed "well" structures, in which FIG. 6 is a cross-sectional view of a wafer structures 2-10 according to an embodiment of the present disclosure, in which a transition metal oxide layer film is formed on a silicon oxide layer on the surface included in a wafer;

FIG. 7 is a cross-sectional view of a wafer 2-20 according to an embodiment of the present disclosure, in which a silicon oxide layer having arrayed "well" structures is formed on the transition metal oxide layer film of the wafer structure 2-10 shown in FIG. 6;

FIG. 8 is a cross-sectional view of multiple individual chips 2-30 according to an embodiment of the present disclosure, which are formed after the wafer structure 2-20 having the arrayed "well" structures shown in FIG. 7 is subjected to a dicing process;

FIG. 9 is a cross-sectional view of a sequencing chip 2-40 formed by assembling one single chip shown in FIG. 8 according to an embodiment of the present disclosure;

FIG. 10 is a cross-sectional view of a sequencing chip 2-50 according to an embodiment of the present disclosure, which is formed after the sequencing chip shown in FIG. 9 is subjected to a surface functionalization modification;

FIGS. 12-17 are cross-sectional views of various processes in a preparation of a sequencing chip including another patterned transition metal oxide layer with arrayed "well" structures according to another aspect of the present disclosure, in which FIG. 12 is a cross-sectional view of a wafer structure 3-10 according to an embodiment of the present disclosure, in which a transition metal oxide layer having arrayed "spot" structures is formed on a silicon oxide layer on the surface of a wafer;

FIG. 13 is a cross-sectional view of a wafer 3-20 according to an embodiment of the present disclosure, in which a silicon oxide layer with arrayed "well" structures is formed on the wafer structure 3-10 having the transition metal oxide layer as shown in FIG. 12;

FIG. 14 is a cross-sectional view of multiple individual chips 3-30 according to an embodiment of the present disclosure, which is formed after the wafer structure 3-20 having the arrayed "well" structures shown in FIG. 13 is subjected to a dicing process;

FIG. 15 is a cross-sectional view of a sequencing chip 3-40 according to an embodiment of the present disclosure, which is formed by assembling one single chip shown in FIG. 14;

FIG. 16 is a cross-sectional view of a sequencing chip 3-50 formed after the sequencing chip shown in FIG. 15 is subjected to a surface functionalization modification according to an embodiment of the present disclosure;

FIGS. 18-22 are cross-sectional views of respective processes in a preparation of a back-illuminated sequencing chip according to another aspect of the present disclosure, which includes a patterned transition metal oxide layer having arrayed "spot" structures;

FIG. 18 is a cross-sectional view of a wafer structure 4-10 according to an embodiment of the present disclosure, in which a transition metal oxide layer film having arrayed "spot" structures is formed on a silicon oxide layer of a wafer;

FIG. 19 is a cross-sectional view of multiple individual chips 4-20 formed after the wafer structure 4-10 with arrayed "spot" structures as shown in FIG. 18 is subjected to a dicing process according to an embodiment of the present disclosure;

FIG. 20 is a cross-sectional view of a sequencing chip 4-30 formed by assembling the individual chip 4-20 shown in FIG. 19 according to an embodiment of the present disclosure. During the assembly process, the chip and the frame are assembled with the patterned layer facing downward, and thus an excitation light source/camera illuminates the DNBs and acquires signals through the quartz or glass substrate from the back of the chip;

FIG. 21 is a cross-sectional view of a sequencing chip 4-40 according to an embodiment of the present disclosure, which is formed after the sequencing chip shown in FIG. 20 is subjected to a surface functionalization modification;

FIGS. 23-28 are cross-sectional views of respective processes in a preparation of a back-illuminated sequencing chip according to another aspect of the present disclosure, in which includes a patterned transition metal oxide layer having arrayed "well" structures, in which FIG. 23 is a cross-sectional view of a wafer structure 5-10 according to an embodiment of the present disclosure, in which a transition metal oxide layer film is formed on a surface of a wafer including a silicon oxide layer;

FIG. 24 is a cross-sectional view of a wafer 5-20 according to an embodiment of the present disclosure, in which a silicon oxide layer having arrayed "well" structures is formed on a transition metal oxide layer film of the wafer structure 5-10 shown in FIG. 23;

FIG. 25 is a cross-sectional view of multiple individual chips 5-30 according to an embodiment of the present disclosure, which is formed after the wafer structure 5-20 having the arrayed "well" structures shown in FIG. 24 is subjected to a dicing process;

FIG. 26 is a cross-sectional view of a sequencing chip 5-40 according to an embodiment of the present disclosure, which is formed after assembling the individual chip 5-30 in FIG. 25. During the assembly process, the chip and the frame are assembled with the patterned layer facing downward, allowing the excitation light source/camera to illuminate the DNBs and acquire signals from the back of the chip through the quartz or glass substrate;

FIG. 27 is a cross-sectional view of a sequencing chip 5-50 according to an embodiment of the present disclosure, which is formed after the sequencing chip shown in FIG. 26 is subjected to a surface functionalization modification;

FIGS. 29-34 are cross-sectional views of respective processes in a preparation of another back-illuminated sequencing chip according to another aspect of the present disclosure, which includes a patterned transition metal oxide layer with arrayed "well" structures, in which, FIG. 29 is a cross-sectional view of a wafer structure 6-10 according to an embodiment of the present disclosure, which includes a transition metal oxide layer 613 having arrayed "spot" structures formed on a surface of a wafer 611 having a silicon oxide layer 612;

FIG. 30 is a cross-sectional view of a wafer 6-20 according to an embodiment of the present disclosure, which is formed after a silicon oxide layer having arrayed "well" structures is formed on the wafer structure 6-10 having the transition metal oxide layer film as shown in FIG. 29;

FIG. 31 is a cross-sectional view of multiple individual chips 6-30 according to an embodiment of the present disclosure, which is formed after the wafer structure 6-20 having the arrayed "well" structures as shown in FIG. 30 is subjected to a dicing process;

FIG. 32 is a cross-sectional view of a sequencing chip 6-40 according to an embodiment of the present disclosure, which is formed by assembling the individual chip 6-30 in FIG. 31. During the assembly process, the chip and a frame are assembled with the patterned layer facing downward, allowing the excitation light source/camera to illuminate the DNBs and acquire signals from the back of the chip through the quartz or glass substrate;

FIG. 33 is a cross-sectional view of a sequencing chip 6-50 according to an embodiment of the present disclosure, which is formed after the sequencing chip shown in FIG. 32 is subjected to a surface functionalization modification;

FIGS. 35-41 are cross-sectional views of various processes in a preparation of a sequencing chip according to another aspect of the present disclosure, in which a patterned transition metal oxide layer having arrayed "spot" structures or "well" structures is formed on a CMOS image sensor wafer;

FIG. 35 is a cross-sectional view of a CMOS image sensor wafer 7-10 including a surface oxide layer according to an embodiment of the present disclosure;

FIG. 37 is a cross-sectional view of multiple individual chips 7-30 according to an embodiment of the present disclosure, which is formed after the CMOS wafer 7-20 including the patterned transition metal oxide layer shown in FIG. 36 is subjected to a dicing process;

FIG. 38 is a cross-sectional view of a chip structure 7-40 according to an embodiment of the present disclosure, which is formed after a chip attaching and wire bonding of the chip shown in FIG. 37;

FIG. 39 is a cross-sectional view of a sequencing chip 7-50 according to an embodiment of the present disclosure, which formed by attaching a cover structure to the chip 7-50 after the chip attaching and wire bonding as shown in FIG. 38;

FIG. 40 is a cross-sectional view of a sequencing chip 7-60 according to an embodiment of the present disclosure, which is formed after the sequencing chip shown in FIG. 39 is subjected to a surface functionalization modification;

REFERENCE SIGNS

Figure 1:
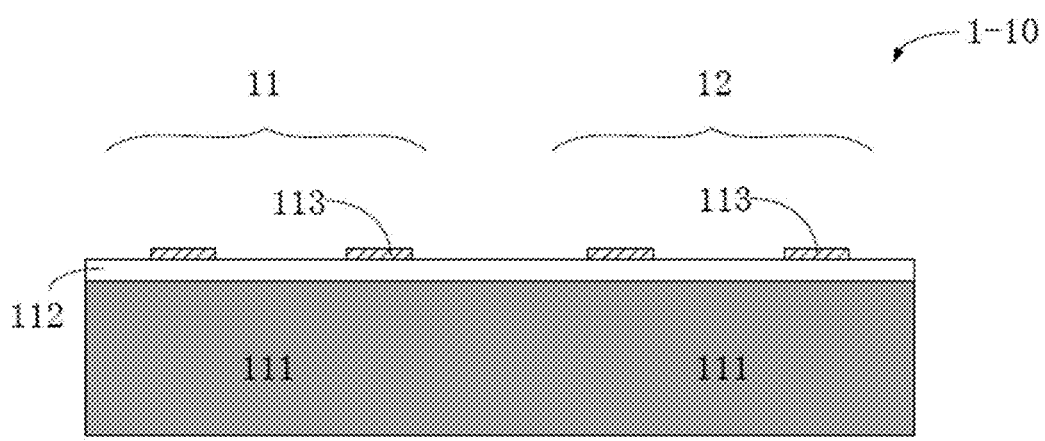

1-10: wafer structure
11 and 12: individual chips on wafer
111: wafer substrate structure
112: silicon oxide layer
113: patterned transition metal oxide layer (i.e., transition metal oxide "spots")
1-20: multiple individual wafer structures
121: cutting slot
1-30: assembled sequencing chip formed by one individual chip
131: frame structure
132: cover glass
133: liquid inlet and outlet
134: fluid channel
1-40: sequencing chip formed after performing a surface functionalization modification
141: amino group
142: polyethylene glycol molecular layer
1-50A: sequencing chip containing DNB array formed after DNBs are loaded
1-50B: sequencing chip in which a DNB array is formed
151: DNB sample
152: light source and camera
2-10: wafer structure formed by forming a silicon oxide layer and a transition metal oxide layer on a bare wafer
21 and 22: individual chips
211: wafer substrate
212: silicon oxide layer
213: transition metal oxide layer
2-20: wafer formed after forming a silicon oxide layer with patterned "well" structures on a transition metal oxide layer included in a wafer
221: silicon oxide layer
222: "well" structures discretely arranged in an array
2-30: multiple individual chips formed after a wafer structure is subjected to a dicing process
231: cutting slot
2-40: assembled sequencing chip formed by one individual chip
241: frame
242: cover glass
243: liquid inlet and outlet
244: fluid channel
2-50: sequencing chip formed after performing a surface functionalization modification
251: silicon oxide layer 252: transition metal oxide layer
2-60A: sequencing chip with a DNB array formed after DNBs are loaded on the sequencing chip
2-60B: sequencing chip in which a DNB array is formed
261: DNB
262: excitation light source/camera structure
3-10: wafer structure having a patterned transition metal oxide layer
31 and 32: individual chips
311: wafer
312: silicon oxide layer
313: transition metal oxide layer
3-20: wafer structure formed after a silicon oxide layer with patterned "well" structures is formed on a wafer containing a patterned transition metal oxide layer
321: silicon oxide layer
322: "well" structure on the silicon oxide layer
3-30: multiple individual chips, which are separated by cutting slots and formed after performing a dicing process on a wafer structure
331: cutting slot
3-40: assembled sequencing chip formed by one individual chip
341: frame
342: cover glass
343: liquid inlet and outlet
344: fluid channel
3-50: sequencing chip formed after performing a surface functionalization modification
351: silicon oxide layer
352: transition metal oxide layer
3-60A: sequencing chip having a DNB array, which is formed after performing surface functionalization treatment on the sequencing chip and loading with DNBs
361: DNB
362: excitation light source/camera structure
3-60B: sequencing chip in which a DNB array is formed
4-10: wafer structure formed by forming a patterned transition metal oxide layer on a silicon oxide layer of a quartz wafer
41 and 42: individual chips on wafer
411: quartz wafer
412: silicon oxide layer
413: patterned transition metal oxide layer
4-20: multiple individual chips that are separated by cutting slots and formed after a wafer is subjected to a dicing process
421: cutting slot
4-30: sequencing chip formed by packaging one individual chip
431: frame
432: liquid inlet and outlet
433: fluid channel
4-40: sequencing chip formed after performing a surface functionalization modification
441: silicon oxide layer
442: transition metal oxide layer
4-50A: sequencing chip having a DNB array, formed after the sequencing chip is subjected to a surface functionalization modification and DNBs are loaded
4-50B: sequencing chip in which a DNB array is formed
451: DNB
452: excitation light source/camera
5-10: wafer structure formed by forming a silicon oxide layer and a transition metal oxide layer on a bare wafer
51 and 52: individual chips on wafer
511: wafer substrate
512: silicon oxide layer
513: patterned transition metal oxide layer
5-20: wafer formed by forming a silicon oxide layer with patterned "well" structures on a transition metal oxide layer included in the wafer
521: silicon oxide layer
522: transition metal oxide layer
5-30: multiple individual chips formed after the wafer structure is subjected to a dicing process
531: cutting slot
5-40: assembled sequencing chip formed by one individual chip
541: frame
542: liquid inlet and outlet
5-50: sequencing chip formed after performing a surface functionalization modification on the sequencing chip
551: silicon oxide layer
552: transition metal oxide layer
5-60A: sequencing chip having a DNB array, formed after the sequencing chip is subjected to a surface functionalization modification and DNBs are loaded
5-60B: sequencing chip in which a DNB array is formed
561: DNB
562: excitation light source/camera
6-10: wafer structure containing a patterned transition metal oxide layer
61 and 62: individual chips on a wafer
611: wafer
612: silicon oxide layer
613: transition metal oxide layer
6-20: wafer structure formed by forming a silicon oxide layer having patterned "well" structures on the wafer containing a patterned transition metal oxide layer
621: silicon oxide layer
622: "well" structure on the silicon oxide layer
6-30: multiple individual chips separated by cutting slots and formed after the wafer structure is subjected to a dicing process
631: cutting slot
6-40: sequencing chip formed after packaging one individual chip
641: frame
642: liquid inlet and outlet
6-50: sequencing chip formed after the sequencing chip is subjected to a surface functionalization modification
651: silicon oxide layer
652: transition metal oxide layer
6-60A: sequencing chip having a DNB array, formed after the sequencing chip is subjected to a surface functionalization modification and DNBs are loaded
6-60B: sequencing chip in which a DNB array is formed
661: DNB
662: excitation light source/camera
7-10: CMOS image sensor wafer
71 and 72: two chips
73: photosensitive layer
74: interconnection layer
75: substrate layer
711: silicon substrate
712: CMOS processing circuit layer
713: dielectric layer
714: metal wiring
715: semiconductor material
716: photosensitive part
717: dielectric film layer
718: silicon oxide layer
719: pad on the chip 720: interconnection silicon through-hole
7-20A: wafer structure formed after forming a patterned transition metal oxide layer with a "spot" structure on a CMOS image sensor wafer
721: transition metal oxide region
7-20B: wafer structure formed after forming a patterned transition metal oxide layer with a "well" structure on a CMOS image sensor wafer
722: transition metal oxide region
723: silicon oxide region
724: transition metal oxide region having a "well" structure
7-20C: wafer structure formed after forming a patterned transition metal oxide layer with another "well" structure on a CMOS image sensor wafer
725: transition metal oxide region
726: silicon oxide region
727: transition metal oxide region
7-30: multiple individual chips separated by a cutting slot and formed after the patterned wafer structure is subjected to a dicing process
731: cutting slot
7-40: chip structure formed after chip attaching and wire bonding
741: package underlay
742: pad on the substrate
743: touch point
744: metal connection wire
7-50: sequencing chip formed after a cover structure is attached to the chip structure
751: cover structure of support structure
752: liquid inlet and outlet
753: fluid channel
7-60: sequencing chip formed after the sequencing chip is subjected to a surface functionalization modification
761: transition metal oxide region
762: silicon oxide region
7-70A: sequencing chip with a DNB array, formed after the sequencing chip is subjected to a functionalization treatment and DNBs are loaded
7-70B: sequencing chip in which a DNB array is formed
771: DNB
8-10: wafer structure having a transition metal oxide layer with a structure of arrayed "spots"
81 and 82: individual chips on wafer
811: wafer substrate
812: silicon oxide layer
813: transition metal oxide layer having a structure of "spots"
81 and 82: multiple individual chips
8-20: wafer structure of multiple individual chips formed after the wafer structure is subjected to a dicing process
821: cutting line
8-30: reusable sequencing chip formed by assembling one single chip with a handle structure
831: handle structure
8-40: assembled sequencing chip immersed into a container containing a reagent
841: container
842: reagent
843: excitation light source/camera

DESCRIPTION OF EMBODIMENTS

Embodiments of the present disclosure are described in detail below, and examples of the embodiments are illustrated in the accompanying drawings. The embodiments described below with reference to the accompanying drawings are illustrative and intended to explain the present disclosure, but should not be construed as limitations of the present disclosure.

Unless otherwise specified, reagents, detection instruments, etc. in the examples can be self-prepared or are commercially available.

It should be noted that, a "transition metal oxide region" recited in the present disclosure refers to a region formed by transition metal oxide when viewed from a surface of a chip matrix, and a "silicon oxide region" described in the present disclosure refers to a region formed by silicon oxide when viewed from the surface of the chip matrix.

The term "patterned layer" indicates that a pattern alternately exists in a transition metal oxide region and a silicon oxide region on a wafer surface, including a "well" structure and a "spot" structure.

The term "spot" structure means that the transition metal oxide region is higher than the silicon oxide region, that is, the transition metal oxide is discretely distributed on the silicon oxide.

The expression, "the transition metal oxide layer is a continuous layer structure, and the second silicon oxide layer is formed by silicon oxide on an upper surface of the transition metal oxide layer and defines a plurality of connected wells", means that the second silicon oxide layer has a structure of grids covering the upper surface of the transition metal oxide layer, that is, a body of the grid is made of silicon oxide, and the transition metal oxide is exposed by the recessed wells defined by the grids. It can also be understood that, the second silicon oxide layer is recessed like wells, forming a pattern of grids on the upper surface of the transition metal oxide layer. The term "chip matrix" can be divided into individual chips, which can be assembled into sequencing chips suitable for sequencing. The wafer structure may contain tens to thousands of identical individual chips (depending upon a wafer size and a chip size), and an extremely narrow non-functional spacing is reserved between the chips, and the spacing is also referred as to a cutting line.

The preparation of the sequencing chip of the present disclosure is not particularly limited, and can adopt a conventional method for manufacturing the sequencing chip from a wafer material in the related art, depending on different wafer materials used, with a difference from the sequencing chip in the related art in that the individual chip used is different.

The term "individual chip" refers to a chip obtained by cutting the "chip matrix" in the present disclosure along the cutting line, and can also be called "chip unit".

Chip Matrix

In the first aspect of the present disclosure, the present disclosure provides a chip matrix. According to the embodiments of the present disclosure, the chip matrix includes: a wafer layer having cutting lines that are uniformly distributed on the wafer layer; a first silicon oxide layer made of silicon oxide and formed on an upper surface of the wafer layer; a transition metal oxide layer made of transition metal oxide and formed on an upper surface of the first silicon oxide layer. According to the embodiment of the present disclosure, a surface of the chip matrix includes two regions, namely a binding site region (transition metal oxide region, i.e., a functional region) of sequences to be sequenced (especially DNBs) and a non-binding site region (silicon oxide, i.e., a non-functional region) of the sequences to be sequenced. Applicants found that, by using the different surface properties of the transition metal oxide region and the silicon oxide region on the chip matrix, the sequences to be sequenced can be selectively adsorbed on the transition metal oxide layer by changing pH and a surfactant composition of a solution containing the sequences to be sequenced. In addition, the transition metal oxide region and non-functional region can be selectively modified to further enhance the transition metal oxide region's capability of selectively adsorbing DNBs.

According to an embodiment of the present disclosure, the transition metal oxide layer is constituted by a plurality of unconnected transition metal oxide spots. The transition metal oxide can be discretely distributed on the surface of silicon oxide through conventional methods such as sputtering, electron beam evaporation or thermal evaporation atomic layer deposition to form a patterned transition metal oxide layer in form of "spots". Thus, when viewed from the surface, transition metal oxide spots that specifically bind to the sequences to be sequences and silicon oxide regions that are located between the spots and cannot bind to the sequencing sequence are formed on the chip matrix.

According to an embodiment of the present disclosure, the transition metal oxide spots have a thickness of 10-20 nm, and the first silicon oxide layer has a thickness of 80-100 nm, preferably 90 nm. Through simulation calculations, Applicants found that a chip matrix, in which the thickness of the transition metal oxide spots ranges from 10 to 20 nm and the thickness of the silicon oxide layer (i.e., the first silicon oxide layer) ranges from 80 to 100 nm, preferably 90 nm, has a higher reflectivity for light emitted by the sequences to be sequenced, especially the DNBs, so that light signals emitted by the sequences to be sequenced, especially by the DNBs, can be captured by a signal detection device as much as possible, which indirectly enhances a signal intensity of the sequences to be sequenced, especially the signal intensity of the DNBs, providing a higher signal-to-noise ratio, and significantly improving the performance of the finally obtained sequencing chip.

According to an embodiment of the present disclosure, amino groups are further connected to the transition metal oxide spots. Applicants found that amination of transition metal oxide molecules can further improve the adsorption specificity of the surface functional region of the chip matrix for the DNBs. Therefore, by adjusting the pH and surfactant composition of the reagent contain DNBs, the surface functional region of the chip matrix has stronger DNB-specific adsorption function.

According to an embodiment of the present disclosure, polyethylene glycol is further connected to the first silicon oxide layer between the plurality of unconnected transition metal oxide spots. As a result, the DNB non-specific adsorption of the non-functional region on the surface of the chip matrix is further reduced.

According to an embodiment of the present disclosure, the chip matrix further includes a second silicon oxide layer.

According to an embodiment of the present disclosure, the transition metal oxide layer is a continuous layer structure, and the second silicon oxide layer is made of silicon oxide and formed on the upper surface of the transition metal oxide layer as a plurality of wells that are connected to each other. It should be noted that the continuous layer structure means that the transition metal oxide is spread over the upper surface of the first silicon oxide layer. As a result, one or more second silicon oxide layers having wells are covered on the transition metal oxide layer, to obtain a pattern in which the patterned transition metal oxide and silicon oxide are alternately present.

According to an embodiment of the present disclosure, the transition metal oxide layer consists of a plurality of unconnected transition metal oxide spots, and the second silicon oxide layer is formed between the plurality of unconnected transition metal oxide spots on the upper surface of the first silicon oxide layer. It can be understood that the second silicon oxide layer and the transition metal oxide spots can form wells, where the transition metal oxide is located in recesses of the wells, and the second silicon oxide layer constitutes a grid body of wells. In this case, the second silicon oxide layer can be higher than the transition metal oxide layer, or be as high as the transition metal oxide layer.

According to an embodiment of the present disclosure, the wafer is a silicon wafer, the second silicon oxide layer has a thickness ranging from 40 nm to 60 nm, preferably 50 nm, the transition metal oxide layer has a thickness ranging from 5 nm to 15 nm, and the first silicon oxide layer has a thickness ranging from 80 nm to 100 nm, preferably 90 nm.

Through simulation calculation, Applicants found that, the chip matrix has a higher reflectivity for light emitted by the sequences to be sequenced, especially light emitted by the DNBs, when the wafer is a silicon wafer, and in the chip matrix formed with the well structures, the thickness of the second silicon oxide layer is from 40 nm to 60 nm, preferably 50 nm, the thickness of the transition metal oxide layer is from 5 nm to 15 nm, and the thickness of the first silicon oxide layer is 80 nm to 100 nm, preferably 90 nm. Thus, the light signal emitted by the sequences to be sequenced, especially by the DNBs, can be captured by the signal detection device as much as possible, which indirectly enhances the signal strength of the sequences to be sequenced, especially the DNBs, thereby increasing the signal-to-noise ratio, and significantly improving the performance of the finally obtained sequencing chip.

According to an embodiment of the present disclosure, the wafer is a quartz wafer, the thickness of the second silicon oxide layer is 100 nm to 200 nm, the thickness of the transition metal oxide layer is 10 nm to 20 nm, and the thickness of the first silicon oxide layer is 80 nm to 100 nm, preferably 90 nm. Through simulation calculation, Applicants found that the chip matrix has a higher reflectivity for light emitted by the sequences to be sequenced, especially by the DNBs, when the wafer is a quartz wafer, and in the chip matrix formed with the well structures, the thickness of the second silicon oxide layer is 100 nm to 200 nm, the thickness of the transition metal oxide layer is 10 nm to 20 nm, and the thickness of the first silicon oxide layer is 80 nm to 100 nm, preferably 90 nm. Thus, the light signal emitted by the sequences to be sequenced, especially by the DNBs, can be captured by the signal detection device as much as possible, which indirectly enhances the signal strength of the sequences to be sequenced, especially the DNBs, thereby increasing the signal-to-noise ratio and significantly improving the performance of the finally obtained sequencing chip. Moreover, when the thickness of the second silicon oxide layer is 100 nm to 200 nm, it not only ensures that the well structures in the finally formed sequencing chip have an appropriate depth to load the sequences to be sequenced, especially the DNBs, but also enables the camera to collect fluorescence signals with a relatively higher intensity.

According to an embodiment of the present disclosure, amino groups are further connected to the transition metal oxide layer located at the recesses of the wells of the second silicon oxide layer or to the transition metal oxide spots. Applicants found that amination of transition metal oxide molecules can further improve the adsorption specificity of the surface functional region of the chip matrix for the sequences to be sequenced. Therefore, the surface of the functional region of the chip matrix can specifically adsorb the sequences to be sequenced by adjusting the pH and the surfactant composition of the sequences to be sequenced.

According to an embodiment of the present disclosure, polyethylene glycol is connected to the second silicon oxide layer. As a result, the non-specific adsorption of the non-functional region of the chip surface for the DNBs is further reduced.

According to an embodiment of the present disclosure, the amino groups are bonded to at least a part of the transition metal oxide molecules in the transition metal oxide layer through chemical bonds. The "chemical bonds" refer to transition metal-O—P bonds (such as Zr—O—P bond, Ti—O—P bond, Ta—O—P bond). As a result, the amino groups and the transition metal oxide are closely bonded together.

According to an embodiment of the present disclosure, the chemical bonds are formed by connecting the transition metal oxide molecules with phosphate groups of aminophosphonic acid-based compounds. Applicants applied the fact that the phosphonic acid group does not react with the silicon oxide layer but reacts specifically with the transition metal oxide molecules, and the aminophosphonic acid-based compounds can specifically introduce the amino groups onto the transition metal oxide molecules.

According to an embodiment of the present disclosure, the polyethylene glycol is provided by at least one selected from polyethyleneimine-polyethylene glycol and a silane coupling agent containing polyethylene glycol. As a result, the non-specific adsorption of the surface non-functional region of the chip matrix for the DNBs is further reduced.

According to an embodiment of the present disclosure, the polyethylene glycol is provided by polyethyleneimine-polyethylene glycol, and the polyethyleneimine-polyethylene glycol is electrostatically adsorbed on a surface of the first silicon oxide layer or a surface of the second silicon oxide layer.

According to an embodiment of the present disclosure, the polyethylene glycol is provided by the silane coupling agent containing polyethylene glycol, and the silane coupling agent containing polyethylene glycol is connected to the first silicon oxide layer or the second silicon oxide layer through a —Si—O—Si— chain.

It should be noted that the material of the wafer according to the embodiments of the present disclosure is not limited. According to a specific embodiment of the present disclosure, the wafer includes at least one selected from a silicon wafer, a quartz wafer, a glass wafer, and a CMOS wafer.

According to an embodiment of the present disclosure, the transition metal oxide includes at least one selected from titanium dioxide, zirconium dioxide, tantalum pentoxide, niobium hexaoxide, and hafnium dioxide.

According to an embodiment of the present disclosure, the transition metal oxide includes at least one selected from titanium dioxide, zirconium dioxide, and tantalum pentoxide.

Sequencing Chip

In a second aspect of the present disclosure, the present disclosure provides a sequencing chip. According to an embodiment of the present disclosure, the sequencing chip includes a chip body, the chip body includes a plurality of chip units, and the chip units are obtained by cutting the aforementioned chip matrix along the cutting line of the wafer layer. Applicants found that the selective adsorption of the sequences to be sequenced on the transition metal oxide layer can be achieved only by changing the pH and surfactant composition of the solution containing the sequences to be sequenced. The sequencing chip according to the embodiments of the present disclosure is more stable and the sequencing results thereof are more reliable, which can significantly improve the data output efficiency of the sequencing chip, thereby increasing the output of the sequencing chip and significantly reducing the sequencing cost.

The structure of the sequencing chip according to the embodiment of the present disclosure may not require a surface monomolecular layer, or may be subjected to surface modification after the chip preparation process is completed. Therefore, the sequencing chip of the present disclosure has the characteristics of stable properties, and thus it can withstand physical contact such as scratches without affecting the performance of the sequencing chip, and it can tolerate high temperature and chemical reagent corrosion. As a result, the chip can withstand more stringent, but more efficient processing and assembly processes, and is less likely to be damaged during packaging, transportation and preparations prior to use. Therefore, the production yield of the sequencing chip is improved, and the data output efficiency of the sequencing chip is increased, thereby reducing the cost.

Method for Manufacturing the Chip Matrix

In a third aspect of the present disclosure, the present disclosure provides a method for manufacturing the chip matrix. According to an embodiment of the present disclosure, the method includes: performing a surface modification on the wafer layer. The surface modification includes treating a surface of the wafer layer with a transition metal oxide to form a transition metal oxide layer, where the transition metal oxide layer is formed on an upper surface of the first silicon oxide layer, the first silicon oxide layer is provided on the upper surface of the wafer layer, and the silicon oxide layer is made of silicon oxide, and the wafer layer has cutting lines evenly distributed on the wafer layer. The method according to the embodiments of the present disclosure is simple to operate and environmentally friendly.

According to an embodiment of the present disclosure, the first silicon oxide layer is formed in advance on the upper surface of the wafer layer by low-temperature plasma chemical vapor deposition, plasma enhanced chemical vapor deposition, sputtering, or atomic layer deposition. It should be noted that the method of forming the first silicon oxide layer on the wafer surface is not limited, and can be performed with conventional semiconductor process techniques, such as low-temperature plasma chemical vapor deposition, plasma enhanced chemical vapor deposition, sputtering, atomic layer deposition, etc.

According to an embodiment of the present disclosure, the surface modification of the wafer layer is achieved by thin film deposition, photolithography or etching to form a continuous transition metal oxide layer or a transition metal oxide layer in form of spots.

According to a specific embodiment of the present disclosure, a patterned transition metal oxide layer is formed on the upper surface of the silicon oxide layer. The transition metal oxide can be titanium dioxide, zirconium dioxide, tantalum pentoxide, niobium hexaoxide, hafnium dioxide, or any combinations thereof. The transition metal oxide layer is discretely distributed on the silicon oxide layer, and forms a specific array pattern (i.e., an array of transition metal oxide spots and specially designed graphics or lines, for calibration of optical sequencing in the later stage), and has the same pattern arrangement on each individual chip. This patterned layer can be realized by conventional semiconductor process technique, such as thin film deposition, photolithography, and etching processes. That is, a transition metal oxide layer is first formed on the silicon oxide layer to cover the entire wafer by sputtering, electron beam evaporation, thermal evaporation atomic layer deposition or other thin film deposition techniques, then a hard mask material layer corresponding to the desired patterned layer is formed on the metal oxide layer through thin film deposition, photolithography, and etching, and finally the pattern of the hard mask material layer is re-etched onto the transition metal oxide layer through an etching process to form a patterned transition metal oxide layer, i.e., the discretely arranged transition metal oxide is arranged as orderly arranged "spots" on the silicon oxide layer, and the region without the transition metal oxide "spots" exposes the silicon oxide layer. The size of a "spot"-like transition metal oxide region is the same as or slightly smaller than the size of the DNB, so that one "spot" adsorbs only one DNB.

According to an embodiment of the present disclosure, the transition metal oxide layer is a continuous layer structure, and the method further includes forming a second silicon oxide layer from silicon oxide on the upper surface of the transition metal oxide layer. The second silicon oxide layer is arranged in form of continuous wells. Said forming is mainly achieved by atomic layer deposition. According to a specific embodiment of the present disclosure, a first silicon oxide layer is first formed on the wafer, then one transition metal oxide layer is formed on the first silicon oxide layer, and then an array of discretely arranged "well" structures is formed on the transition metal oxide layer through photolithography and etching techniques known in the conventional semiconductor process. The transition metal oxide layer is exposed at a bottom of the "well" structure, and the periphery of the "well" structure is the silicon oxide layer higher than the transition metal oxide layer. The size of the "well" is the same as or slightly smaller than a size of a DNB, so that each "well" structure only bonds to one DNB.

According to an embodiment of the present disclosure, the transition metal oxide layer is arranged in form of spots, and the method further includes depositing silicon oxide between the spots of the transition metal oxide layer to form a second silicon oxide layer. Said depositing is mainly achieved by atomic layer deposition. According to a specific embodiment of the present disclosure, a first silicon oxide layer is formed on the wafer first, and then an array of discretely arranged "well" structures is formed on the silicon oxide layer by photolithography and etching techniques in the conventional semiconductor process. The bottom of the "well" structure is the exposed transition metal oxide layer, the periphery of the silicon oxide layer "well" structure is higher than or as high as the transition metal oxide layer. The size of the "well" is the same as or slightly smaller than the size of the DNB, so that each "well" structure only bonds to one DNB.

According to an embodiment of the present disclosure, the method further includes performing an amination treatment on the transition metal oxide. As a result, amino groups can be introduced into the functional region of the chip matrix to further improve the functional region's capability of selectively adsorbing the sequences to be sequenced, especially the DNBs.

According to an embodiment of the present disclosure, the amination treatment is achieved by reacting the transition metal oxide with an aminophosphonic acid-based compound. As a result, the aminophosphonic acid-based compound and the transition metal oxide can form a transition metal-O—P bond (such as a Zr—O—P bond, a Ti—O—P bond, and a Ta—O—P bond). Furthermore, amino groups can be introduced to the functional region of the chip matrix to further improve the functional region's capability of selectively adsorbing the sequences to be sequenced, especially the DNBs.

According to the embodiment of the present disclosure, the method further includes performing a surface modification on the first silicon oxide layer or the second silicon oxide layer to introduce polyethylene glycol to the first silicon oxide layer or the second silicon oxide layer. As a result, the adsorption capability of the non-functional region of the chip matrix for the sequences to be sequenced, especially the DNBs, can be further reduced.

According to an embodiment of the present disclosure, the polyethylene glycol is provided by at least one selected from polyethyleneimine-polyethylene glycol and a silane coupling agent containing polyethylene glycol.

According to an embodiment of the present disclosure, the polyethylene glycol is provided by polyethyleneimine-polyethylene glycol, and the surface modification is performed by electrostatic adsorption of polyethyleneimine-polyethylene glycol on the surface of the first silicon oxide layer or the surface of the second silicon oxide layer. Thus, polyethylene glycol can be introduced into the non-functional region of the chip matrix.

According to an embodiment of the present disclosure, the polyethylene glycol is provided by the silane coupling agent containing polyethylene glycol, and the surface modification is performed by condensation reaction of the silane coupling agent containing polyethylene glycol with hydroxyl groups of the first silicon oxide layer or the second silicon oxide layer, and the hydroxyl groups are provided by Si—OH generated after the ionized first or second silicon oxide layer adsorbs hydroxide ions in the water. Thus, polyethylene glycol can be introduced into the non-functional region of the chip matrix.

Method for Manufacturing Sequencing Chip

In a fourth aspect of the present disclosure, the present disclosure provides a method for manufacturing a sequencing chip. According to an embodiment of the present disclosure, the method includes: assembling a chip unit. The chip unit is obtained by cutting the chip matrix along the cutting lines of the wafer layer, and the chip matrix is as defined as above or obtained by the method described as above. The method according to the embodiment of the present disclosure is simple to operate, and has a high yield of the prepared sequencing chip.

According to an embodiment of the present disclosure, the cutting is realized by a semiconductor wafer dicing method.

According to an embodiment of the present disclosure, said assembling includes: placing the chip unit in a supporting frame containing a liquid inlet and outlet, and bonding the chip unit to the supporting frame with a glue or adhesive, with a fluid channel being formed between the frame and the chip unit.

According to an embodiment of the present disclosure, the wafer is a silicon wafer, and the assembling includes: bonding the chip unit to the supporting frame, with an upper surface the chip unit facing upward, and placing a cover glass on the upper surface of the chip unit to obtain the sequencing chip.

According to an embodiment of the present disclosure, the wafer is a quartz wafer or a glass wafer, and said assembling includes: attaching the chip unit to the supporting frame, with a lower surface of the chip unit facing upward, to obtain the sequencing chip.

According to an embodiment of the present disclosure, the wafer is a CMOS wafer, and said assembling includes: bonding a lower surface of the chip unit to a substrate (i.e., a photosensitive element). The chip unit is connected to the substrate by a lead, and the lead is configured to transmit an electrical signal on the chip unit to the substrate.

According to an embodiment of the present disclosure, the substrate is in form of, but not limited to, LGA, CLCC, PLCC, or the like.

According to an embodiment of the present disclosure, a metal wire used for the wire bonding includes, but is not limited to, gold wire, aluminum wire, and the like.

Sequencing Method

In a fifth aspect of the present disclosure, the present disclosure provides a sequencing method. According to the embodiments of the present disclosure, the method includes: performing sequencing using a sequencing chip. The sequencing chip is defined as above or prepared by the method described above. According to the method of the embodiment of the present disclosure, the sequencing has a more accurate result and a lower cost.

According to an embodiment of the present disclosure, the transition metal oxide layer of the sequencing chip is pre-fixed with DNBs. A DNB sample can be considered as a point light source, and the light emitted by the DNB sample can be collected by a camera or CMOS image sensor, and then sequenced.

The embodiments of the present disclosure are described in detail below.

Example 1: Method for Manufacturing a Sequencing Chip Having "Spot"-Structured Transition Metal Oxide on a Silicon or Quartz Wafer Referring to FIGS. 1-5, the present embodiment provides a method for manufacturing a sequencing chip having "spot"-structured transition metal oxide on a silicon or quartz wafer, and illustrates cross-sectional views of respective processes of the method. This method can be performed on a bare wafer without requiring any internal circuit or structure. These figures of the present disclosure merely illustrate two regions 11 and 12 on the wafer. Those skilled in the art should realize that a plurality of individual chips with the same structure can be formed on the wafer (the number of chips may vary from tens to thousands depending upon the wafer size and chip size), and each chip can constitute one sequencing chip.

FIG. 1 is a cross-sectional view of a wafer 1-10, which is formed with a patterned layer containing DNB-binding site regions (transition metal oxide layer, i.e., functional regions) and DNB non-binding site regions (silicon oxide layer, i.e., non-functional regions) that are alternately present on a bare wafer. A wafer substrate structure 111, as shown in FIG. 1, is first provided, and it may be made of a material such as silicon or quartz. However, those skilled in the art shall appreciate that the substrate material in the present disclosure is not limited to silicon or quartz, and any other suitable semiconductor wafer materials can also be used in the present disclosure. A silicon oxide layer 112 is then formed on the wafer 111, and this silicon oxide layer can be formed by a conventional process known in the semiconductor technology, such as low temperature plasma chemical vapor deposition, plasma enhanced chemical vapor deposition, sputtering, atomic layer deposition, etc. Then a patterned transition metal oxide layer is formed on the silicon oxide layer. The transition metal oxide can be titanium dioxide, zirconium dioxide, tantalum pentoxide, niobium hexaoxide, hafnium dioxide, or any combinations thereof. The transition metal oxide layer is discretely distributed on the silicon oxide layer and forms a specific array pattern, and the patterns on individual chips (e.g., the individual chips 11 and 12 shown in FIG. 1) are the same. Such a patterned layer can be formed by a conventional process known in the semiconductor technology, such as thin film deposition, photolithography, and etching process. That is, a transition metal oxide layer (not shown) covering the entire wafer is first formed on the silicon oxide layer by sputtering, electron beam evaporation, thermal evaporation atomic layer deposition and other thin film deposition techniques, then a hard mask material layer (not shown) corresponding to the required patterned layer is formed on the metal oxide layer through thin film deposition, photolithography, and etching processes, and finally, a pattern of the hard mask layer is reprinted onto the transition metal oxide layer through an etching process, so as form the patterned transition metal oxide layer having the structures 113 as shown in FIG. 1. In the patterned layer represented by the structures 113, the transition metal oxide is discretely distributed in form of "spots" that are orderly arranged on the silicon oxide layer. The silicon oxide layer is exposed in the regions that is not covered by the transition metal oxide "spots". A size of the "spot"-like transition metal oxide region is the same as or slightly smaller than a size of DNB, thereby allowing one "spot" to adsorb only one DNB. It should be appreciated that, in addition to the process steps for forming the patterned layer as described herein, any other processes that can form the patterned layer should be included in the present disclosure. The wafer 1-10 shown in FIG. 1 may contain tens to thousands of identical chips (depending on the wafer size and chip size), and an extremely narrow non-functional spacing is reserved between the chips. This spacing is also referred as to a cutting line where the wafer can be cut by the cutting blade into a plurality of individual chips without damaging the effective structural region of the chips.

Figure 2:
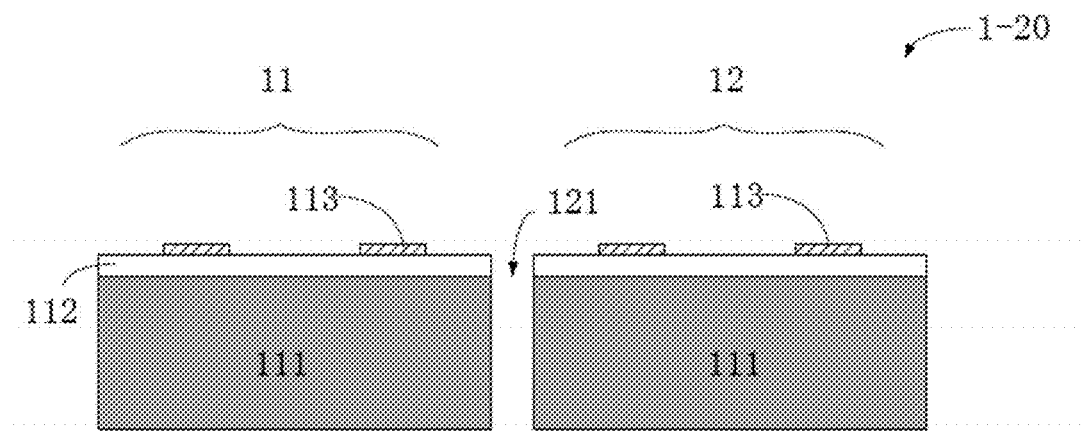

FIG. 2 is a cross-sectional view of multiple individual wafers 1-20 formed after the wafer 1-10 having the patterned transition metal oxide layer is subjected to a dicing process. As illustrated in FIG. 2, the wafer has been cut into individual chips separated through the cutting slot 121. FIG. 2 illustrate the individual chips 11 and 12 formed after the dicing process.

Figure 3:
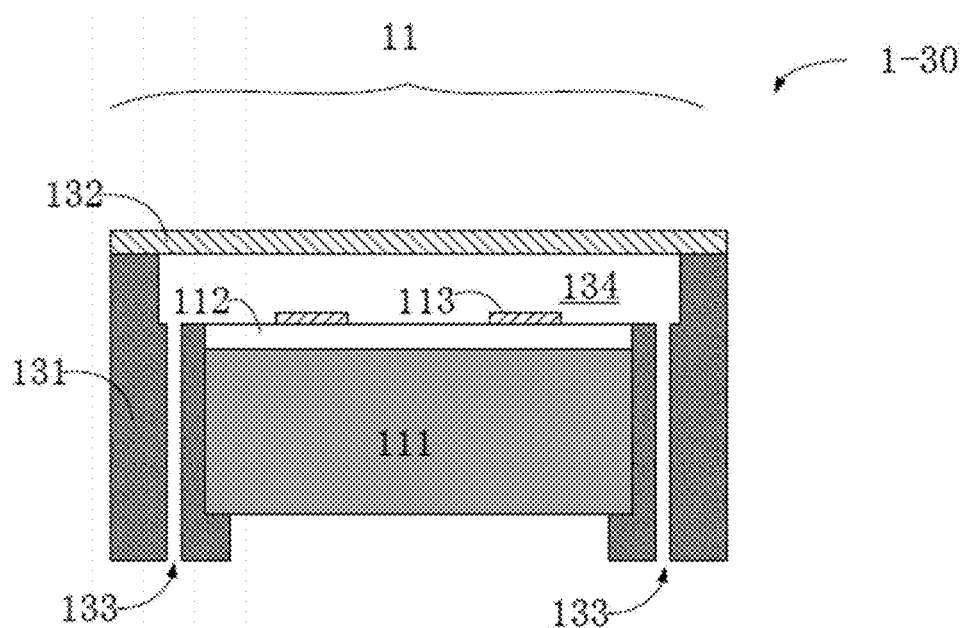

FIG. 3 is a cross-sectional view of a sequencing chip 1-30 formed by assembling one single chip. One single chip having the patterned surface layer 113 is first placed into a frame structure 131 including a liquid inlet and outlet 133, then a hydrophobically treated cover glass 132 is attached onto the frame 131, and a fluid channel 134 is formed between the cover glass 132 and the chip including the patterned surface 113, thereby allowing liquid to be introduced into or discharged from the fluid channel 134 via the liquid inlet and outlet 133. In this figure, the related components are fixed by using adhesives during assembling the chip into the frame 131 and attaching the cover glass 132 onto the frame 131, and any suitable adhesive can be employed in the present disclosure. In this figure, the structure of the assembled sequencing chip is schematically illustrated, i.e., including the frame for providing the liquid inlet and outlet, and the cover glass for forming the fluid channel together with the frame. However, those skilled in the art should recognize that any frame and cover glass that are made of suitable materials, and any frame and cover glass structure that can provide the liquid inlet and outlet and the fluid channel should be included in the present disclosure.

Figure 4:
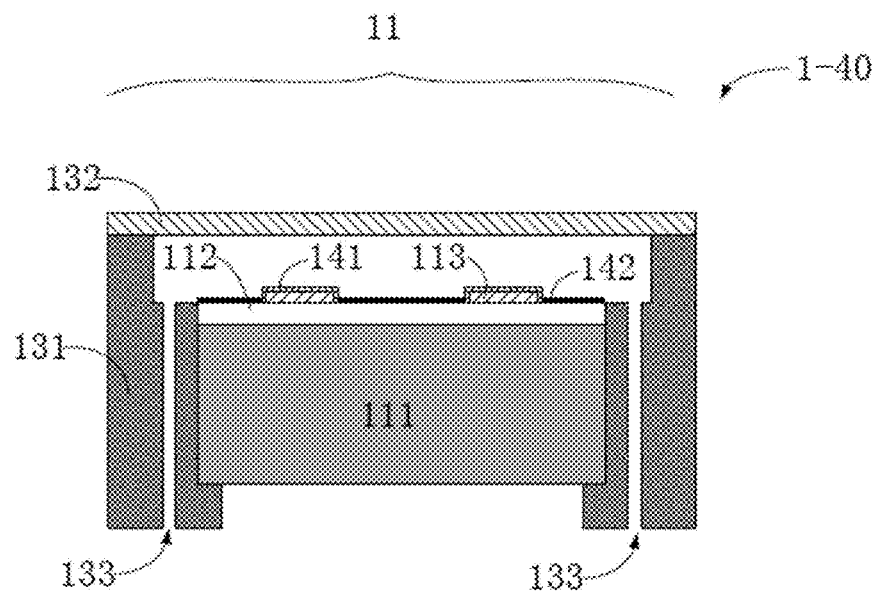

FIG. 4 illustrates a sequencing chip 1-40 formed after the sequencing chip 1-30 is subjected a surface functionalization modification. Liquid used for surface modification can be introduced into the fluid channel via the liquid inlet and outlet and contact the transition metal oxide region and the silicon oxide region to functionally modify the surfaces thereof, thereby providing them with a function of adsorbing DNBs (i.e., serving as DNB-binding site, transition metal oxide region, functional region) and a function of repelling DNBs (i.e., serving as DNB non-binding site, silicon oxide region, non-functional region), respectively. The surface modification includes: 1) forming a polyethylene glycol molecular layer 142 on the surface of the silicon oxide layer; and 2) forming multiple amino groups 141 on the transition metal oxide layer. The polyethylene glycol molecule includes at least one of polyethyleneimine-polyethylene glycol and a silane coupling agent containing polyethylene glycol, in order to further reduce the non-specific adsorption of DNBs in the non-functional region on the surface of the chip. Alternatively, the polyethylene glycol molecule is polyethyleneimine-polyethylene glycol, and each of the multiples polyethylene glycol molecules has one end connected to the silicon oxide layer 112 through electrostatic adsorption. Polyethyleneimine-polyethylene glycol can be self-arranged on the silicon oxide layer 112, and then adsorbed on the silicon oxide layer 112 through electrostatic action. Alternatively, the polyethylene glycol molecule is a silane coupling agent containing polyethylene glycol, each of multiple polyethylene glycol molecules has one end connected to the silicon oxide layer 112 via a chain of —Si—O—Si—, and the silane coupling agent containing polyethylene glycol can undergo a condensation reaction with the hydroxyl groups on the surface of the silicon oxide layer 112 to form the —Si—O—Si-chain. The multiple amino groups are connected to at least a part of the transition metal oxide molecules, and the multiple amino groups are unable to be connected to the silicon oxide layer. Applicants found that the amination of the transition metal oxide molecules can further improve the adsorption specificity of the functional region of the chip surface for the DNBs. Thus, by adjusting the pH of the DNBs and the surfactant composition, the functional regions of the chip surface can specifically adsorb DNBs. The multiple amino groups are provided by aminophosphonic acid-based compounds. Applicants found that the phosphonic acid group does not react with the silicon oxide layer but specifically reacts with the transition metal oxide molecule, and thus the aminophosphonic acid-based compounds can be used to specifically introduce the amino groups on the transition metal oxide molecules; or the multiples amino groups are connected to at least a part of the multiple transition metal oxide molecules through chemical bonds. As mentioned above, based on the fact that the phosphonic acid group does not react with the silicon oxide layer but specifically reacts with the transition metal oxide molecule, the aminophosphonic acid-based compounds can be used to specifically introduce the amino groups on the transition metal oxide molecules. The phosphonic acid group and the transition metal oxide molecule can form a corresponding chemical bond, and the multiple amino groups can be connected to the transition metal oxide molecules by forming the chemical bonds between the transition metal oxide molecules and the phosphonic acid groups. The chemical bonds are formed by bonding the transition metal to the phosphoric acid group of the aminophosphonic acid-based compound. The phosphonic acid group in the aminophosphonic acid-based compound and the transition metal oxide molecule can form a corresponding transition metal-O—P bond (such as Zr—O—P bond, Ti—O—P bond, or Ta—O—P bond), and accordingly, the multiple amino groups are connected to the transition metal oxide molecules via the transition metal-O—P bonds formed between the phosphonic acid groups and transition metal oxide molecules.

Figure 5A:
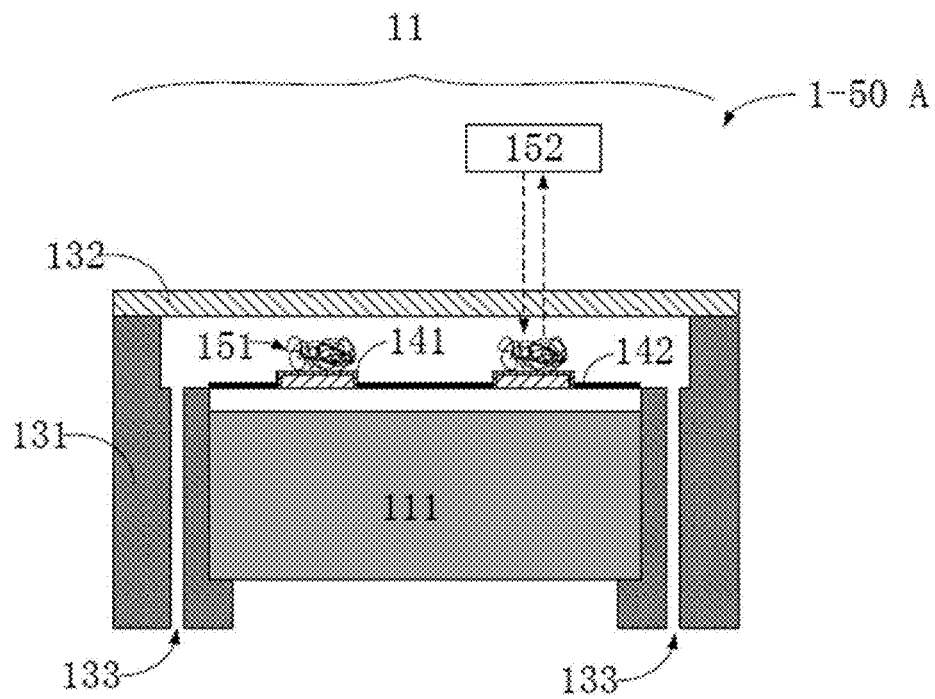
FIG. 5A is a cross-sectional view of a sequencing chip 1-50A including a DNB array according to an embodiment of the present disclosure, which is formed after DNBs are loaded on the surface-modified sequencing chip 1-40 shown in FIG. 4.

FIG. 5A is a cross-sectional view of a sequencing chip 1-50A containing a DNB array, where the sequencing chip 1-50A is formed after the sequencing chip 1-40 shown in FIG. 4 is subjected to a functionalization treatment and DNBs are loaded on the sequencing chip 1-40. The DNB reagent is introduced into the fluid channel through the liquid inlet and outlet 133 on the sequencing chip, and DNBs are selectively bonded to the DNB-binding sites (transition metal oxide regions modified with amino groups, i.e., the functional regions), rather than be bonded to the DNB non-binding sites (polyethylene glycol-modified silicon oxide layer), so as to form a DNB nanoarray. The light source and camera 152 is illustrated in FIG. 5A. Under the excitation of a light source of a specific wavelength or energy, the DNBs labeled with fluorescent markers can emit light of a specific wavelength or energy, which is acquired by the camera. Base sequences of the DNBs can be identified by analyzing the light signal acquired by the camera.

Figure 5B:
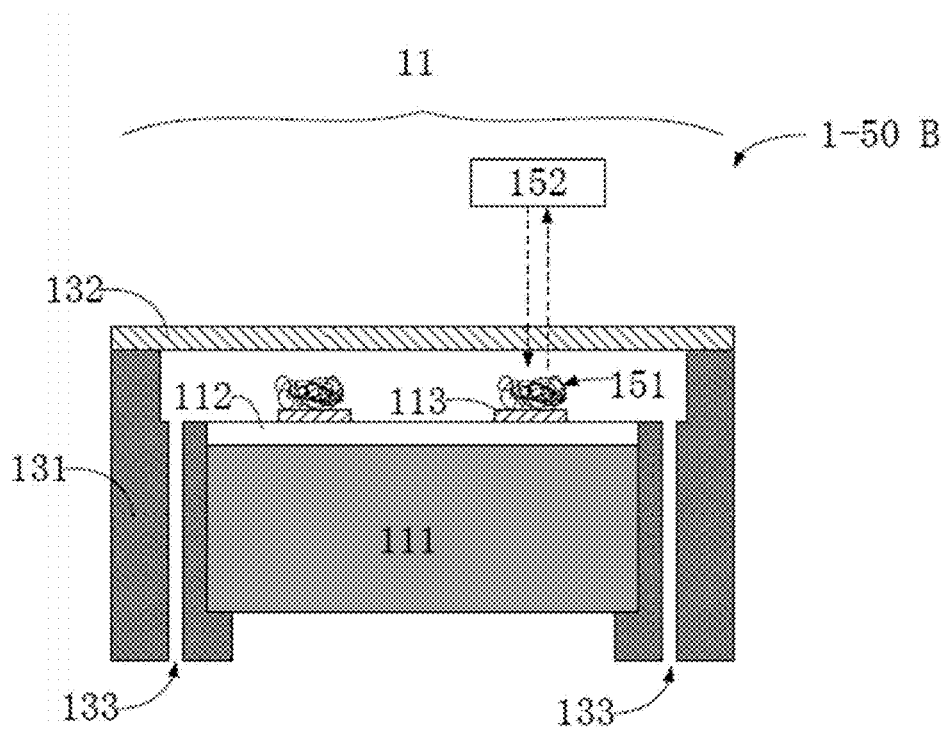
FIG. 5B is a cross-sectional view of a more simpler sequencing chip 1-50B according to an embodiment of the present disclosure, in which a DNB array can be formed on the sequencing chip without performing a surface modification.

FIG. 5B illustrates another simpler method for loading DNBs. In FIG. 5B, DNBs can be loaded on the sequencing chip 1-30 shown FIG. 3 without any surface modification. As long as pH and surfactant composition of the DNB reagent are optimal, DNBs can be selectively adsorbed only on the DNB-binding sites (transition metal oxide layer, i.e., the functional regions) and repelled by the DNB non-binding sites (silicon oxide layer, i.e., the non-functional regions) without performing the surface functionalization modification. It should be noted that, the method of loading DNBs after performing the surface functionalization modification, as shown in FIG. 4 and FIG. 5A, will enable better selective adsorption effect of DNBs on the patterned surface.

Figure 5C:
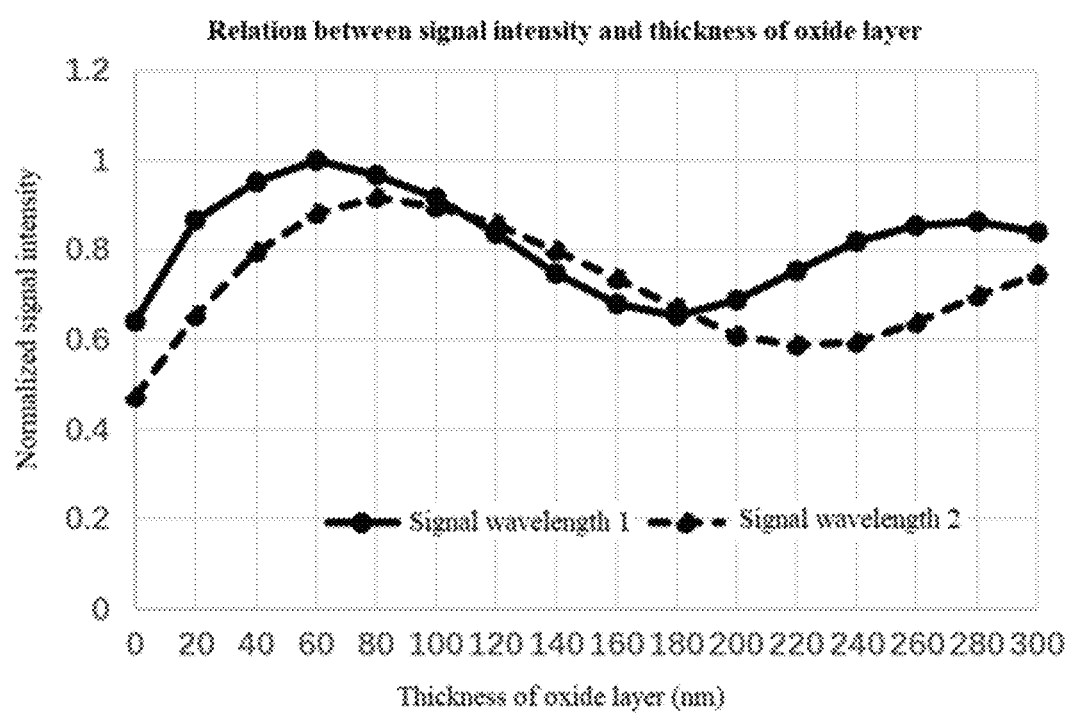
FIG. 5C illustrates a relation between an intensity of fluorescence signal and a thickness of a silicon oxide layer according to an embodiment of the present disclosure.

The results are shown in FIG. 5A and FIG. 5B. The DNB sample 151 is loaded on the transition metal oxide "spots" 113, and the camera 152 is placed above the DNB sample to acquire the light signal emitted by the DNB sample. The DNB sample can be considered as a point light source, light emitted upward is directly acquired by the camera, a part of light emitted downward can be reflected by the transition metal oxide layer and the silicon oxide layer and acquired by the camera, and the remaining part of the light emitted downward passes through the transition metal oxide layer and the silicon oxide layer and enters the silicon substrate. Applicants has found optimal thicknesses of the transition metal oxide layer and the silicon oxide layer through optical simulation calculation. With such thicknesses, the transition metal oxide layer and the silicon oxide layer have maximum reflection and minimum transmission for the light signal emitted by the DNBs, such that the light signal emitted by the DNBs is transmitted upward and acquired by the camera as much as possible. That is, an intensity of the fluorescence signal captured by the camera is maximized. During the simulation calculation, the intensities of fluorescence signals corresponding to different thicknesses of the silicon oxide layer are first determined in absence of the transition metal oxide layer, so as determine an optimal thickness of the silicon oxide layer. The simulation calculation results are shown in FIG. 5C. When the thickness of the silicon oxide layer is about 90 nm, the silicon oxide layer has relatively higher reflectivity to light of the four wavelengths.

Figure 5D:
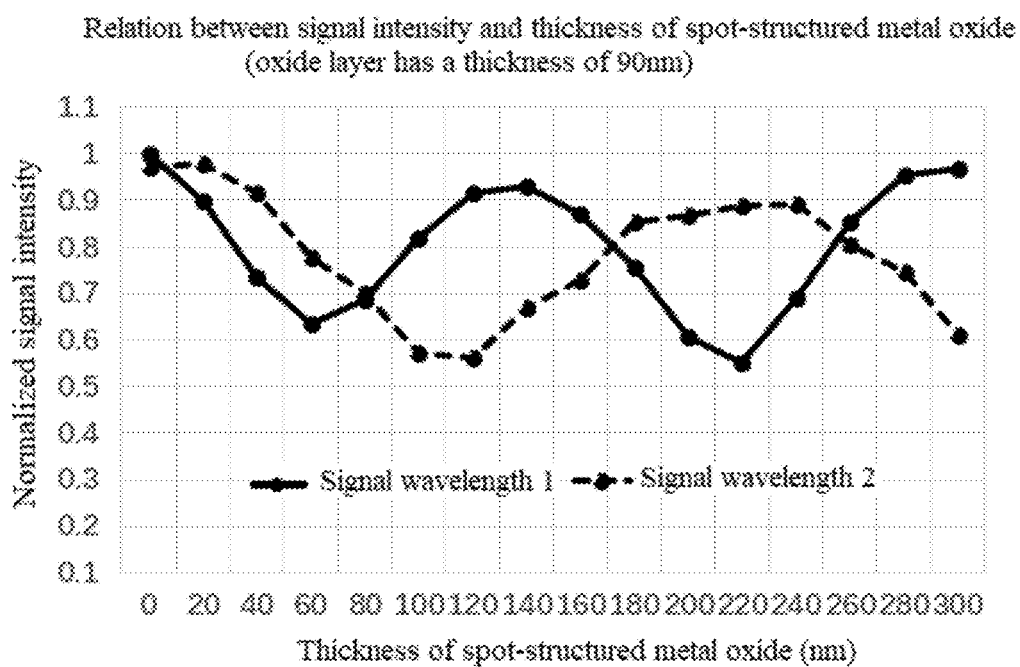
FIG. 5D illustrates a relation between an intensity of fluorescence signal and a thickness of transition metal oxide ('spot' structure) according to an embodiment of the present disclosure.

When the thickness of the silicon oxide layer is about 90 nm, the silicon oxide layer has the optimal reflection effect for the light signal emitted by the DNB sample, that is, the intensity of fluorescence signal captured by the camera is the highest. Then, during the simulation calculation, a relation between a change in the thickness of the transition metal oxide layer and the intensity of fluorescence signal is determined when the thickness of the silicon oxide layer is 90 nm, and the results are shown in FIG. 5D. When the thickness of the transition metal oxide layer is less than 40 nm, the intensity of fluorescence signal captured by the camera gradually decreases as an increase in the thickness of the transition metal oxide layer. When the thickness of the transition metal oxide layer is about 10 nm to 20 nm, the transition metal oxide layer has better mechanical reliability and a maximum reflectivity, and the fluorescence signal captured by the camera has the highest intensity, as shown in FIG. 5D.

Embodiment 2: Method for Manufacturing a Sequencing Chip Having "Well"-Structured Transition Metal Oxide on a Silicon or Quartz Wafer Referring to FIG. 6 to FIG. 11, the present embodiment provides a method for manufacturing a sequencing chip having "well"-structured transition metal oxide on a silicon or quartz wafer, and illustrates cross-sectional views of respective processes of the method. This method can be performed on a bare wafer without requiring any internal circuit or structure. These figures of the present disclosure merely illustrate two regions 11 and 12 on the wafer. Those skilled in the art should realize that a plurality of individual chips with the same structure can be formed on the wafer (the number of chips may vary from tens to thousands depending upon the wafer size and chip size), and each chip can constitute one sequencing chip.

Figure 6:
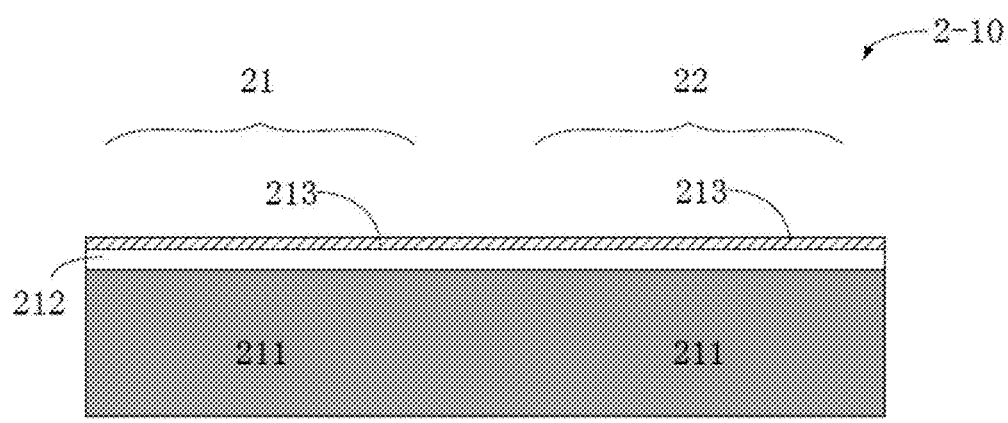

FIG. 6 is a cross-sectional view of a wafer structure 2-10, formed by forming a silicon oxide layer and a transition metal oxide layer on a bare wafer. A wafer substrate 211 is first provided. The wafer substrate can be silicon or quartz, but is not limited thereto. Any suitable semiconductor wafer can be employed herein. Then, a silicon oxide layer 212 is formed on the wafer 211, and the process of forming the silicon oxide layer is similar to that described in Embodiment 1 with reference to FIG. 1. A transition metal oxide layer 213 is then formed on the silicon oxide layer. The transition metal oxide can be titanium dioxide, zirconium dioxide, tantalum pentoxide, niobium hexaoxide, hafnium dioxide, or any combination thereof, and the formation process thereof is similar to that described in Embodiment 1 with reference to FIG. 1.

Figure 7:
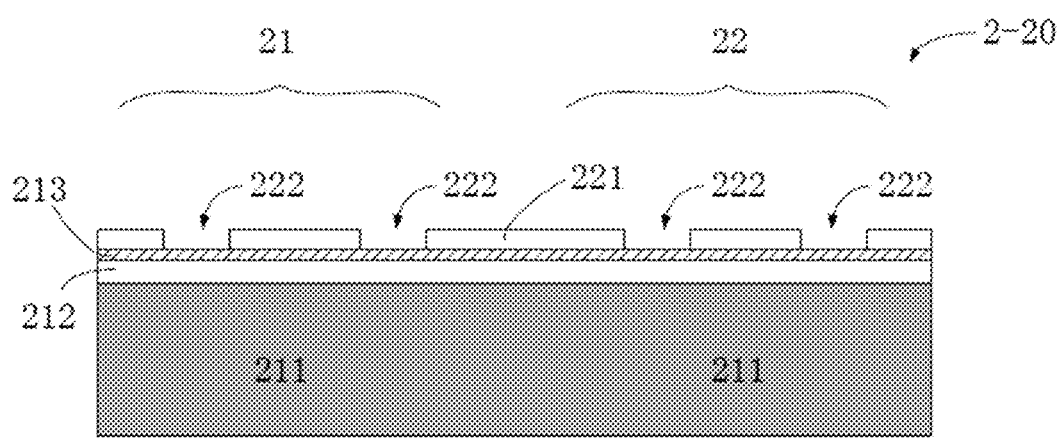

FIG. 7 is a cross-sectional view of a wafer 2-20, formed by patterning the silicon oxide layer with "well" structures on the transition metal oxide layer of the wafer 2-10 shown in FIG. 6. A silicon oxide layer 221 is first formed on the wafer 2-10 shown in FIG. 6, and then an array of "well" structures 222 that are discretely arranged is formed in the silicon oxide layer 221 by photolithography and etching belonging to the conventional semiconductor processes, as illustrated in FIG. 7. The transition metal oxide layer is exposed at a bottom of the "well" structure, and the silicon oxide layer 221 higher than the transition metal oxide layer acts as a periphery of the "well" structure is. A size of the "well" is the same as or slightly smaller than A size of the DNB, thereby allowing each "well" structure to be bond to only one DNB.

Figure 8:
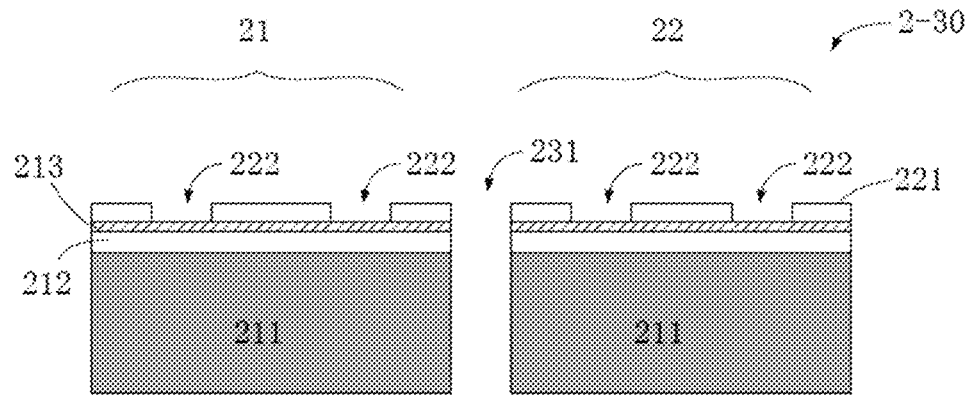

FIG. 8 shows a cross-sectional view of multiple individual chips 2-30 formed after the wafer structure 2-20 shown in FIG. 7 is subjected to a dicing process. In this figure, the dicing process is similar to that described in Embodiment 1 with reference to FIG. 2. The wafer 2-20 shown in FIG. 7 is cut into individual chips 21 and 22, which are separated from each other through the cutting slot 231.

Figure 9:
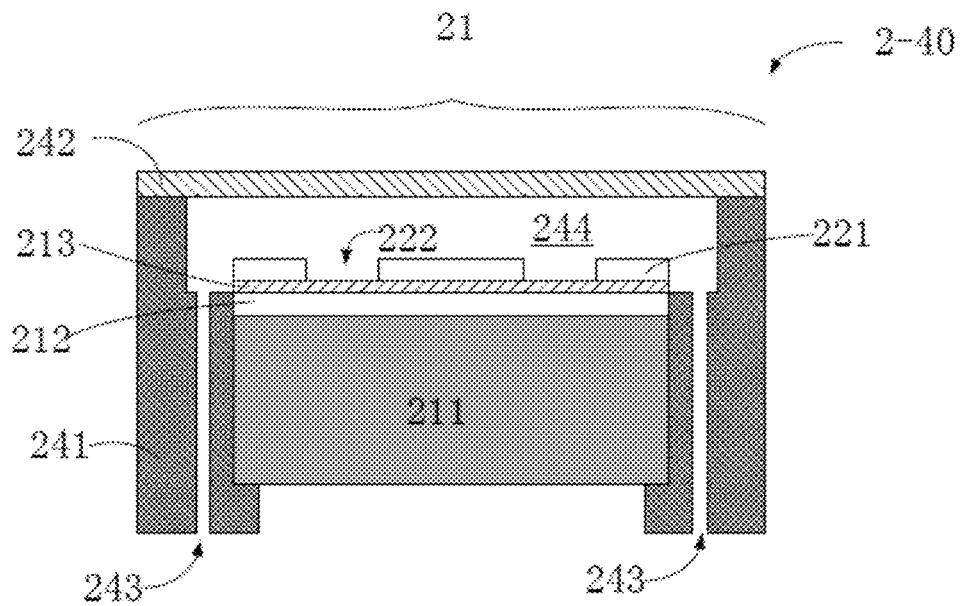

FIG. 9 shows a cross-sectional view of a sequencing chip 2-40 formed by assembling one single chip. The process of assembling is similar to the process described in Embodiment 1 with reference to FIG. 3. A frame 241 including a liquid inlet and outlet 243, and a cover glass 242 attached on the frame are included. A fluid channel is formed between the cover glass and the one single chip having "well" structures in an array.

Figure 10:
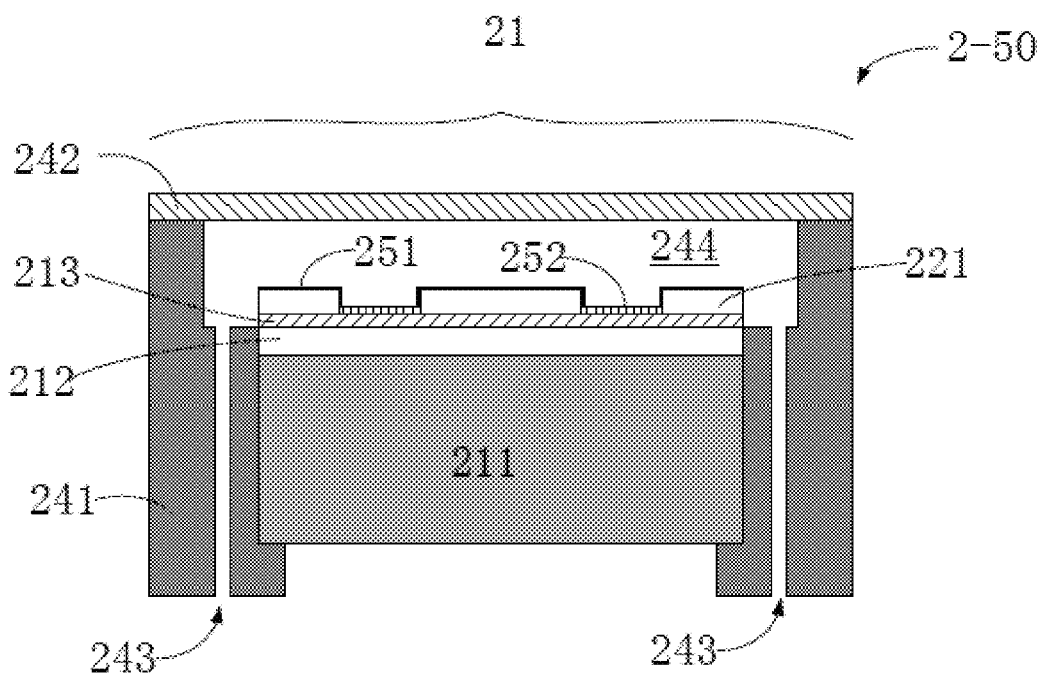

FIG. 10 is a cross-sectional view of a sequencing chip 2-50 formed after the sequencing chip 2-40 shown in FIG. 9 is subjected to a surface functionalization modification. The process of the surface functionalization treatment in this figure is similar to that described in Embodiment 1 with reference to FIG. 4. As results, the transition metal oxide layer 213 exposed at the bottom of the "well" structure forms a DNB-binding site region modified with amino groups, i.e., a functional region, and a polyethylene glycol molecular layer is formed on a surface of the silicon oxide layer higher than the transition metal oxide layer.

Figure 11A:
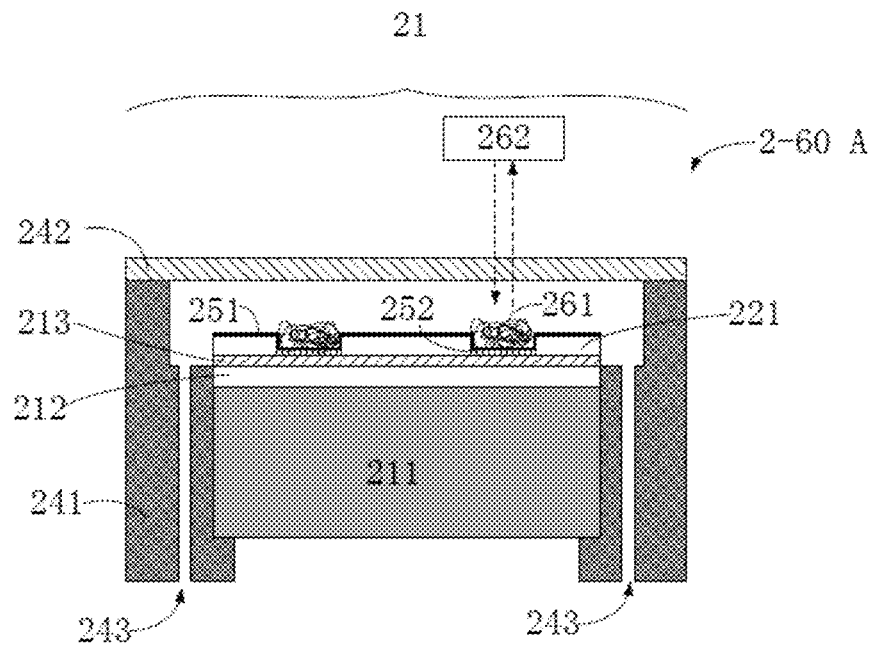
FIG. 11A is a cross-sectional view of a sequencing chip 2-60A with a DNB array according to an embodiment of the present disclosure, which is formed after DNBs are loaded on the sequencing chip 2-50 that has been subjected to the surface functionalization modification as shown in FIG. 10.

FIG. 11A is a cross-sectional view of a sequencing chip 2-60A with a DNB array formed after DNBs are loaded on the sequencing chip 2-50 shown in FIG. 10. As shown in this figure, DNBs are loaded in the arrayed "well" structures of the sequencing chip 2-60A, which has been subjected to the surface functionalization modification, enabling the DNBs to withstand the washing of liquid at a higher flow rate, and improving a sequencing speed of the sequencing chip. The excitation light source/camera 262 illustrated in this figure can provide excitation light of a specific wavelength and energy and acquire the light signal of a specific wavelength and energy emitted by the DNBs labeled with fluorescent markers, thereby identifying the base sequence of the DNBs.

Figure 11B:
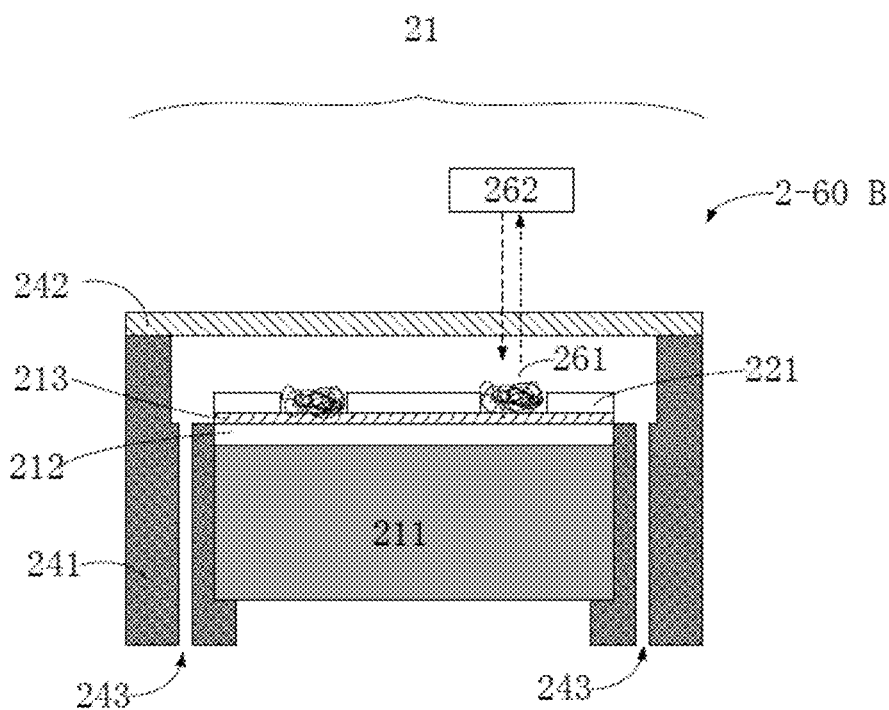
FIG. 11B is a cross-sectional view of a simpler sequencing chip 2-60B according to an embodiment of the present disclosure, in which a DNB array can be formed on the sequencing chip without performing a surface modification.

FIG. 11B illustrates another simpler method for loading DNBs. The sequencing chip 2-40 shown in FIG. 9 can be loaded with DNBs without performing any surface modification to form the sequencing chip 2-60B. As long as pH and surfactant composition of the DNB reagent are optimal, DNBs can be selectively adsorbed only on the DNB-binding sites (transition metal oxide layer, i.e., the functional regions) and repelled by the DNB non-binding sites (silicon oxide layer, i.e., the non-functional regions) without performing the surface functionalization modification. Applicants found that the method of loading the DNBs after performing the surface functionalization modification, as shown in FIG. 10 and FIG. 11A, will provide better selective adsorption effect of the patterned surface for DNBs.

Figure 11C:
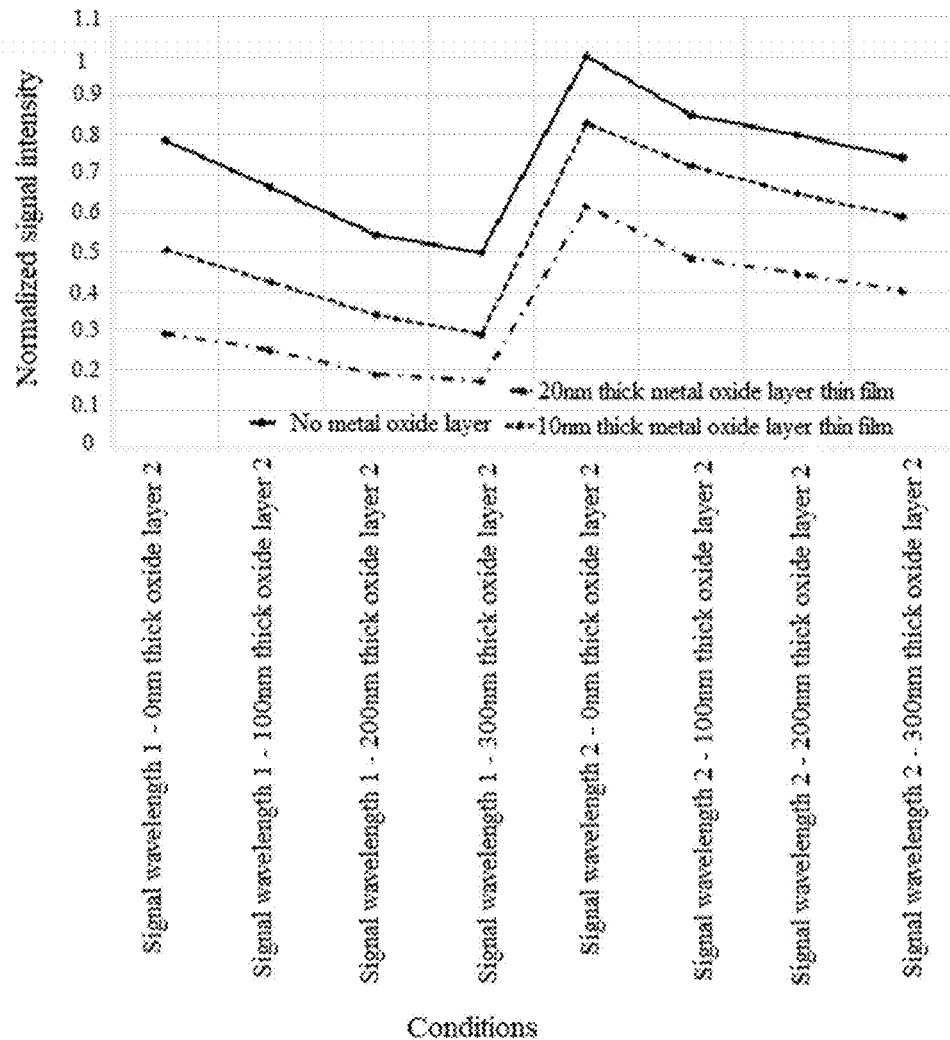
FIG. 11C illustrates a relation between a fluorescence signal and a second oxide layer having "well" structures based on different "well" structures on silicon substrate according to an embodiment of the present disclosure.

Applicants has found optimal thicknesses of the transition metal oxide layer and the silicon oxide layer through optical simulation calculation. In this embodiment, the transition metal oxide layer is a thin film layer structure, a first silicon oxide layer is disposed under the transition metal oxide layer, and a second silicon oxide layer having arrayed "well" structures is arranged on the transition metal oxide layer. According to the simulation results in Embodiment 1, Applicants learned that, when the thickness of the transition metal oxide layer varies from 0 to 40 nm, the reflectivity of the thin film gradually decreases with an increase in the thickness of the transition metal oxide layer, resulting in a gradual decrease in the intensity of fluorescence signal acquired by the camera. Accordingly, a relation between the intensity of fluorescence signal and the thickness of the second silicon oxide layer having the arrayed "well" structures is simulated in the circumstances that the thickness of the first silicon oxide layer is 90 nm, and the thickness of the transition metal oxide layer is 0 nm, 10 nm, and 20 nm. The simulation results are shown in FIG. 11C. With an increase in the thickness of the second silicon oxide layer, the intensity of fluorescence signal gradually decreases, and the reflectivity of the thin film to the light signal decreases. Therefore, in order to enable the "well" structure to have a certain depth for loading DNBs, Applicants select that the second silicon oxide layer has a thickness of about 50 nm.

Figure 11D:
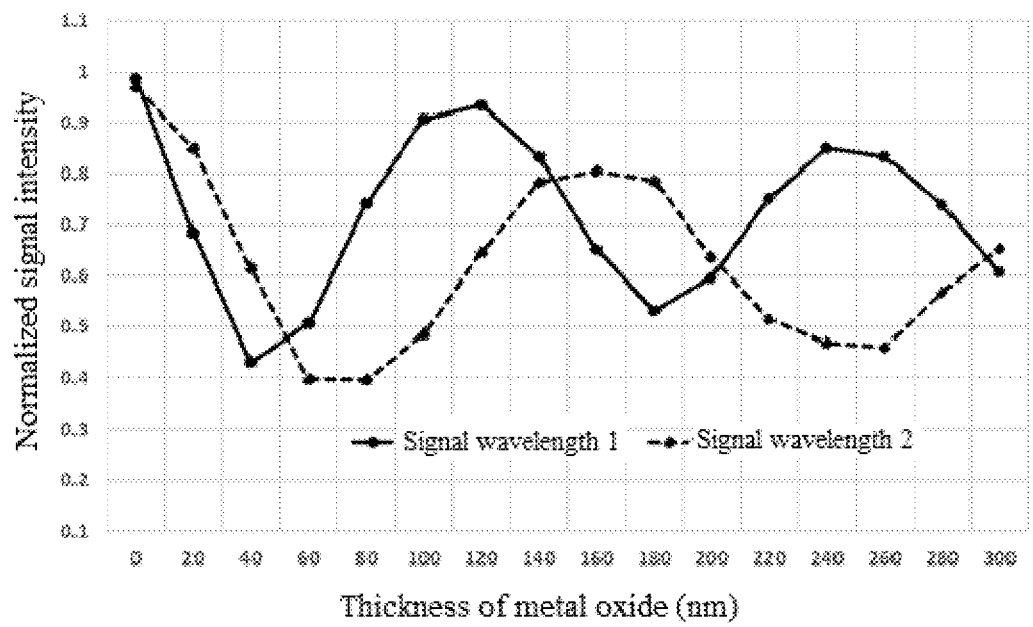
FIG. 11D illustrates a relation between an intensity of fluorescence signal and a thickness of a transition metal oxide according to an embodiment of the present disclosure.

When the thickness of the first silicon oxide layer is 90 nm and the thickness of the second silicon oxide layer is 50 nm, a relation between different thicknesses of the transition metal oxide layer and the intensity of fluorescence signal is simulated and calculated correspondingly. The simulation results are shown in FIG. 11D, having a changing trend similar to that of the Embodiment 1. That is, when the thickness of the transition metal oxide layer is less than 40 nm, with an increase in the thickness of the transition metal oxide layer, the reflectivity decreases, and the intensity of fluorescence signal gradually weakens. Therefore, Applicants believe that, it is optimal that the thickness of the transition metal oxide layer is about 5-15 nm, and in this case, the intensities of the fluorescence signals of different wavelengths emitted by the four bases are relatively higher. Applicants believe that, in this embodiment, when the thickness of the first silicon oxide layer is 90 nm, the thickness of the transition metal oxide layer ranges from 5 nm to 15 nm, and the thickness of the second silicon oxide layer is 50 nm, the reflectivity of the thin film on the sequencing chip is relatively higher, and the intensity of fluorescence signal captured by the camera is relatively higher.

Figure 12:
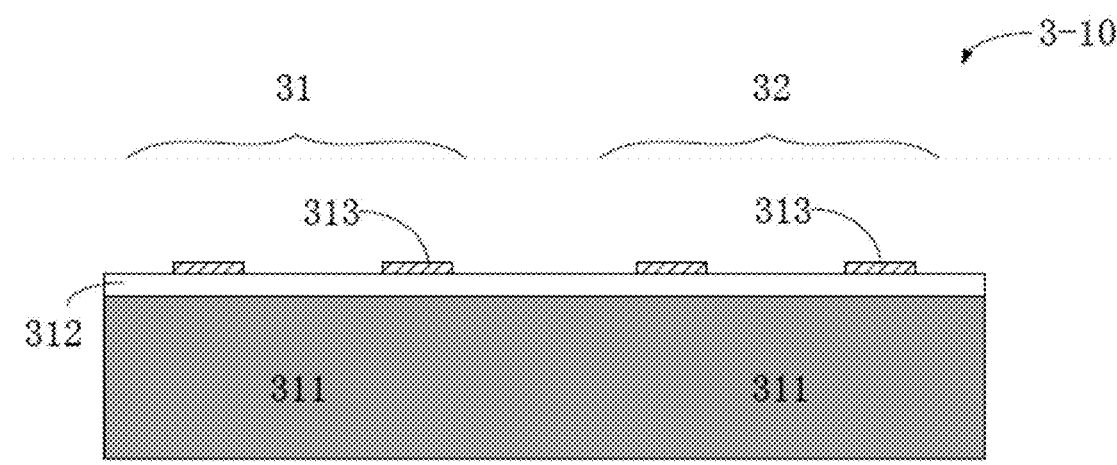

Embodiment 3: Another Method for Manufacturing A Sequencing Chip Having "Well"-Structured Transition Metal Oxide on a Silicon or Quartz Wafer As shown in FIG. 12 to FIG. 17, the present embodiment provides cross-sectional views of respective processes of another method for manufacturing a sequencing chip having "well"-structured transition metal oxide on a silicon or quartz wafer. This method differs from the method of Embodiment 2 in that, in this method, a patterned transition metal oxide layer 313 is first formed on the silicon oxide layer 312 of the wafer 311, while the transition metal oxide layer is formed on the entire wafer in the method of Embodiment 2, as illustrated in FIG. 12 and FIG. 6 for comparison.

FIG. 12 is a cross-sectional view of a wafer structure 3-10 including the patterned transition metal oxide layer 313, and the forming process thereof is similar to that described in Embodiment 1 with reference to FIG. 1.

Figure 13:
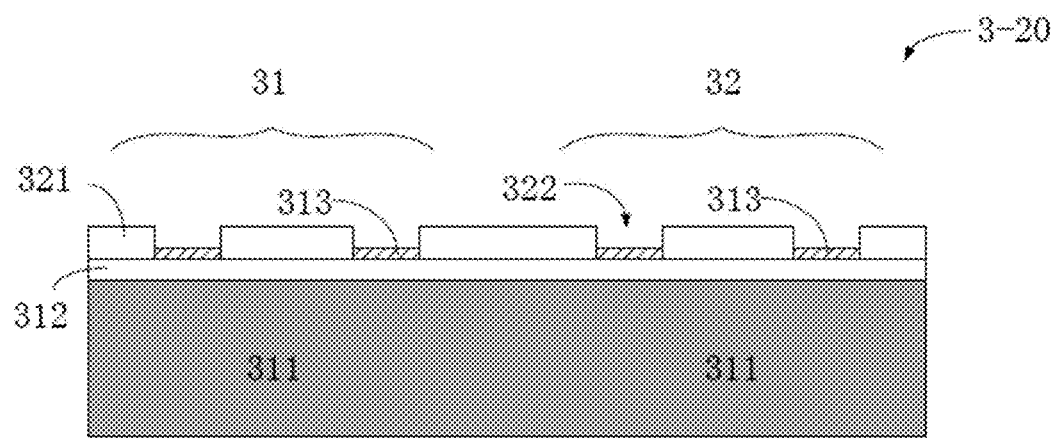

FIG. 13 is a cross-sectional view of a wafer structure 3-20, in which a silicon oxide layer 321 having patterned "well" structures 322 is formed on the wafer 3-10 including the patterned transition metal oxide layer shown in FIG. 12. A forming process of the silicon oxide layer 321 is similar to that described in Embodiment 2 with reference to FIG. 7, in which the "well" structures 322 in the silicon oxide layer corresponds to the "spots" of the patterned transition metal oxide layer 313 in one-to-one correspondence, the silicon oxide layer is higher than the transition metal oxide layer to form an array of patterned "well" structures on the wafer surface, and the transition metal oxide layer 313 is exposed at a bottom of the "well" structure.

Figure 14:
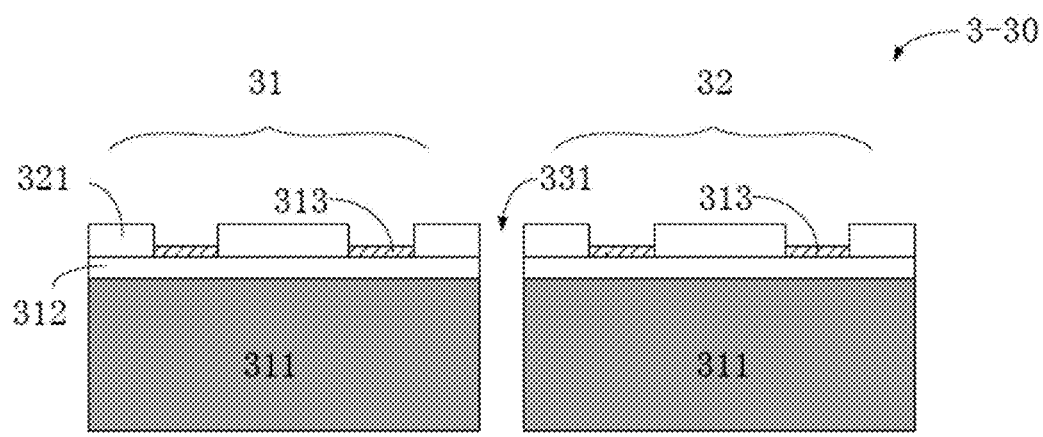

FIG. 14 is a cross-sectional view of multiple individual chips 3-30 separated by a cutting slot 331 formed after the wafer structure 3-20 shown in FIG. 13 is subjected to a dicing process. The dicing process is similar to that described in Embodiment 2 with reference to FIG. 8.

Figure 15:
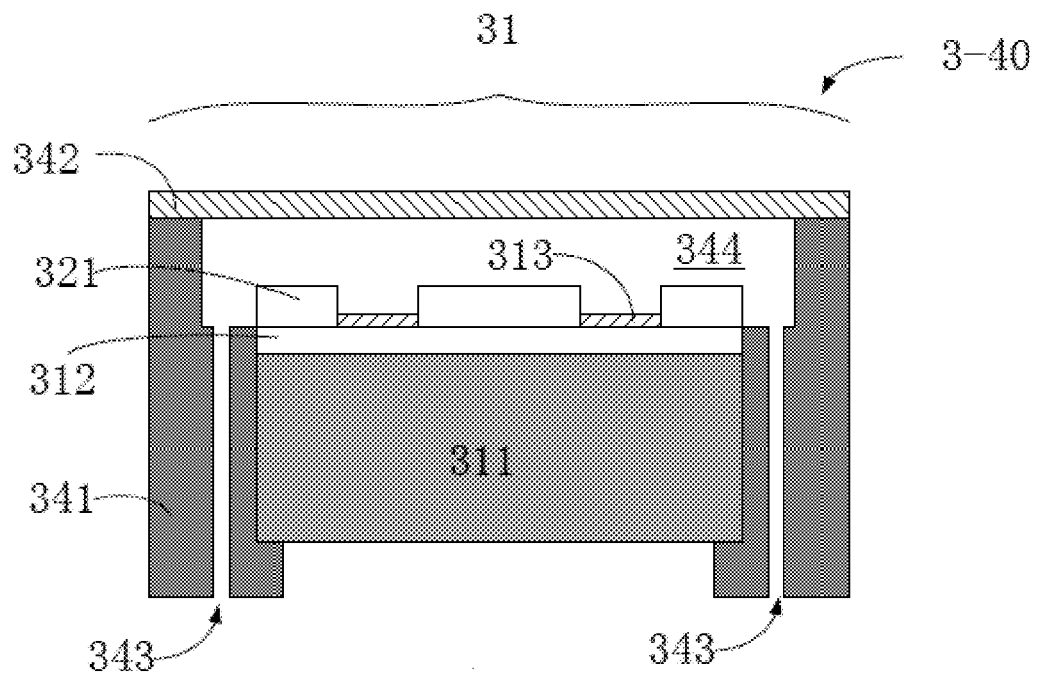

FIG. 15 is a cross-sectional view of a sequencing chip 3-40 formed after assembling one single chip 3-30 shown in FIG. 14. The process of assembling is similar to that described in Embodiment 2 with reference to FIG. 9.

Figure 16:
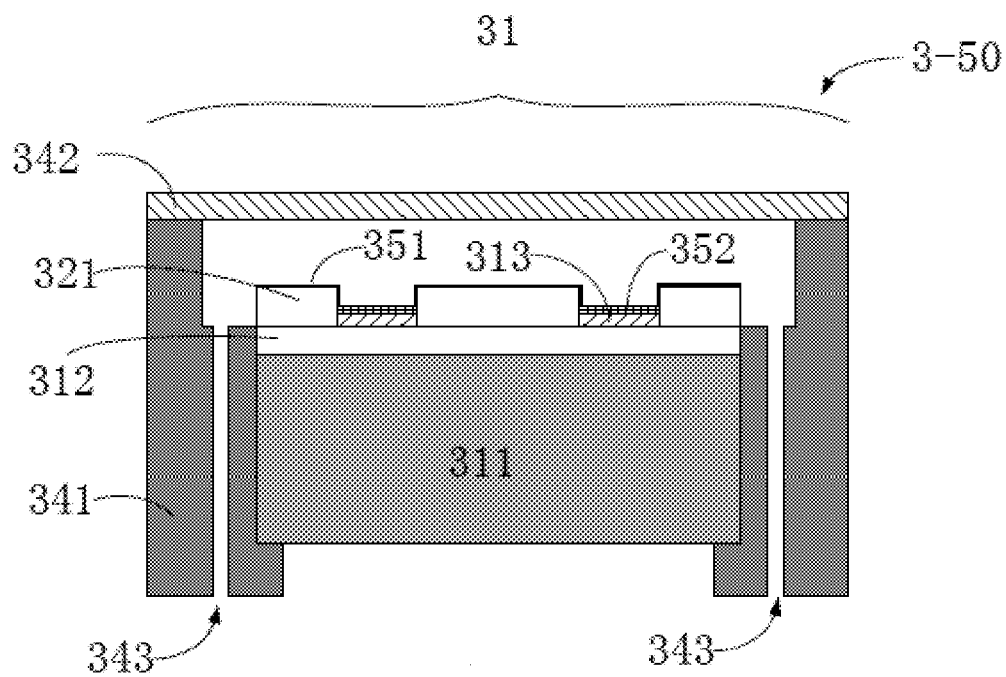

FIG. 16 illustrates a sequencing chip 3-50 formed after the sequencing chip 3-40 shown in FIG. 15 is subjected to a surface functionalization modification. The process of the surface functionalization treatment is similar to that described in Embodiment 2 with reference to FIG. 10.

Figure 17A:
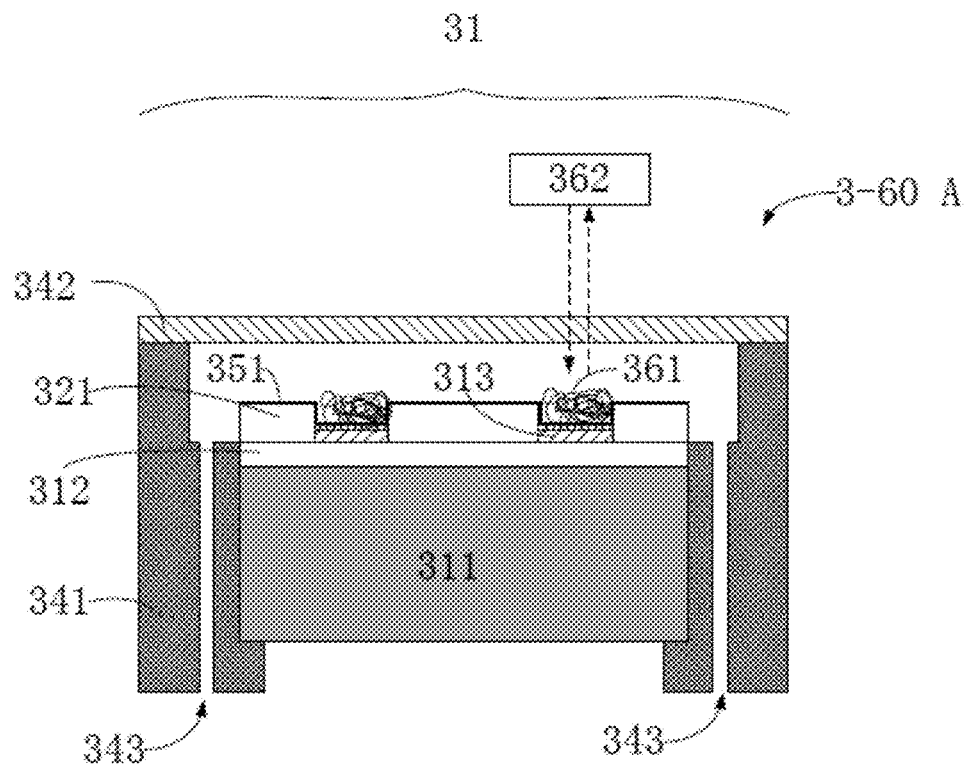
FIG. 17A is a cross-sectional view of a sequencing chip 3-60A with a DNB array according to an embodiment of the present disclosure, which is formed after DNBs are loaded on the sequencing chip 3-50 that has been subjected to a surface functionalization modification shown in FIG. 16.

FIG. 17A is a cross-sectional view of a sequencing chip 3-60A with a DNB array formed after DNBs are loaded on the sequencing chip 3-50 shown in FIG. 16, which has been subjected to the surface functionalization treatment. The process of loading DNBs is similar to that described in Embodiment 2 with reference to FIG. 11A.

Figure 17B:
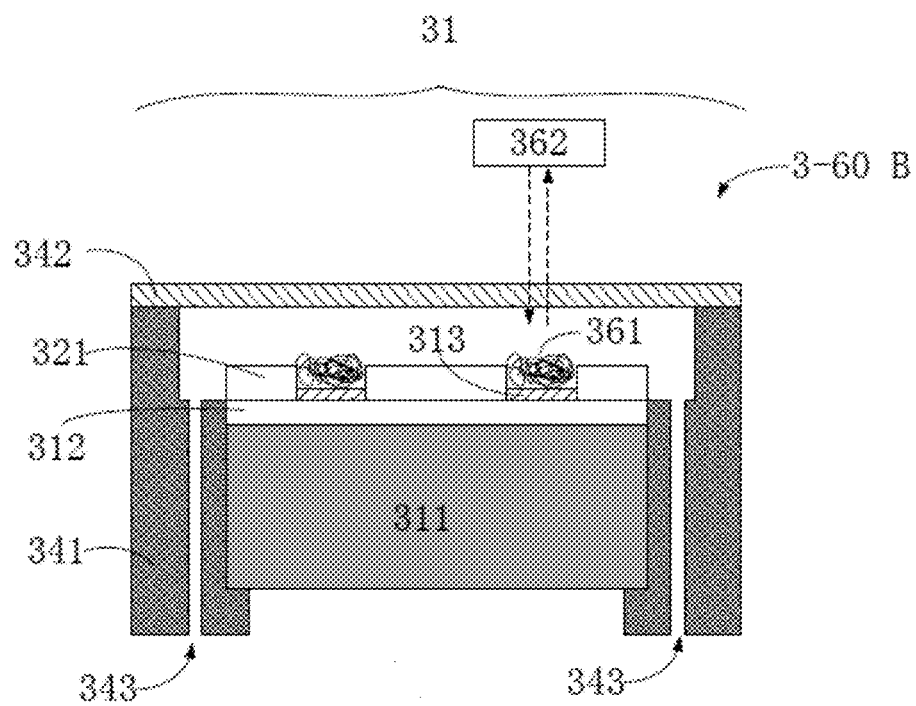
FIG. 17B is a cross-sectional view of a simpler sequencing chip 3-60B according to an embodiment of the present disclosure, in which a DNB array can be formed on the sequencing chip without performing a surface modification.

FIG. 17B is another simpler method for loading DNBs without performing a surface functionalization modification, which is similar to that described in Embodiment 2 with reference to FIG. 11B.

Figure 17C:
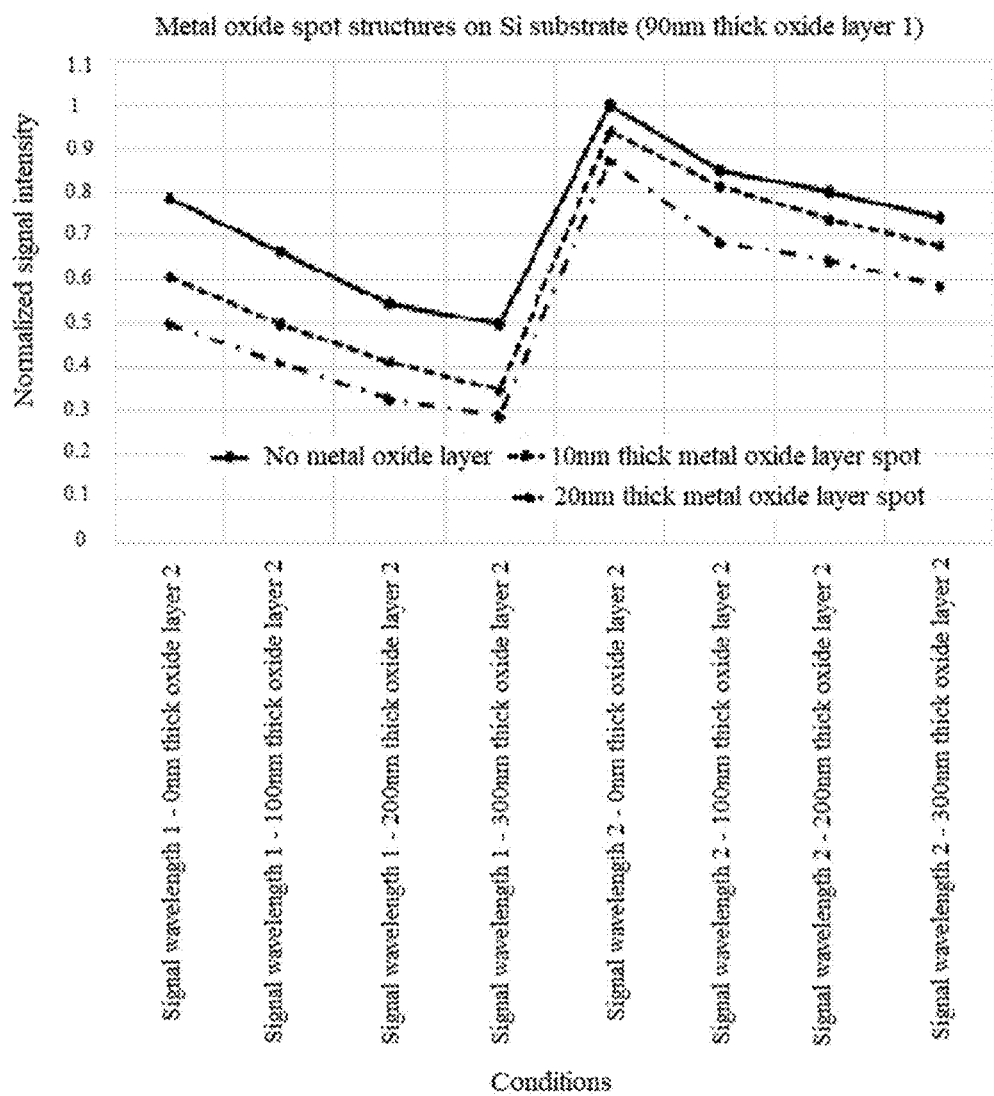
FIG. 17C illustrates another relation between the fluorescence signal of different "well" structures based on a silicon substrate and the second oxide layer according to an embodiment of the present disclosure.

In this embodiment, the transition metal oxide layer is formed as an array of "spot" structures on a first silicon oxide layer, a second silicon oxide layer having arrayed "well" structures is formed on the first silicon oxide layer, and the "well" structures of the silicon oxide layer correspond to the "spots" of the transition metal oxide layer. In the above Embodiment 1, through simulation calculation, it is determined that when the thickness of the first silicon oxide layer is 90 nm and the thickness of the transition metal oxide layer is about 10 nm to 20 nm, the reflectivity is optimized and the intensity of fluorescence signal is maximized. On this basis, a change of the intensity of fluorescence signal with the varying thickness of the second silicon oxide layer is simulated in presence of the second silicon oxide layer with the arrayed "well" structures. The simulation results are shown in FIG. 17C. When the thickness of the second layer of silicon oxide layer is 0, i.e., in absence of the second silicon oxide layer, the fluorescence signal has the strongest intensity, and with an increase in the thickness of the second silicon oxide layer, the reflectivity decreases and the intensity of fluorescence signal gradually weakens. Therefore, in order to ensure that the DNB sample is loaded in the "well" structures, it is optimal that the thickness of the second silicon oxide layer is about 50 nm, the thickness of the first silicon oxide layer is 90 nm, and the thickness of the transition metal oxide layer is about 10 nm to 20 nm.

Embodiment 4: Method for Manufacturing a Back-Illuminated Sequencing Chip Having "Spot"-Structured Transition Metal Oxide on a Quartz Wafer As shown in FIG. 18 to FIG. 22, the present embodiment provides cross-sectional views of respective processes of a method for manufacturing a back-illuminated sequencing chip having "spot"-structured transition metal oxide on a quartz wafer. Embodiment differs from Embodiments 1-3 in that, the method of Embodiment uses a quartz wafer or any other suitable transparent glass wafer as the substrate, and prepares a patterned transition metal oxide layer having "spot" structures on the substrate wafer, and during the assembling process, the chip is placed in such a manner that the patterned layer faces downward, and the excitation light source/camera excites the DNBs and acquires the fluorescence signal from the back of the chip, i.e., through the quartz wafer substrate.

Figure 18:
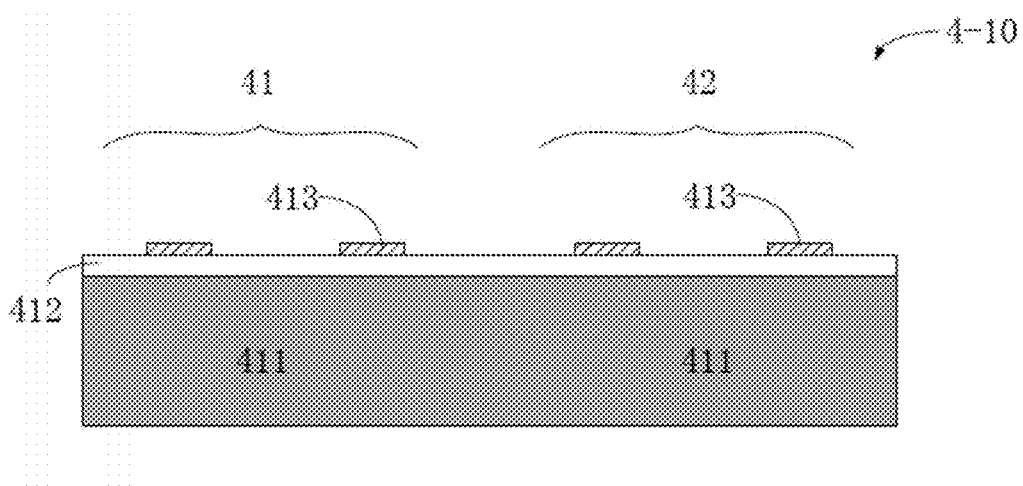

FIG. 18 is a cross-sectional view of a wafer structure 4-10 having a patterned transition metal oxide layer formed on a silicon oxide layer 412 of a quartz wafer 411, where the wafer is a quartz wafer. Any other suitable light-transmitting glass wafer can be also used herein. The processes of forming the oxide layer 412 and the patterned transition metal oxide layer 413 are similar to those described in Embodiment 1 with reference to FIG. 1.

Figure 19:
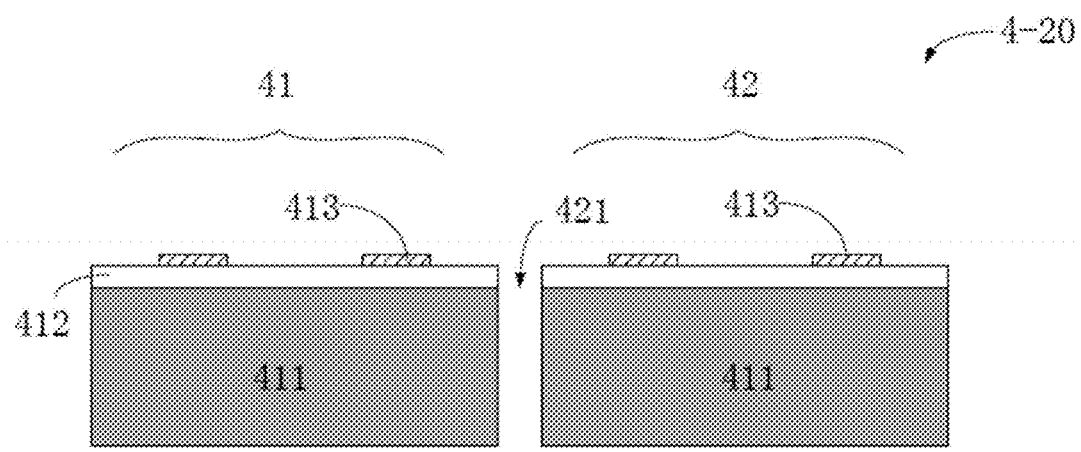

FIG. 19 is a cross-sectional view of multiple individual chips 4-20 separated by a cutting slot formed after the wafer 4-10 shown in FIG. 18 is subjected to a dicing process. The dicing process is similar to that described in Embodiment 1 with reference to FIG. 2.

Figure 20:
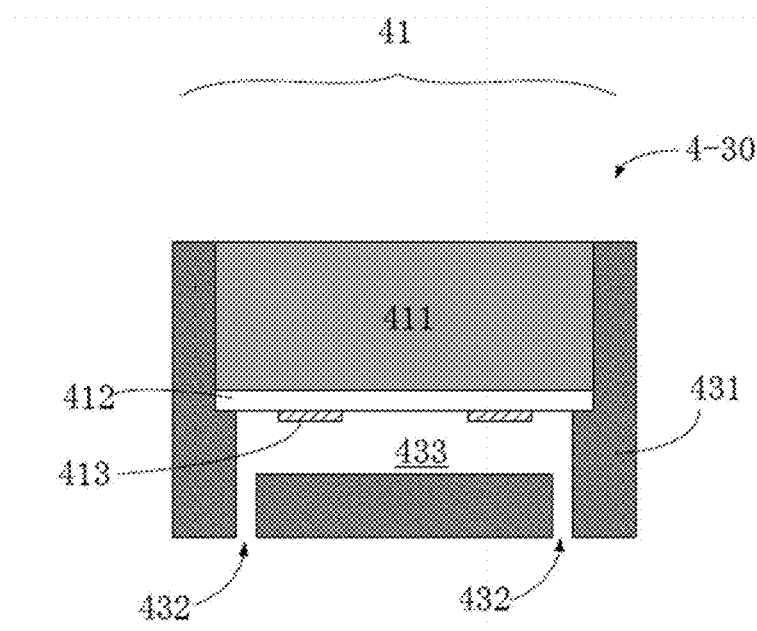

FIG. 20 shows a cross-sectional view of a sequencing chip 4-30 formed after one single chip shown in FIG. 19 is encapsulated. In this packaging process, the sequencing chip is assembled with and attached to a frame 431 including a liquid inlet and outlet 432 in such a manner that the patterned layer faces downward, and a fluid channel 433 is formed between the frame and the patterned layer on the chip. The frame 431 can be formed by any suitable processing method with any suitable material, and the chip and the frame can be bonded to each other with any suitable adhesive. It should be appreciated that this figure merely illustrates a structure that the frame is supposed to have. However, this figure is not restrictive, and any other structures of the frame shall fall within the scope of the rights of the present disclosure, as long as they can support the chip, has a liquid inlet and outlet, and can form a fluid channel with the patterned layer of the chip.

Figure 21:
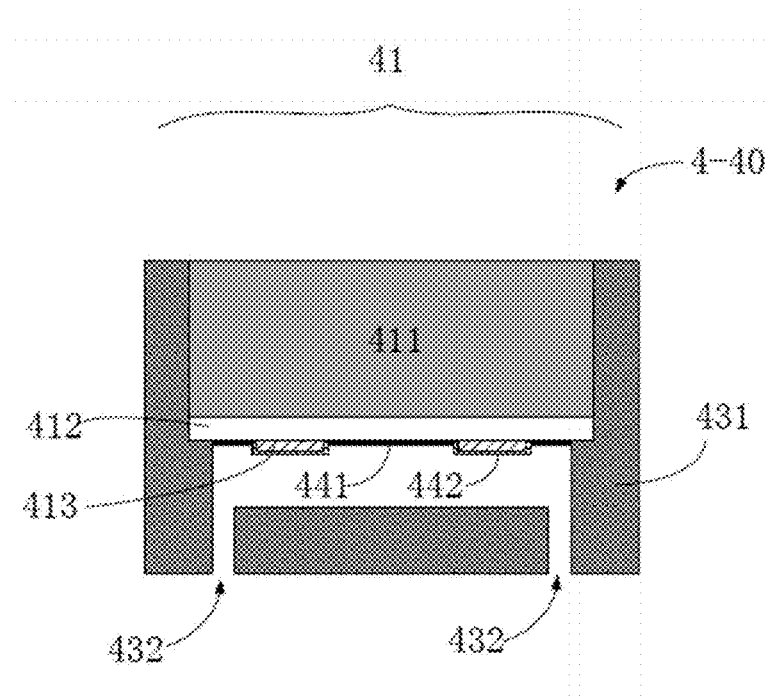

FIG. 21 is a cross-sectional view of a sequencing chip 4-40 formed after the sequencing chip 4-30 shown in FIG. 20 is subjected to surface functionalization modification. The steps of the functionalization modification are similar to those shown in FIG. 4 in Embodiment 1.

Figure 22A:
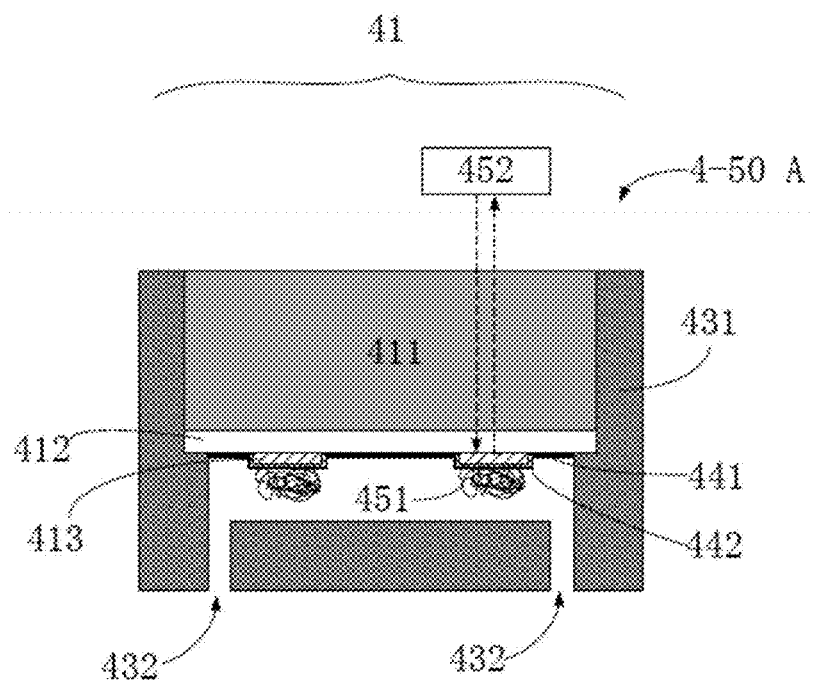
FIG. 22A is a cross-sectional view of a sequencing chip 4-50A with a DNB array according to an embodiment of the present disclosure, which is formed after DNBs are loaded on the sequencing chip 4-40 that has been subjected to a surface functionalization modification shown in FIG. 21.

FIG. 22A is a cross-sectional view of a sequencing chip 4-50A with a DNB array, formed after DNBs are loaded on the sequencing chip 4-40 shown in FIG. 21, which has been subjected to the functionalization modification. The process of loading DNBs is similar to that described in Embodiment 1 with reference to FIG. 5A. FIG. 22A also illustrates an excitation light source/camera 452, which illuminates the DNBs from the back of the quartz or glass substrate of the sequencing chip, and acquires the fluorescent signal emitted by the DNBs labeled with fluorescent markers, so as to sequence the bases of the DNBs.

Figure 22B:
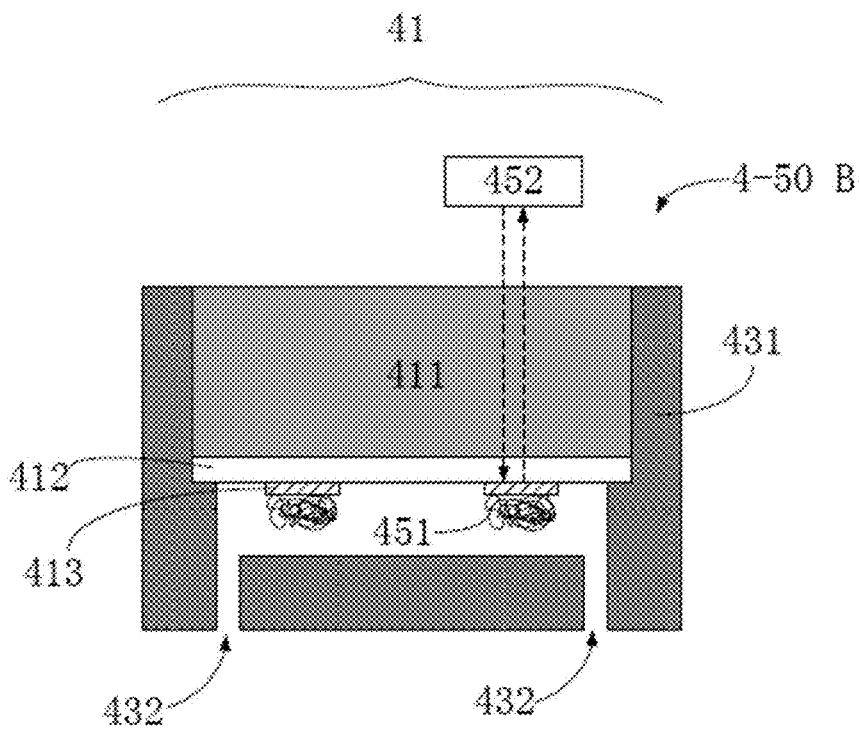
FIG. 22B is a cross-sectional view of a simpler sequencing chip 4-50B according to an embodiment of the present disclosure, which a DNB array can be formed in the sequencing chip without performing a surface modification.

FIG. 22B illustrates another simpler method for loading DNBs without performing a surface functionalization modification, which is similar to that shown in FIG. 5B of Embodiment 1. The excitation light source/camera 452 illuminates the DNBs from the back of the quartz or glass substrate of the sequencing chip, and acquires the fluorescent signal emitted by the DNBs labeled with the fluorescent marker, so as to sequence the bases of the DNBs.

Figure 22C:
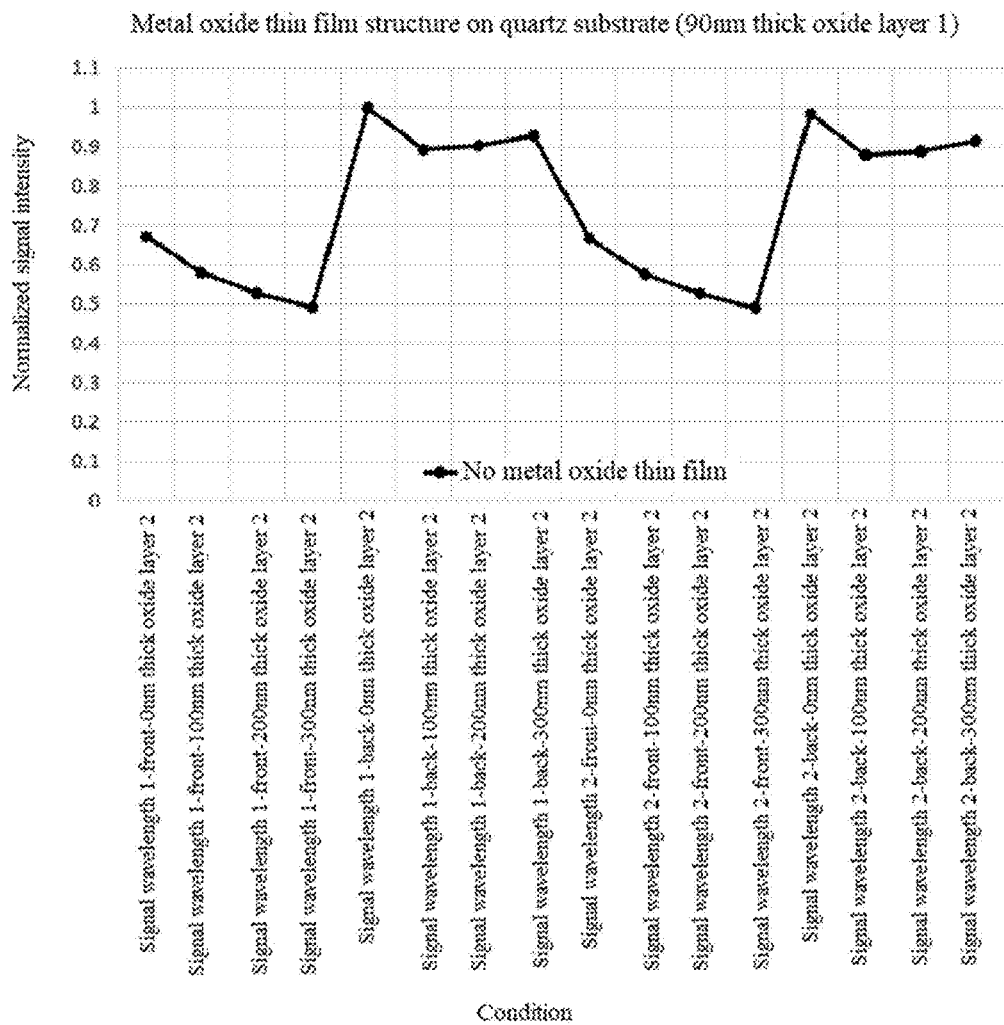
FIG. 22C illustrates a relation between a fluorescence signal and the second oxide layer (back-illuminated "spot" structures) based on a quartz substrate according to an embodiment of the present disclosure.

In Embodiment 4, a silicon oxide layer is first formed on a transparent quartz wafer, then an array of transition metal oxide "spot" structures is formed on the silicon oxide layer, and the DNB sample is loaded on the transition metal oxide "spot" structures. However, in this embodiment, the camera is placed above the back of the quartz substrate, and the light signal emitted by the DNBs can be captured by the camera only after transmitting through the transition metal oxide layer, the silicon oxide layer, and the quartz substrate. Therefore, in Embodiment 4, the signal intensities of fluorescence signals, which are emitted by the DNB and can be captured by the camera after transmitting through the transition metal oxide layer, the silicon oxide layer, and the quartz substrate of different thicknesses, are calculated and compared. The simulation results are shown in FIG. 22C. When the thickness of the silicon oxide layer is 90 nm and the thickness of the transition metal oxide layer is 10-20 nm (the thickness of the second silicon oxide layer is 0), the transmittance of fluorescence emitted by the DNB sample is maximized. At this time, the intensity of fluorescence signal that have passed through the transition metal oxide layer, silicon oxide layer and quartz substrate is the highest, which is close to 100%.

Embodiment 5: Method for Manufacturing a Back-Illuminated Sequencing Chip Having "Well"-Structured Transition Metal Oxide on a Quartz Wafer As shown in FIG. 23 to FIG. 28, the present embodiment provides cross-sectional views of respective processes of a method for manufacturing a back-illuminated sequencing chip having "well"-structured transition metal oxide on a quartz wafer. The method of Embodiment uses a quartz wafer or any other suitable transparent glass wafer as the substrate, and prepares a patterned transition metal oxide layer with patterned "well" structures on the substrate wafer. The chip is assembled in such a manner that the patterned layer faces downward, and thus the excitation light source/ camera excites the DNBs and acquires the fluorescence signal from the back of the chip, i.e., through the quartz wafer substrate.

Figure 23:
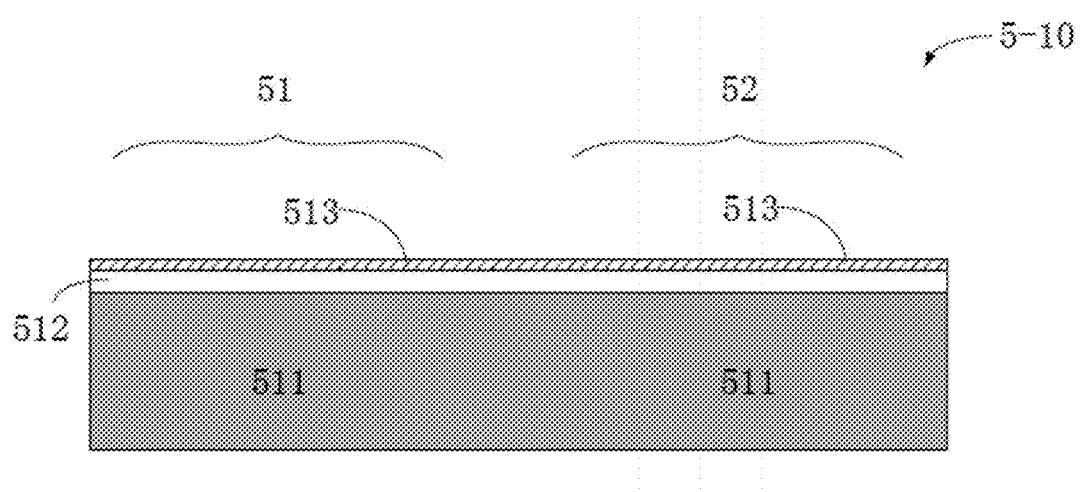

FIG. 23 is a cross-sectional view of a wafer structure 5-10, in which a silicon oxide layer and a transition metal oxide layer are formed on a bare wafer. The forming process thereof is similar to that described in Embodiment 2 with reference to FIG. 6.

Figure 24:
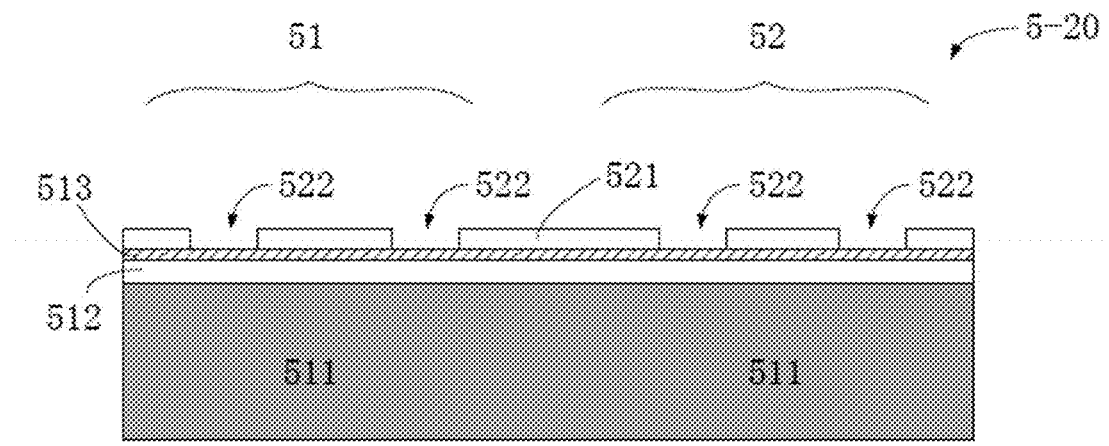

FIG. 24 is a cross-sectional view of a wafer 5-20, in which a silicon oxide layer having patterned "well" structures is formed on the transition metal oxide layer of the wafer 5-10 as shown in FIG. 23. The forming process thereof is similar to that described in Embodiment 2 with reference to FIG. 7.

Figure 25:
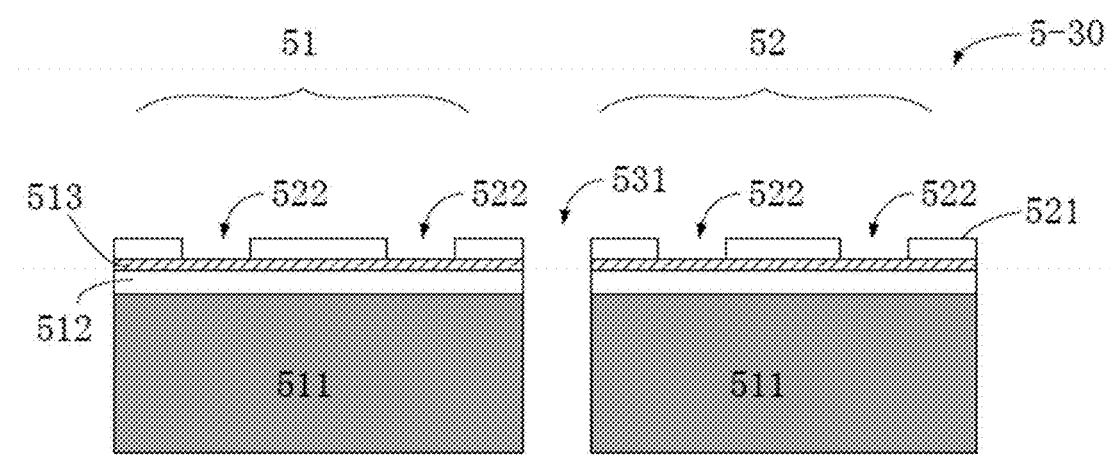

FIG. 25 is a cross-sectional view of multiple individual chips 5-30 formed after the wafer structure 5-20 of FIG. 24 is subjected to a dicing process. In this figure, the dicing process is similar to that in described in Embodiment 1 with reference to FIG. 2.

Figure 26:
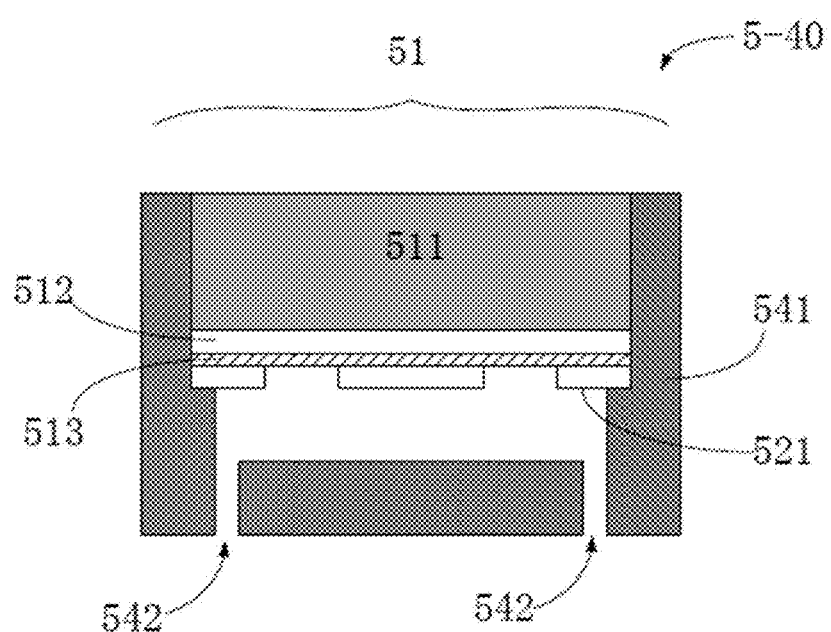

FIG. 26 is a cross-sectional view of a sequencing chip 5-40 formed after one single chip shown in FIG. 25 is subjected to a packaging process. In this process step, the sequencing chip is assembled with and attached to a frame 431 including a liquid inlet and outlet 432 in such a manner that the patterned layer faces downward, and a fluid channel 433 is formed between the frame and the patterned layer on the chip. In this figure, the process of assembling is similar to that described in Embodiment 3 with reference to FIG. 20.

Figure 27:
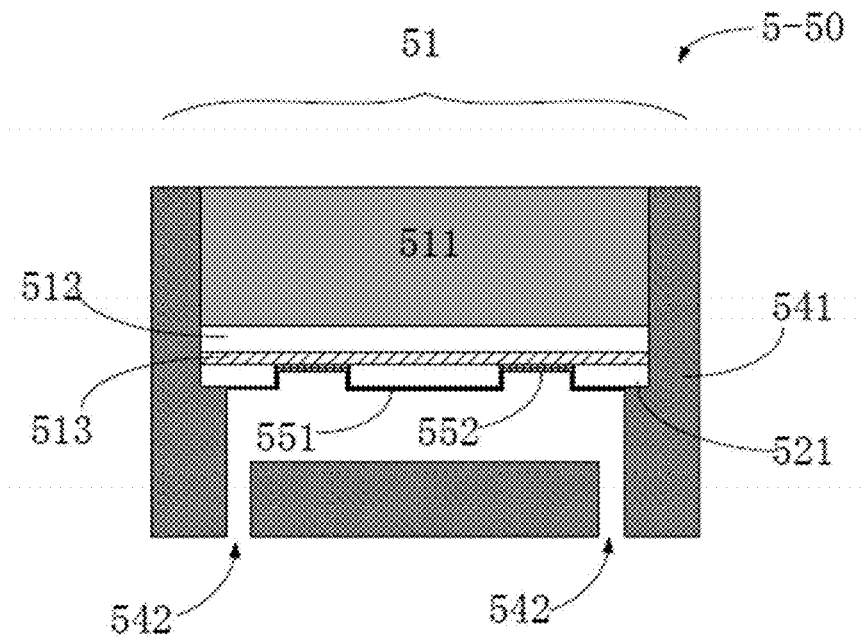

FIG. 27 is a cross-sectional view of a sequencing chip 5-50 formed after the sequencing chip 5-40 shown in FIG. 26 is subjected to a surface functionalization modification. The process of the functionalization modification is similar to that described in Embodiment 1 with reference to FIG. 4.

Figure 28A:
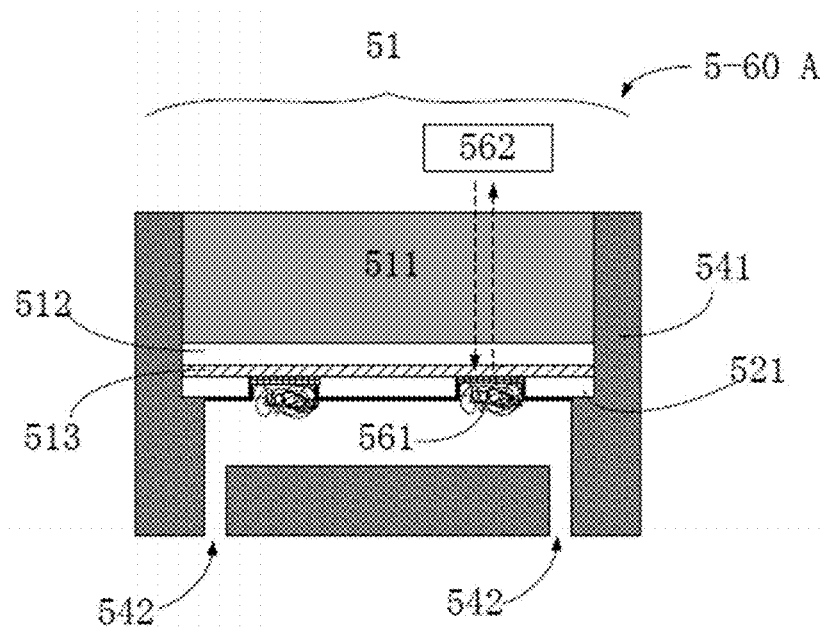
FIG. 28A is a cross-sectional view of a sequencing chip 5-60A with a DNB array according to an embodiment of the present disclosure, which is formed after DNBs are loaded on the sequencing chip 5-50 that has been subjected to a surface functionalization modification as shown in FIG. 27.

FIG. 28A is a cross-sectional view of a sequencing chip 5-60A with a DNB array formed after DNBs are loaded on the sequencing chip 5-50 shown in FIG. 27, which has been subjected to a functionalization modification. The process of loading DNBs is similar to that described in Embodiment 1 with reference to FIG. 5A. This figure also shows an excitation light source/camera 562, which illuminates the DNB and acquires the fluorescent signal emitted by the DNBs labeled with fluorescent markers from the back of the quartz or glass substrate of the sequencing chip, so as to sequence the bases of the DNBs.

Figure 28B:
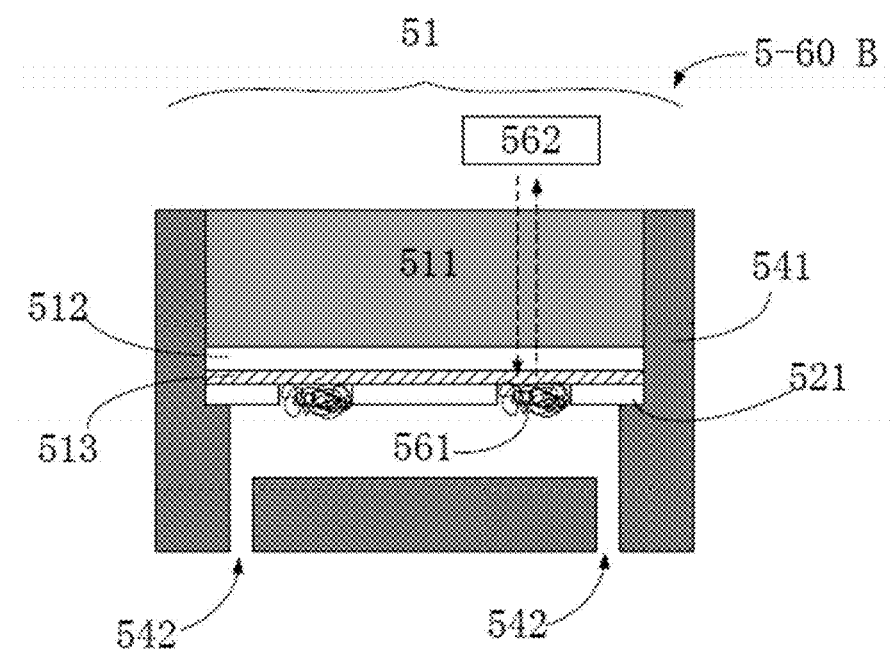
FIG. 28B is a cross-sectional view of a simpler sequencing chip 5-60B according to an embodiment of the present disclosure, in which a DNB array can be formed on the sequencing chip without surface modification.

FIG. 28B is another simpler method for loading DNBs without performing a surface functionalization modification, which is similar to FIG. 5B in Embodiment 1. The excitation light source/camera 562 illuminates the DNBs and acquires the fluorescence signal emitted by the DNBs labeled with fluorescent markers from the back of the quartz or glass substrate of the sequencing chip, so as to sequence the bases of the DNBs.

Figure 28C:
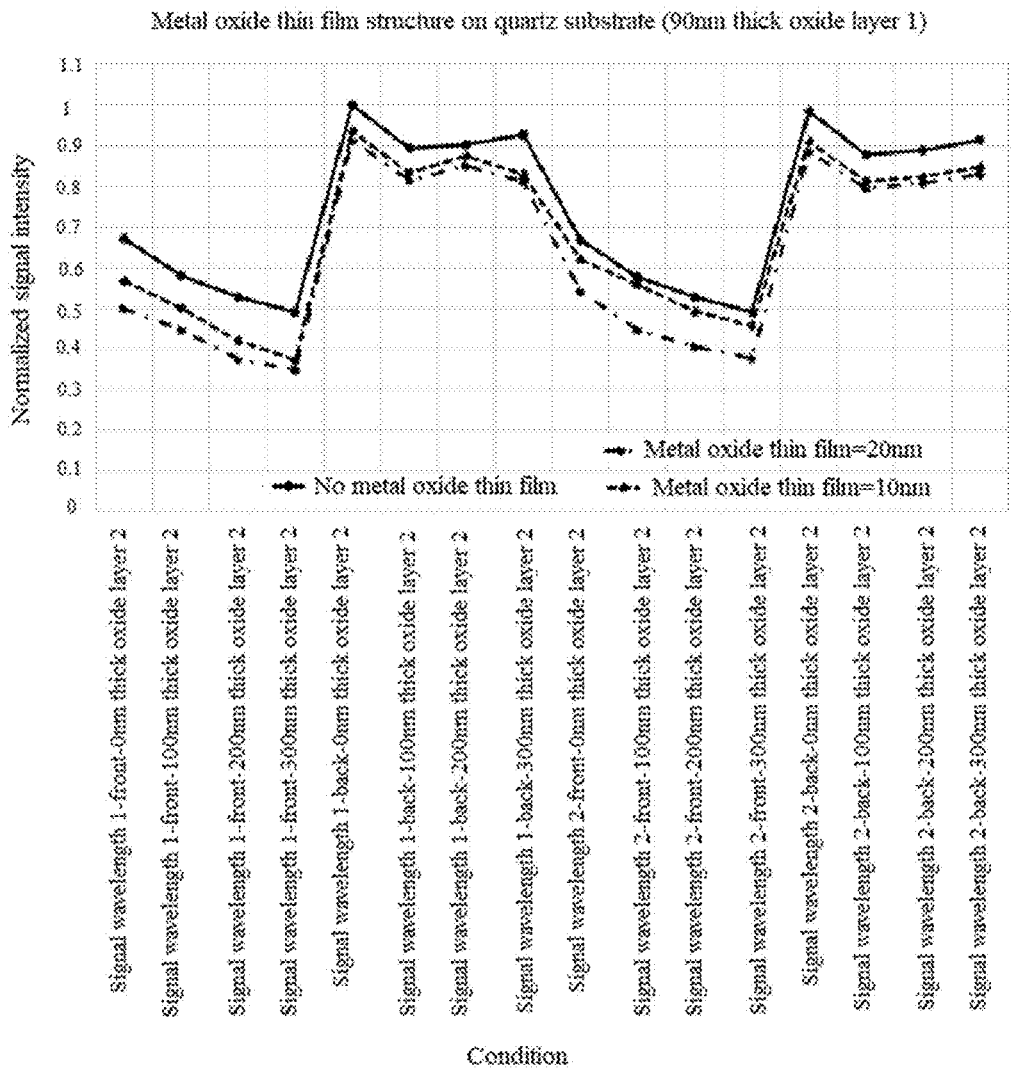
FIG. 28C illustrates a relation between a fluorescence signal and a second oxide layer (back-illuminated "well" structures) based on different "well" structures of a quartz substrate according to an embodiment of the present disclosure.

In Embodiment 5, a first silicon oxide layer is first formed on the quartz wafer, a transition metal oxide layer is then formed on the first silicon oxide layer, and a second silicon oxide layer with arrayed "well" structures is formed on the transition metal oxide layer. In this case, the DNB sample is also loaded on the transition metal oxide layer in the "well" structures, and the light signal emitted by the DNB sample can be captured by the camera placed above the back of the quartz substrate after transmitting through the transition metal oxide layer, the first silicon oxide layer, and the quartz substrate. In this case, influences of different thicknesses of the second silicon oxide layer on the intensity of fluorescence signal transmitted through the thin film layers are simulated when the thickness of the first silicon oxide layer is 90 nm and the thickness of the transition metal oxide layer is 10 nm or 20 nm. The simulation results are shown in FIG. 28C. When the thickness of the first silicon oxide layer is the same as the thickness of the second silicon oxide layer, an intensity of the fluorescence signal when the transition metal oxide layer has a thickness of 10 nm is higher than that when the transition metal oxide layer has a thickness of 20 nm. When the thickness of the first silicon oxide layer and the thickness of the transition metal oxide layer are constant, the intensity of fluorescence signal transmitted through the thin film layers does not increase or decrease monotonously with an increase in the thickness of the second silicon oxide layer, but the intensity of fluorescence signal tends to change under different wavelengths. In this case, when the thickness of the second silicon oxide layer ranges from 100 nm to 200 nm, it can be ensured that the "well" structures have an appropriate depth for loading DNBs, and the camera can acquire fluorescence signals with a relatively higher intensity.

Figure 29:
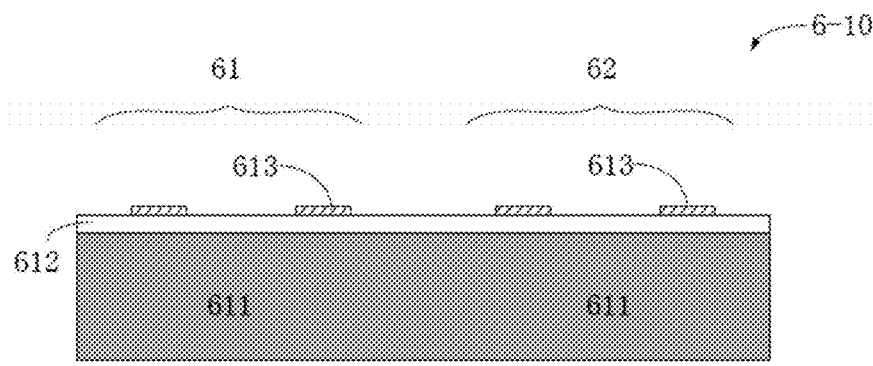

Embodiment 6: Another Method for Manufacturing a Back-Illuminated Sequencing Chip Having "Well"-Structured Transition Metal Oxide on a Quartz Wafer As shown in FIGS. 29-34, the present embodiment provides cross-sectional views in the process of the respective steps of a method for manufacturing a back-illuminated sequencing chip having "well"-structured transition metal oxide on a quartz wafer. This method differs from the method of Embodiment 5 in that, in this method, a patterned transition metal oxide layer 613 is formed on a silicon oxide layer 612 of a wafer 611, while a transition metal oxide layer is formed over the entire wafer in the method of Embodiment 5, as shown in FIG. 29 and FIG. 23 for comparison.

FIG. 29 is a cross-sectional view of a wafer structure 6-10 including a patterned transition metal oxide layer 613, and a forming process thereof is similar to that described above with reference to FIG. 1.

Figure 30:
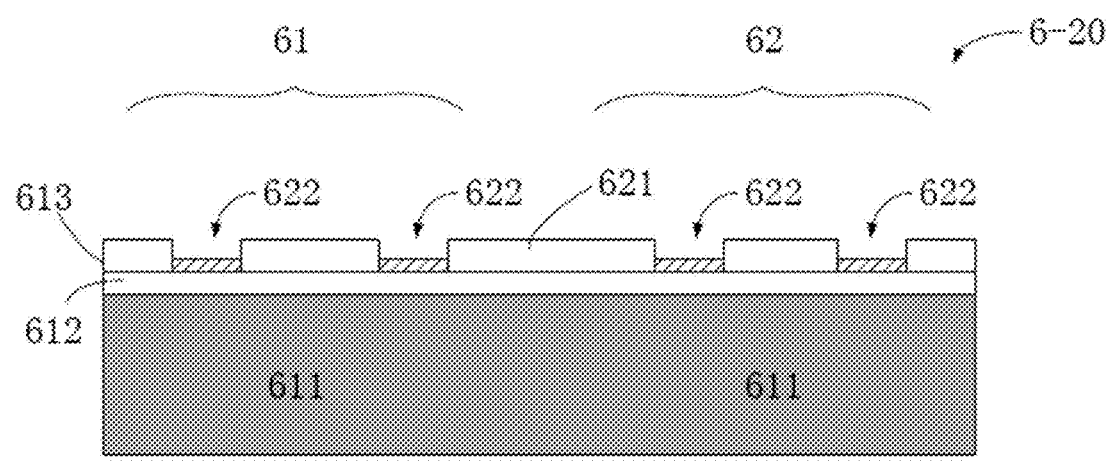

FIG. 30 is a cross-sectional view of a wafer structure 6-20, in which a silicon oxide layer 621 having patterned "well" structures 622 is formed on the wafer 6-10 including a patterned transition metal oxide layer as shown in FIG. 29. A forming process thereof is similar to that described in Embodiment 2 with reference to FIG. 7, in which the "well" structures 622 of the silicon oxide layer correspond to the patterned "spots" of the transition metal oxide layer 613 in one-to-one correspondence, and the silicon oxide layer is higher than the transition metal oxide layer to form an array of patterned "well" structures on the wafer surface, and the transition metal oxide layer 613 is exposed at a bottom of the "well" structure.

Figure 31:
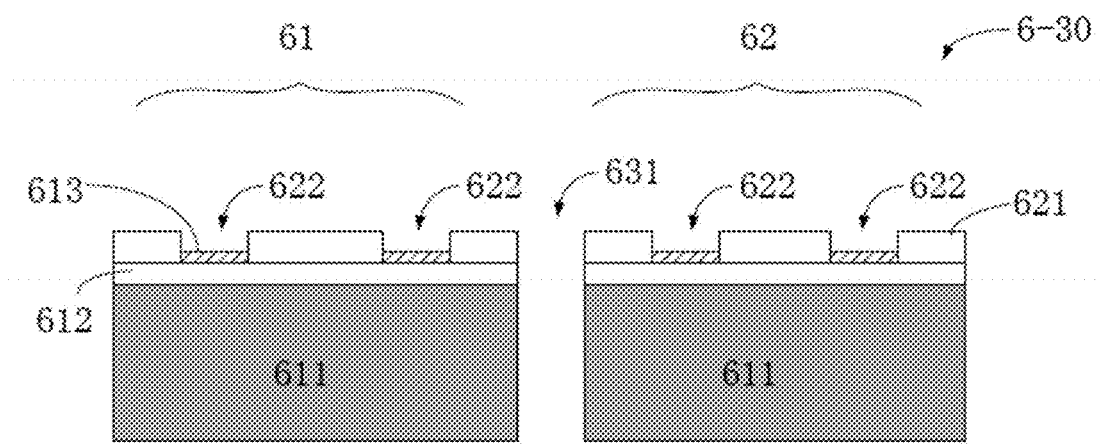

FIG. 31 is a cross-sectional view of multiple individual chips 6-30 separated by a cutting slot 631 formed after the wafer structure 6-20 shown in FIG. 30 is subjected to a dicing process. The dicing process is similar to that described in Embodiment 2 with reference to FIG. 8.

Figure 32:
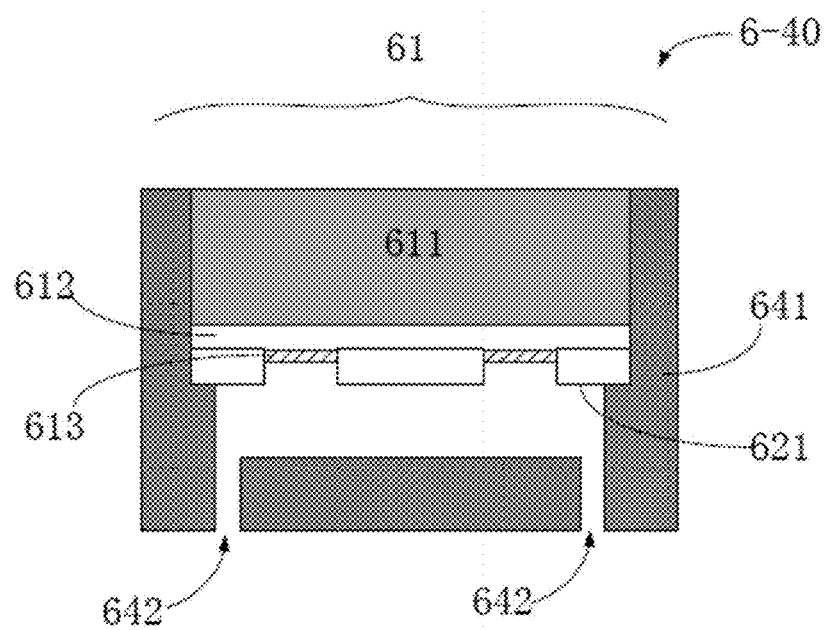

FIG. 32 is a cross-sectional view of a sequencing chip 6-40 formed after one single chip shown in FIG. 31 is encapsulated. A process of packaging in this figure is similar to that shown in FIG. 26 of Embodiment 5.

Figure 33:
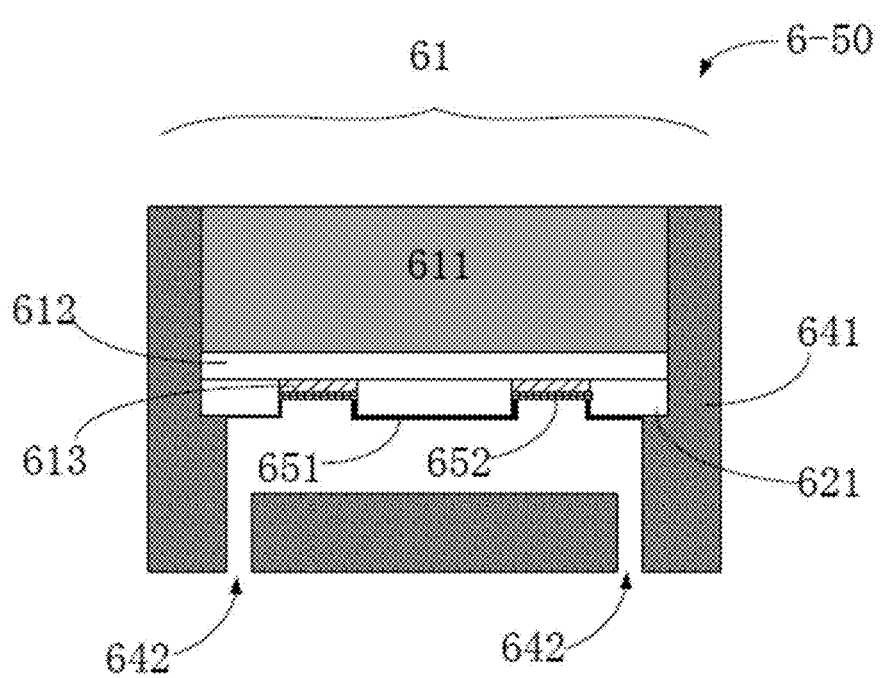

FIG. 33 is a cross-sectional view of a sequencing chip 6-50 formed after the sequencing chip 6-40 shown in FIG. 32 is subjected to a surface functionalization modification. A process of the functionalization modification is similar to that described in Embodiment 1 with reference to FIG. 4.

Figure 34A:
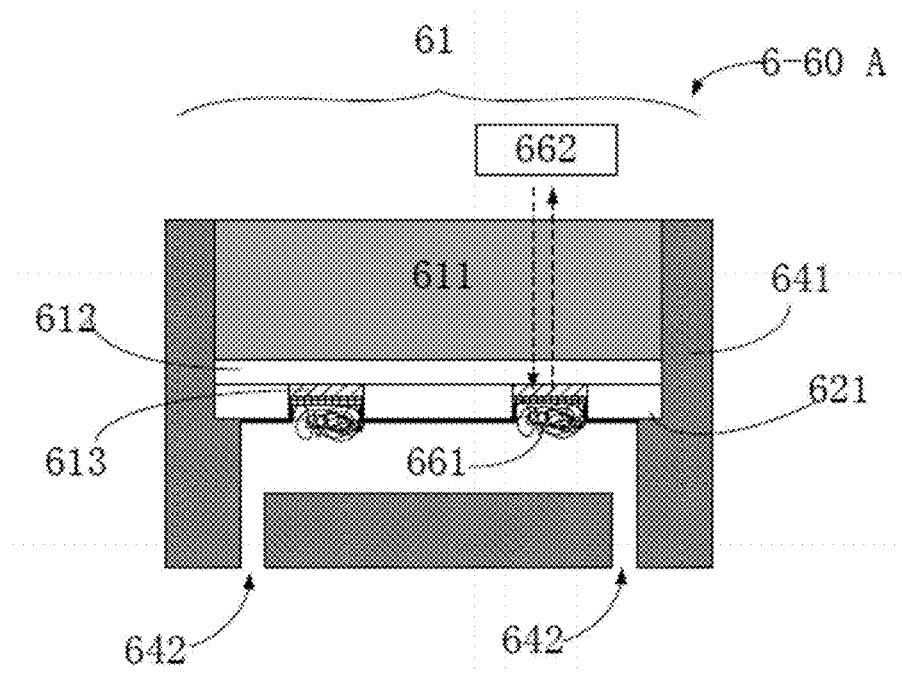
FIG. 34A is a cross-sectional view of a sequencing chip 6-60A with a DNB array according to an embodiment of the present disclosure, which is formed after DNBs are loaded on the sequencing chip 6-50 that has been subjected to a surface functionalization modification as shown in FIG. 33

FIG. 34A is a cross-sectional view of a sequencing chip 6-60A with a DNB array formed after DNBs are loaded on the sequencing chip 6-50 shown in FIG. 33, which has been subjected to a functionalization modification. A process of loading DNBs is similar to that described in Embodiment 1 with reference to FIG. 5A. This figure also illustrates an excitation light source/camera 662, which illuminates the DNBs and acquires the fluorescent signal emitted by the DNBs labeled with fluorescent markers from the back of the quartz or glass substrate of the sequencing chip, so as to sequence the bases of the DNBs.

Figure 34B:
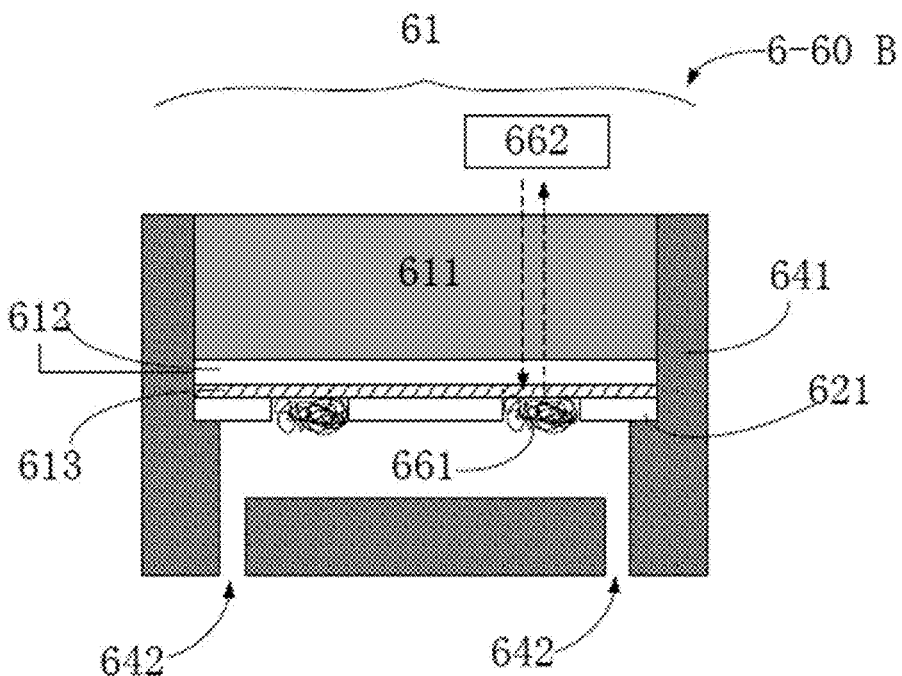
FIG. 34B is a cross-sectional view of a simpler sequencing chip 6-60B according to an embodiment of the present disclosure, in which a DNB array can be formed on the sequencing chip without performing a surface modification.

FIG. 34B is another simpler method for loading DNBs without performing a surface functionalization modification, which is similar to that described in Embodiment 1 with reference to FIG. 5B. The excitation light source/camera 662 illuminates the DNBs and acquires the fluorescent signal emitted by the DNBs labeled with fluorescent markers from the back of the quartz or glass substrate of the sequencing chip, so as to sequence the bases of the DNBs.

In Embodiment 6, a first silicon oxide layer is formed on the quartz wafer, then a transition metal oxide layer having arrayed "spot" structures is formed on the first silicon oxide layer, and then a second silicon oxide layer having arrayed "well" structures is formed above the transition metal oxide layer. The "well" structures of the second silicon oxide layer correspond to the "spot" structures of the transition metal oxide layer, and the transition metal oxide "spot" is located at a bottom of the "well" structure of the second silicon oxide layer. In this case, the DNB sample is also loaded on the transition metal oxide layer in the "well" structures, and the light signal emitted by the DNB sample is captured by the camera placed above the back of the quartz substrate after transmitting through the transition metal oxide layer, the first silicon oxide layer, and the quartz substrate.

Figure 34C:
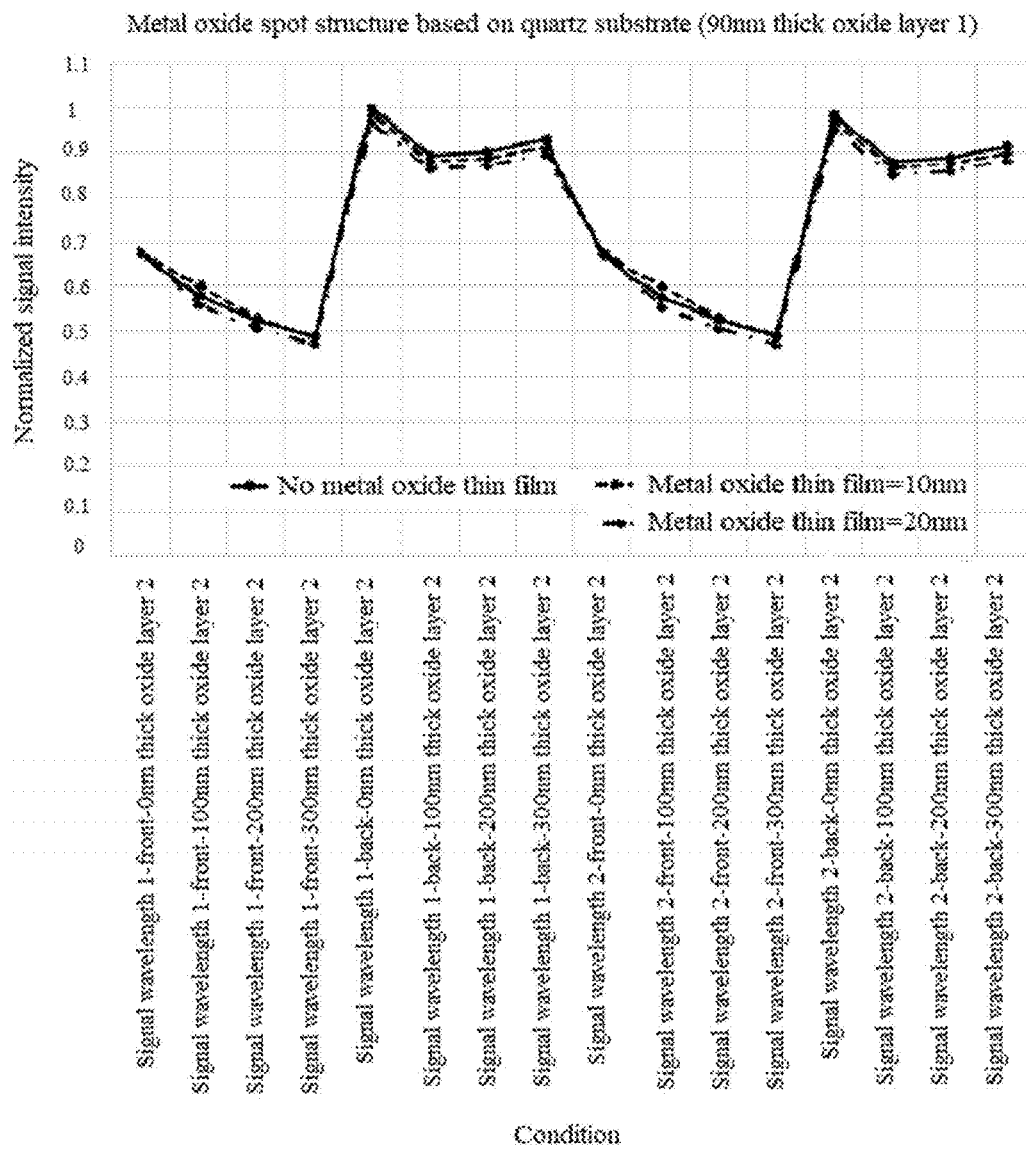
FIG. 34C illustrates a relation between a fluorescence signal and the second oxide layer (another back-illuminated "well" structure) based on another different "well" structure based on a quartz substrate according to an embodiment of the present disclosure.

In this case, influences of different thicknesses of the second silicon oxide layer on the intensity of fluorescence signal are first simulated when the thickness of the first silicon oxide layer is 90 nm, and the thickness of the transition metal oxide layer is 10 nm or 20 nm. The simulation results are shown in FIG. 34C. When the thickness of the first silicon oxide layer and the thickness of the second silicon oxide layer are the same, the intensity of fluorescence signal of a structure including a transition metal oxide layer with a thickness of 10 nm is also higher than that of a structure including a transition metal oxide layer with a thickness of 20 nm. When the thickness of the first silicon oxide layer and the thickness of the transition metal oxide layer are constant, the intensity of fluorescence signal transmitted through the thin film layer does not increase or decrease monotonously with an increase in the thickness of the second silicon oxide layer, but the intensity of fluorescence signal tends to change under different wavelengths. In this case, when the thickness of the second silicon oxide layer ranges from 100 nm to 200 nm, it can be ensured that the "well" structures have an appropriate depth for loading DNBs, and the camera can acquire fluorescence signals with a relatively higher intensity.

Embodiment 7: Method for Manufacturing a Sequencing Chip Having "Spot"-Structured or "Well"-Structured Transition Metal Oxide on a CMOS Wafer As shown in FIGS. 35-41, the present embodiment provides a method for manufacturing a sequencing chip having transition metal oxide "spot" or "well" structures arranged in array on a CMOS wafer. This method differs from the foregoing methods in that, this method requires no external excitation light source/camera device, while all the foregoing methods employs an external excitation light source/camera, and he excitation light with a specific wavelength and energy emitted by the external excitation light source excites the DNBs labeled with fluorescent markers to emit light of a specific wavelength and energy, and the light signal emitted by the DNBs is captured by the camera for sequencing. The CMOS wafer used in this method is a CMOS wafer with an image sensor function. Each wafer may have hundreds to thousands of image sensor chips, and each image sensor chip can have millions to tens of millions of pixels (and photoelectric diode array). The image sensor chips can be configured to sense external light signals of different intensities and convert them into corresponding electrical signals. The DNBs labeled with fluorescent markers are selectively loaded on the photodiode array on the image sensor chip to form a DNB array corresponding to the photodiode array in one-to-one correspondence, and the DNBs emit light with biological or chemical methods (without using an external excitation light source), and the DNB array loaded on the image sensor chip can be sequenced by identifying light signals of the image sensor chip at different times and at different pixels.

Figure 35:
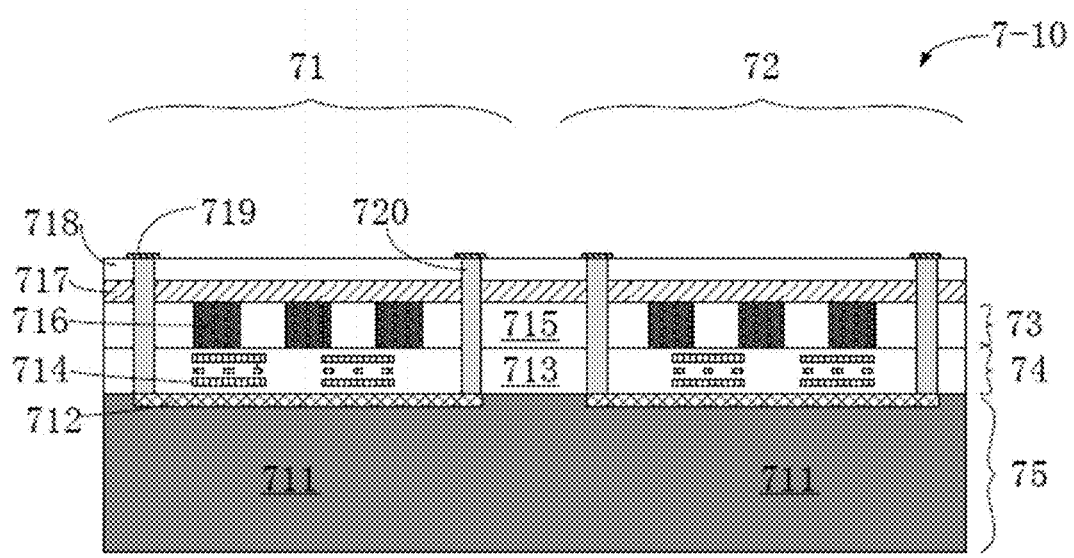

FIG. 35 is a schematic diagram of a cross section of one CMOS image sensor wafer 7-10. Those skilled in the art should recognize that one CMOS wafer may have a plurality of chips, and only two chips 71 and 72 are schematically shown in this figure. As shown in FIG. 35, the CMOS image sensor wafer includes a photosensitive layer 73, an interconnection layer 74, a substrate layer 75, and a dielectric film layer 717 on the photosensitive layer 73. The dielectric film layer is usually formed by stacking a hafnium dioxide film and a tantalum pentoxide film, and a silicon oxide layer 718 is located on the dielectric film layer 717. The photosensitive layer 73 includes a photosensitive part 716 formed in a semiconductor material 715, and the photosensitive part 716 may be a photodiode. The semiconductor material layer 715 can be made of any suitable material, such as silicon, III-V family materials on silicon, graphene on silicon, silicon on insulator, and combinations thereof. Although the photodiode 716 is described in the present disclosure, it should be understood that any suitable photosensitive structures can be applied in the present disclosure. The photodiode 716 can convert a measured light signal into a current signal. The photodiode 716 may include a source and a drain of one metal oxide semiconductor (MOS) transistor, which can transmit the current to other components, such as to another MOS transistor. Other components, such as reset transistors, current source followers, or row selectors configured to convert current values into digital signals, may also be included. A CMOS graphic sensor 7-10 may also include a dielectric layer, and it should be noted that this dielectric layer may include any suitable electrical insulating material. The interconnection layer 74 includes a metal wiring 714 formed in a dielectric layer 713, the metal wiring 714 can be used for internal interconnection of integrated circuit materials and also for electrical connection to the outside. The substrate layer 75 includes a silicon substrate 711 and a CMOS processing circuit layer 712. The CMOS processing circuit layer may include a CMOS circuit required for sequencing operations. For example, the CMOS processing circuit layer 712 may include circuits for image processing, signal processing, control functions for sequencing operations, and external communication. The CMOS processing circuit 712 processes photosensitive signals sensed by the photosensitive layer 73 into electrical signals, and transmits the electrical signals to an external device through interconnection silicon through-holes 720 and pads 719.

Those skilled in the art should appreciate that the structure of the CMOS image sensor chip described in the present disclosure is merely illustrative, but is not restrictive, and image sensor chips having any structures can be used in the present disclosure.

Then, as described below with reference to FIG. 36A, FIG. 36B, and FIG. 36C, a transition metal oxide layer having arrayed "spot" or "well" structures is formed on the CMOS image sensor wafer 7-10 shown in FIG. 35.

Figure 36A:
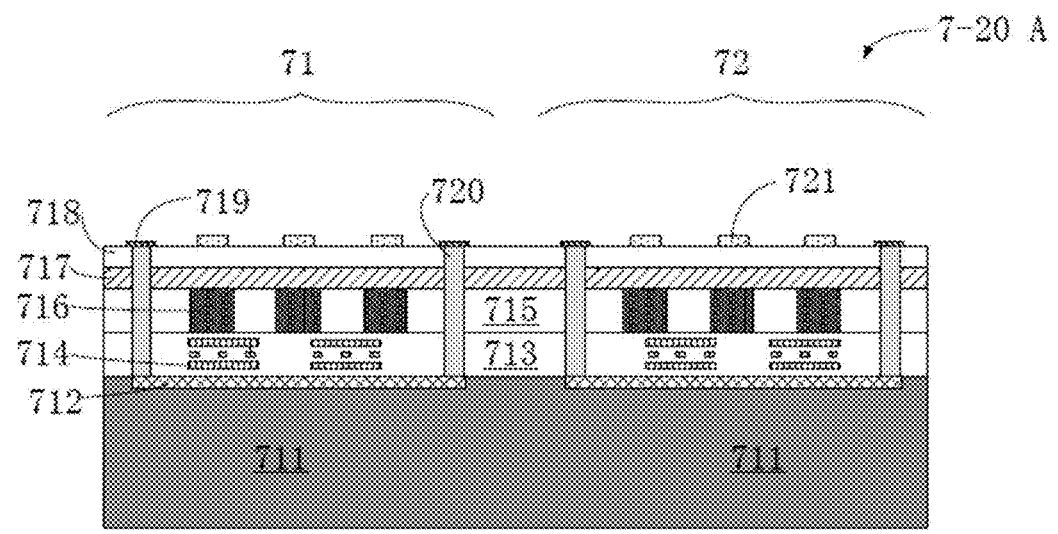
FIG. 36A is a cross-sectional view of a wafer structure 7-20A according to an embodiment of the present disclosure, which is formed after a patterned transition metal oxide layer having arrayed "spot" structures is formed on the CMOS wafer 7-10 shown in FIG. 35.

FIG. 36A is a cross-sectional view of a CMOS wafer 7-20A formed after a patterned transition metal oxide layer having "spot" structures is formed on the CMOS image sensor wafer 7-10 shown in FIG. 35. The forming process thereof in this figure is similar to that described in Embodiment 1 with reference to FIG. 1, except that the wafer in this figure is a CMOS wafer, and the transition metal oxide regions 721 in form of "spot" structures are distributed above the photodiode array 716.

Figure 36B:
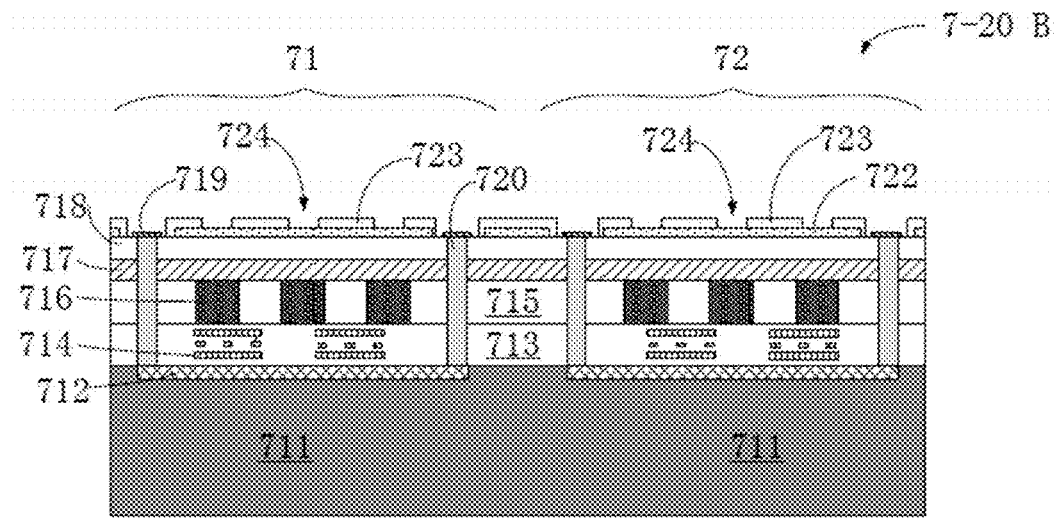
FIG. 36B is a cross-sectional view of a wafer structure 7-20B according to an embodiment of the present disclosure, which is formed after a patterned transition metal oxide layer having arrayed "well" structures is formed on the CMOS wafer 7-10 shown in FIG. 35.

FIG. 36B is a cross-sectional view of a CMOS wafer structure 7-20B formed after a patterned transition metal oxide layer having "well" structures is formed on the CMOS image sensor wafer 7-10 shown in FIG. 35. The forming process thereof in this figure is similar to that in Embodiment 2 described with reference to FIG. 6 and FIG. 7, except that the wafer in this figure is a CMOS wafer, and the transition metal oxide regions 724 in form of "well" structures are distributed above the photodiode array 716.

Figure 36C:
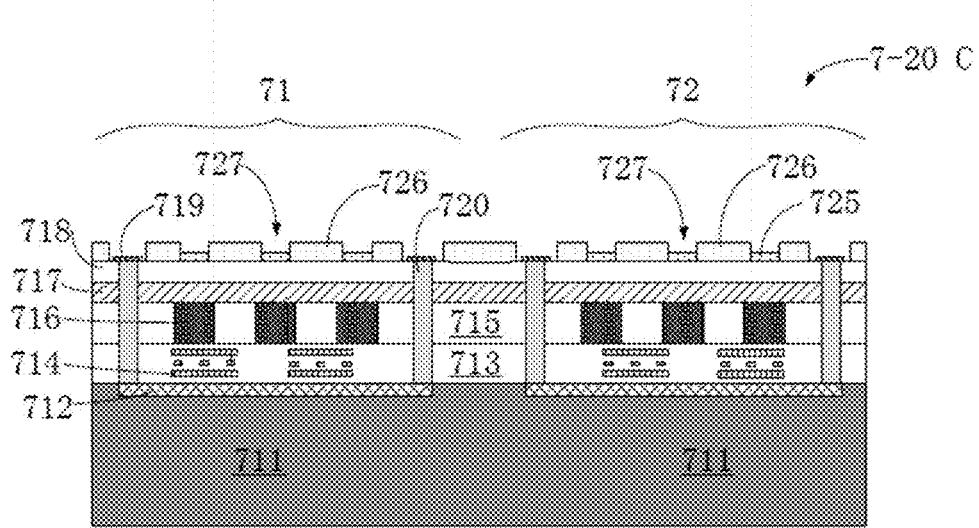
FIG. 36C is a cross-sectional view of a wafer structure 7-20C according to an embodiment of the present disclosure, which is formed after a different patterned transition metal oxide layer having arrayed "well" structures is formed on the CMOS wafer 7-10 shown in FIG. 35.

FIG. 36C is a cross-sectional view of a CMOS wafer structure 7-20C formed after another patterned transition metal oxide layer having "well" structures is formed on the CMOS image sensor wafer 7-10 shown in FIG. 35. The forming process thereof in FIG. 36C is similar to that in Embodiment 2 described with reference to FIG. 12 and FIG. 13, except that the wafer in this figure is a CMOS wafer, and the transition metal oxide regions 727 in form of "well" structures are distributed above the photodiode array 716.

Figure 37:
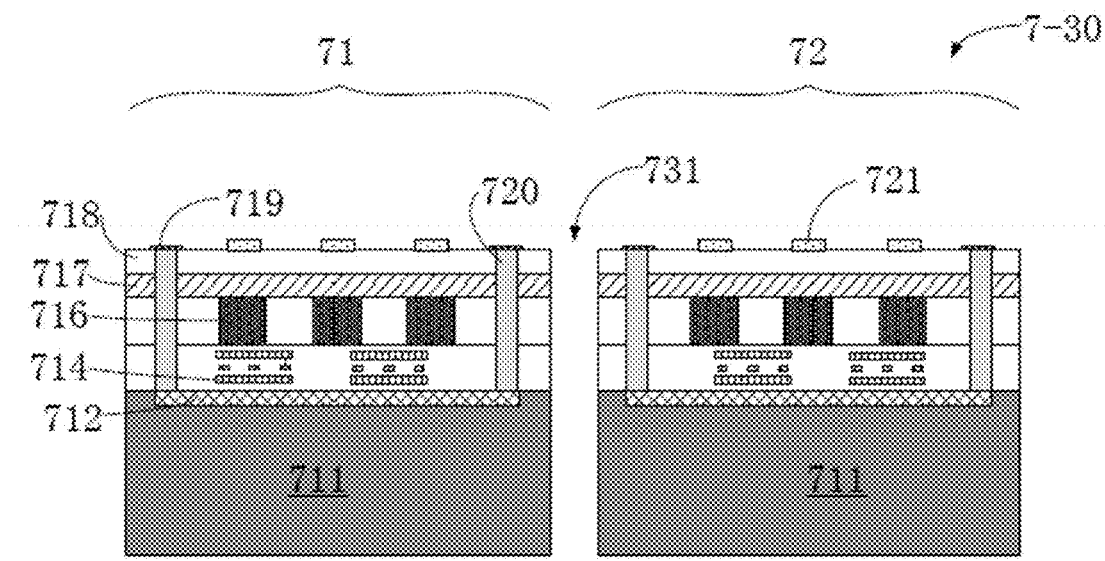

FIG. 37 is a cross-sectional view of multiple individual chips 7-30 separated by a cutting slot 731 formed after the CMOS wafer 7-20A having the patterned transition metal oxide layer as shown in FIG. 36A is subjected to a dicing process. As the subsequent processes of FIG. 36A, FIG. 36B, or FIG. 36C are the same, merely the patterned wafer shown in FIG. 36A will be taken for description below. The dicing process is similar to that described in Embodiment 1 with reference to FIG. 2.

Figure 38:
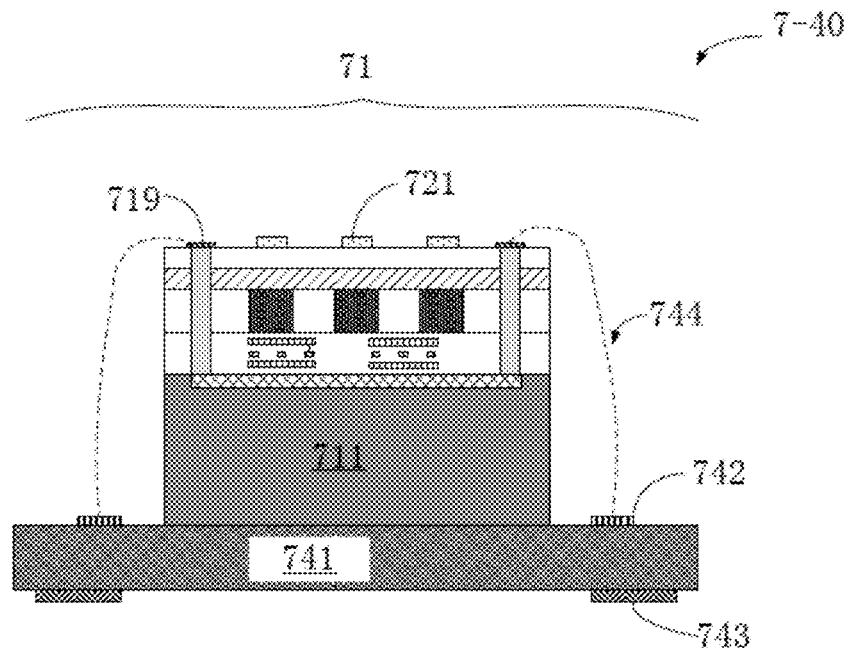

FIG. 38 is a cross-sectional view of a chip structure 7-40 formed by chip attaching and wire bonding with the chip shown in FIG. 37. FIG. 38 illustrates first two steps in an assembly process of sequencing chip. First, one single chip is attached to a package underlay 741 with a glue or adhesive. The package underlay 741 can be an LGA package underlay. A front side of the underlay is provided with pads 742 configured to be electrically connected to chips, and a back side of the underlay is provided with touch points 743 configured to be electrically connected to an external device. The pads 742 are connected to the touch points 743 in one-to-one correspondence through the wirings inside the underlay. Then, the pads 719 on the chip are electrically connected to the pads 742 on the underlay through the wire bonding, allowing the electrical signals from the chip to be transmitted to the underlay through the wires, and then transmitted to an external device through an interface between the underlay and the external device. It should be appreciated that the underlay described herein includes, but is not limited, to the LGA type, any suitable package underlay can be employed in the present disclosure, the glue or adhesive used in the chip attaching process also includes, but is not limited to, the glue or adhesive used in the packaging process, and the metal connection wire used in the wire bonding process also includes, but is not limited to, gold wire, aluminum wire, etc.

Figure 39:
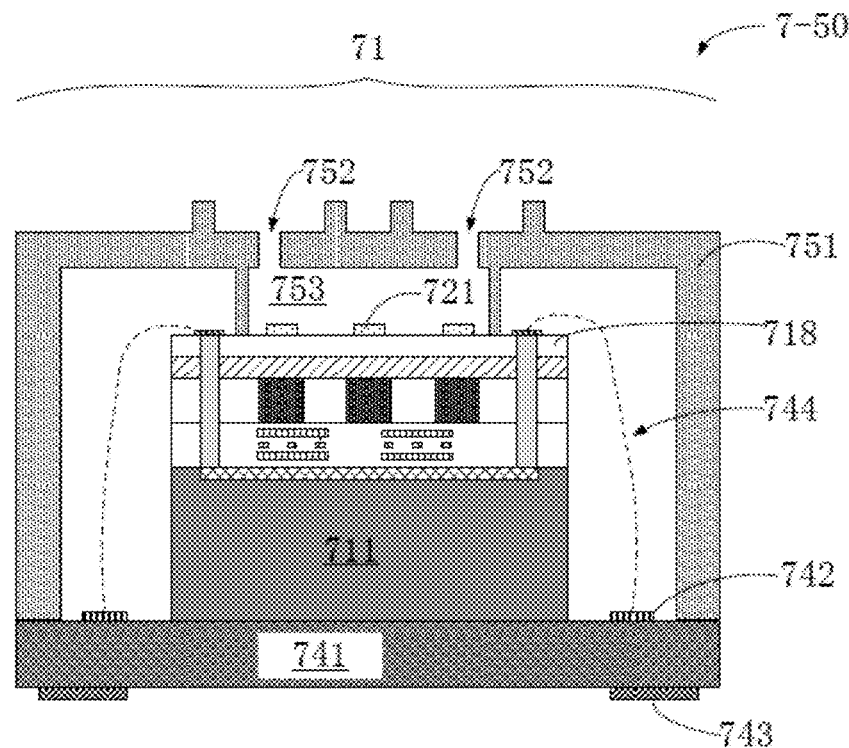

FIG. 39 is a cross-sectional view of a sequencing chip 7-50 formed after a cover structure is attached to the chip structure 7-40 shown in FIG. 38. In this figure, the cover structure 751, which includes a fluid channel 753, a liquid inlet and outlet 752, and a supporting structure, is attached to the CMOS image sensor chip and the underlay through glue or adhesive to form a sequencing chip. The fluid channel 753 is formed on the patterned transition metal oxide layer to confine the liquid within a certain space and to prevent the liquid from contacting the pads, wires, and other energized areas that are located outside the fluid channel. It should be recognized that the cover 751 can be made of any suitable material (including, but not limited to, PC, PEI, PEEK, PMMA, etc. of any color) and manufactured with any suitable processing method (including, but not limited to, CNC, open mold injection, 3D printing, etc.). Those skilled in the art should also appreciate that physical structures of the underlay 741 and the cover 751 include, but are not limited to, those shown in this figure, and any physical structures having the functions as illustrated in this figure should be included in the present disclosure.

Figure 40:
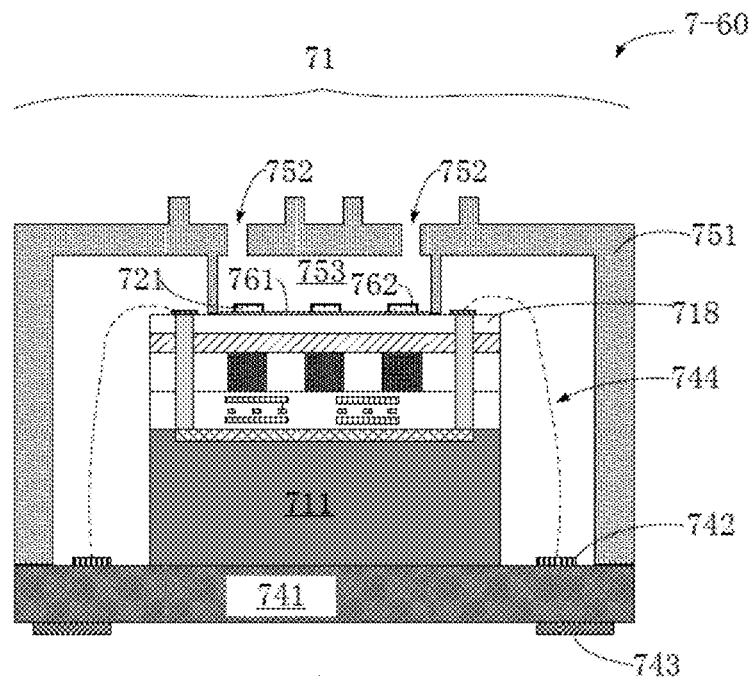

FIG. 40 is a cross-sectional view of a sequencing chip 7-60 formed after the sequencing chip shown in FIG. 39 is subjected to a surface functionalization modification. The functionalization treatment process in this figure is similar to that described in Embodiment 1 with reference to FIG. 4.

Figure 41A:
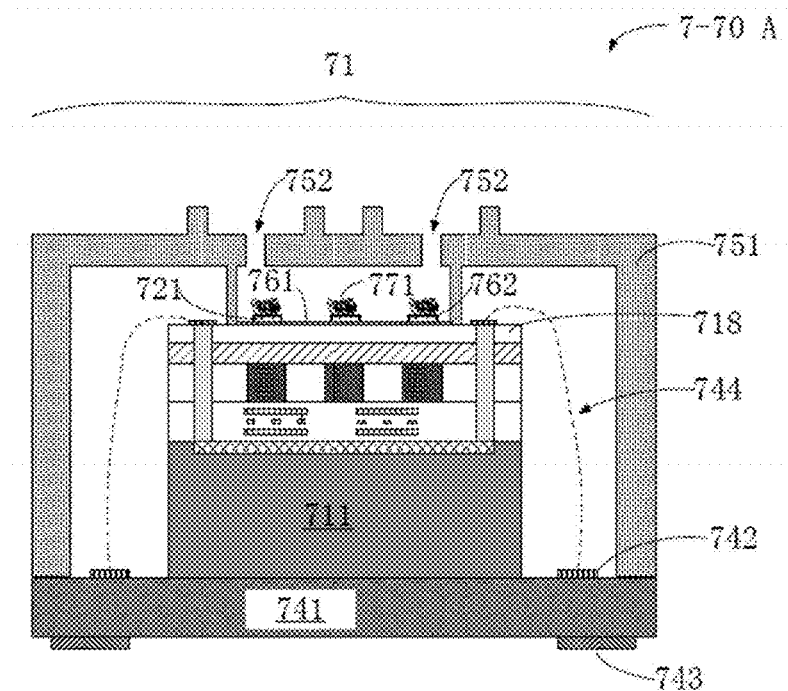
FIG. 41A is a cross-sectional view of a sequencing chip 7-70A with a DNB array according to an embodiment of the present disclosure, which are formed after DNBs are loaded on the chip 7-60 that has been subjected to a surface functionalization modification as shown in FIG. 40.

FIG. 41A is a cross-sectional view of a sequencing chip 7-70A with a DNB array formed after DNBs are loaded on the sequencing chip 7-60 shown in FIG. 40, which has been subjected to a functionalization treatment. The process of loading DNBs in this figure is similar to that described in Embodiment 1 with reference to FIG. 5, except that the DNBs labeled with fluorescent markers are excited to emit light through a biological or chemical method in this method, rather than being excited by an external excitation light source. Therefore, the light emitted by the DNB array through the biological or chemical method is captured by the photodiode array on the image sensor and output as an electrical signal by a processing circuit. Based on the light emitted by the DNB array at different times and different pixels (photodiodes), the base sequence of the DNBs can be identified.

Figure 41B:
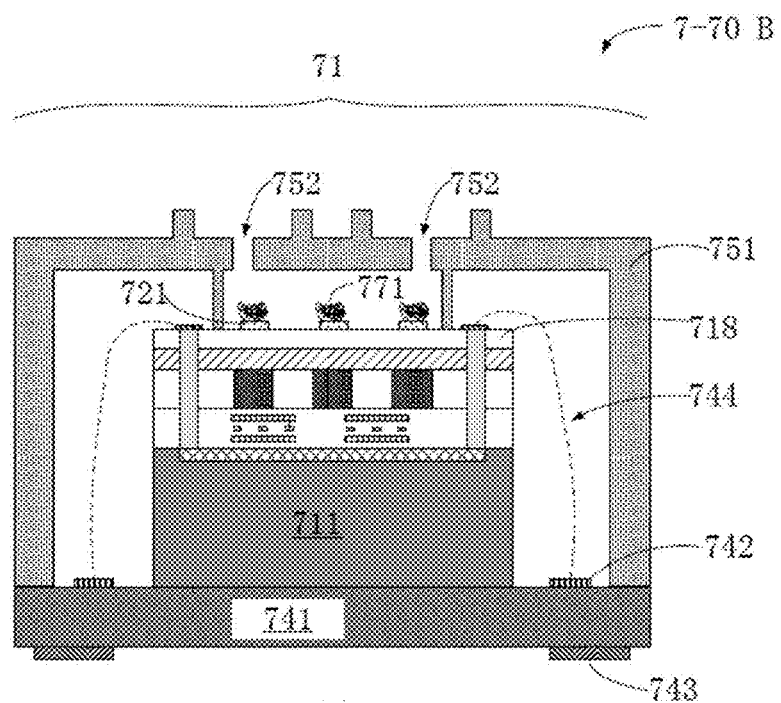
FIG. 41B is a cross-sectional view of a simpler sequencing chip 7-70B according to an embodiment of the present disclosure, in which a DNB array can be formed on the sequencing chip without performing a surface modification.

FIG. 41B illustrates another simpler method for loading DNBs without performing a surface functionalization. Such a loading method is similar to that described above with reference to FIG. 5B, and it can convert the light signal emitted by the DNBs into information about base sequence of the DNBs in the same manner as described with reference to FIG. 41A.

In Embodiment 7, similar to the foregoing embodiments, the transition metal oxide layer and the second silicon oxide layer form three types of "spot" or "well" structures on a photosensitive structure-containing CMOS wafer provided with the first silicon oxide layer.

The three types of "spot" or "well" structures include: 1. forming, on the first silicon oxide layer, a transition metal oxide layer having arrayed "spot" structures, and loading DNBs on the "spot" structures of the transition metal oxide layer; 2. forming the transition metal oxide film on the first silicon oxide layer, forming the second silicon oxide layer having arrayed "well" structures on the transition metal oxide film, and loading DNBs on the transition metal oxide layer at the bottom of each "well" structure of the second silicon oxide layer; and 3. forming the transition metal oxide layer having arrayed "spot" structures on the first silicon oxide layer, then forming the second silicon oxide layer having arrayed "well" structures on the transition metal oxide layer, and loading DNBs on the transition metal oxide "spot" structures located at the bottoms of the "well" structures of the silicon oxide layer. In these three types of "spot" or "well" structures, the light signal emitted by DNBs can be acquired by a photosensitive structure on the CMOS wafer after passing through the transition metal oxide, the first silicon oxide layer, and an anti-reflection layer (ARC layer, usually made of tantalum pentoxide) and a PIN layer (usually made of hafnium dioxide) on the CMOS wafer. Thus, intensities of signals acquired by the photosensitive structure after the light emitted by the DNBs passes through these films is simulated. The thicknesses of the PIN layer and the ARC layer depend upon the process of the CMOS wafer and are usually constant. The thickness of the PIN layer is 6 nm, and the thickness of the ARC layer is 50 nm. Accordingly, for the above-mentioned three types of "spot" or "well" structures, the influences of the varying thicknesses of the first silicon oxide layer, the transition metal oxide layer and the second silicon oxide layer on the intensity of fluorescence signal are simulated.

Figure 41C:
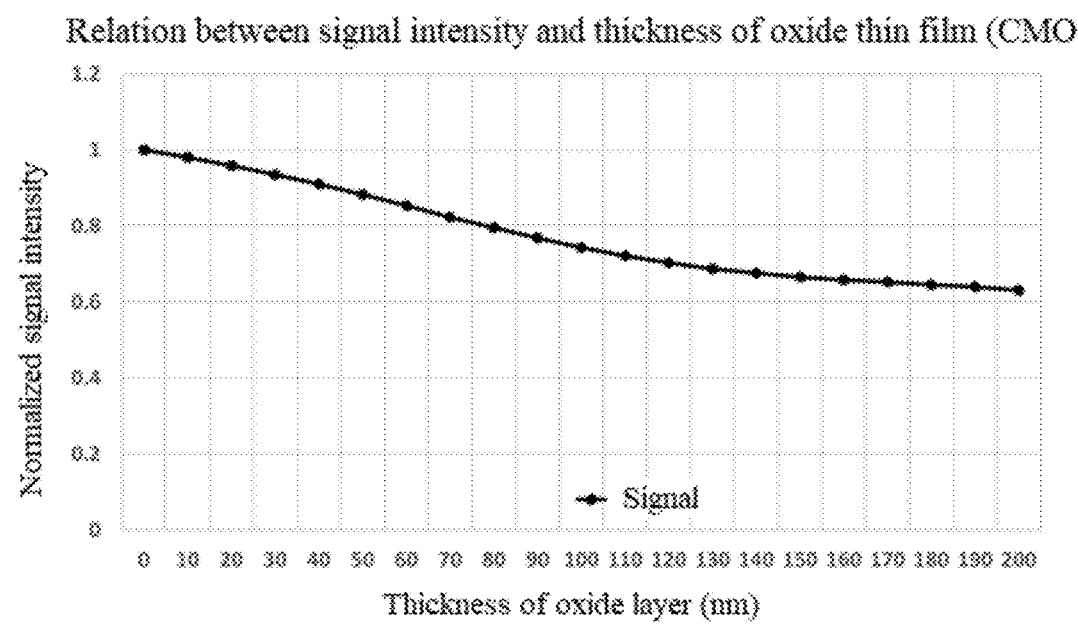
FIG. 41C illustrates a relation between a fluorescence intensity and a thickness of a top oxide layer based on a CMOS structure according to an embodiment of the present disclosure.

For the first situation described in the present embodiment, i.e., when the first silicon oxide layer is the only one silicon oxide layer, a relation between the intensity of fluorescence signal and the thickness of the first oxide layer is simulated. The simulation results are shown in FIG. 41C. The intensity of the light signal collected by the photosensitive structure in the CMOS wafer decreases monotonously with an increase in the thickness of the first oxide layer. Considering a compatibility with the existing standard CMOS process and a reliability of the corresponding product, the thickness of the oxide layer can be selected as 150 nm.

Figure 41D:
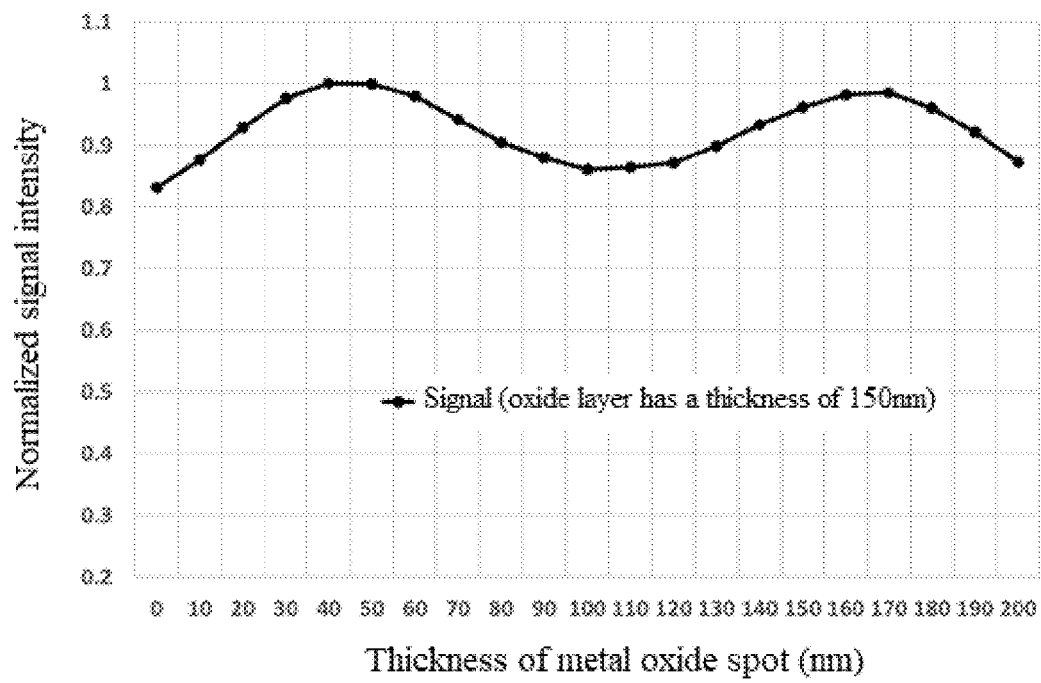
FIG. 41D illustrates a relation between a fluorescence intensity based on a CMOS structure and a thickness of a "spot"-like metal oxide layer according to an embodiment of the present disclosure.

When the thickness of the first silicon oxide layer is 150 nm, a relation between the intensity of fluorescence signal and the thickness of the transition metal oxide layer having arrayed "spot" structures on the first silicon oxide layer is then simulated. The simulation results are shown in FIG. 41D. The intensity of the light signal acquired by the photosensitive structure in the CMOS wafer fluctuates with a change of the thickness of the transition metal oxide layer. From the perspective of process, the optimal thickness can be selected to range from 40 nm to 50 nm.

Figure 41E:
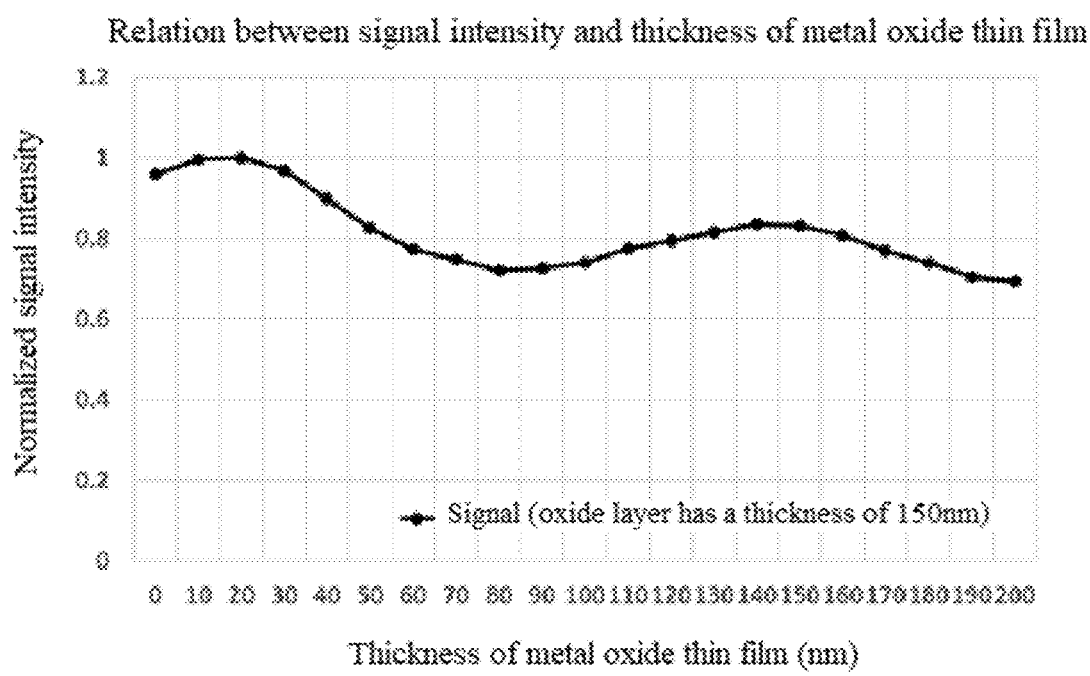
FIG. 41E illustrates a relation between a fluorescence intensity and a thickness of a thin-film metal oxide layer based on a CMOS structure according to an embodiment of the present disclosure.

Then, for the second situation in Embodiment 7, a relation between the thickness of the transition metal oxide layer film and the intensity of fluorescence signal is simulated to determine the thickness of the transition metal oxide layer film, when the thickness of the first silicon oxide layer is 150 nm and the transition metal oxide layer film is formed on the first silicon oxide layer. The simulation results are shown in FIG. 41E, in which the intensity of fluorescence signal fluctuates and varies with an increase in the thickness of the transition metal oxide layer film, and the intensity of fluorescence signal is the highest when the thickness is 10 nm to 20 nm.

Figure 41F:
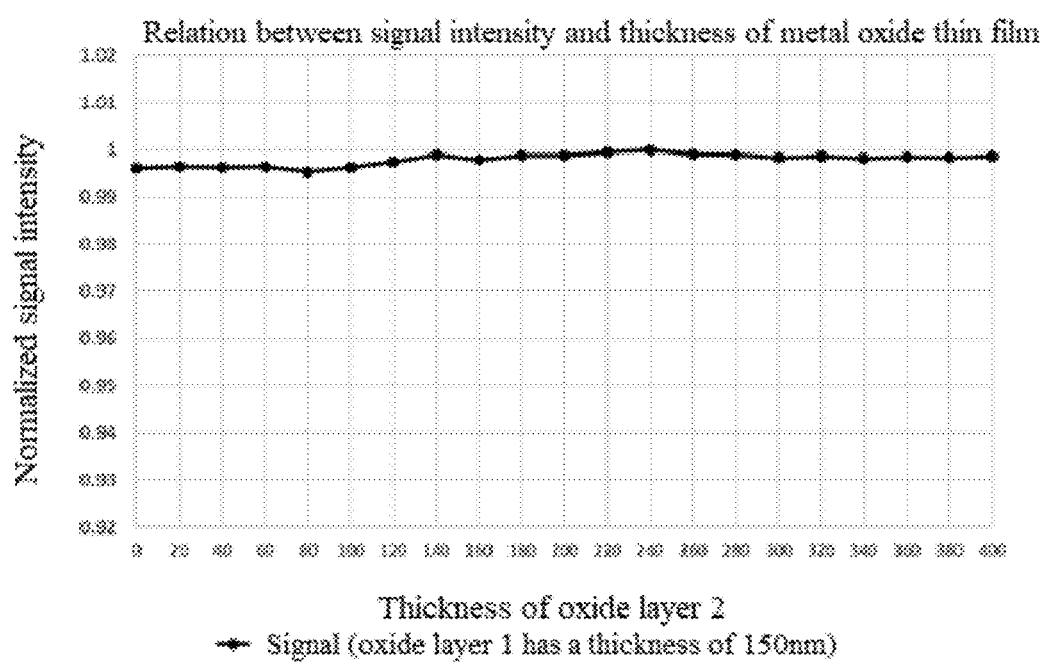
FIG. 41F illustrates a relation between a fluorescence intensity and a thickness of a second oxide layer (thin film metal oxide layer) based on a CMOS structure according to an embodiment of the present disclosure.

Further, when the second silicon oxide layer having the "well" structures is formed thereon, a relation between the thickness of the second silicon oxide layer and the intensity of fluorescence signal is simulated. The simulation results are shown in FIG. 41F. When the thickness of the transition metal oxide layer is fixed, a correlation between the intensity of the optical signal acquired from this structure and the thickness of the second oxide layer is negligible. Taking fluid requirements for DNA sequencing into account, if the thickness of the second oxide layer is too great, the surface structures may be too deep, which may easily lead to "fluid dead zones" and affect the quality of sequencing. The appropriate thickness of the second oxide layer allows DNBs to be tested to fall into the active regions effectively, and the thickness of the second oxide layer can be selected to be 50 nm to 100 nm.

Embodiment 8: Another Packaging Method of Reusable Sequencing Chip

In this embodiment, a new method for packaging a sequencing chip is provided. The sequencing chip used in this packaging method can be reused after subjected to a special processing process, thereby greatly reducing the costs of the sequencing chip.

A patterned array of transition metal oxide "spot" or "well" structures is first formed on a semiconductor wafer. The structure of such a patterned array can be any one of the structures present on the wafers described in the above Embodiments 1 to 3 with reference to FIG. 1, FIG. 7, and FIG. 13. In the present embodiment, the structure shown in FIG. 1 of Embodiment 1 is taken as an example to describe the manufacturing process of the reusable sequencing chip, and other structures of sequencing chip described in the present disclosure can also be used for manufacturing the reusable sequencing chip with the same packaging process.

Figure 42:
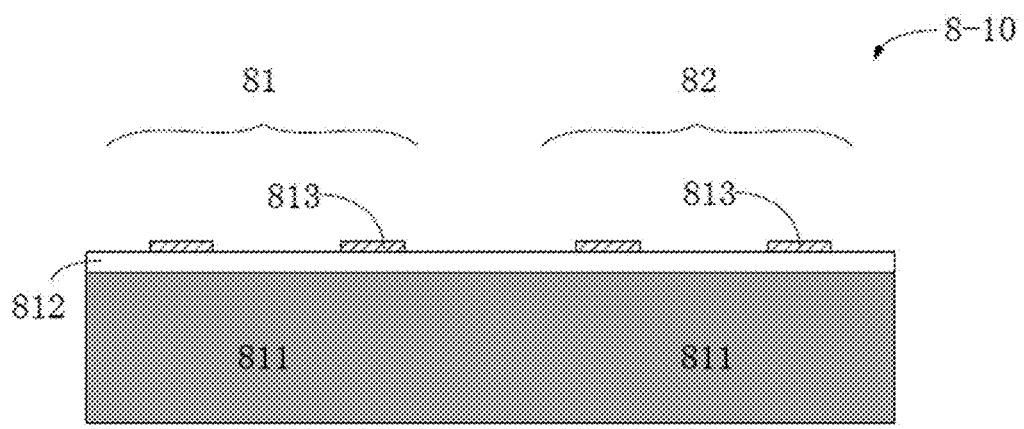
FIG. 42 is a cross-sectional view of a wafer structure 8-10 including a transition metal oxide layer having arrayed "spot" structures according to an embodiment of the present disclosure.

FIG. 42 is a cross-sectional view of a wafer structure 8-10 including a transition metal oxide layer having arrayed "spot" structures, which is the same as that shown in FIG. 1 of Embodiment 1. A silicon oxide layer 812 is formed on a semiconductor wafer substrate 811, the transition metal oxide layer 813 having "spot" structures is formed on the silicon oxide layer 812, and the process and material required in each step are the same as those described in Embodiment 1 with reference to FIG. 1.

Figure 43:
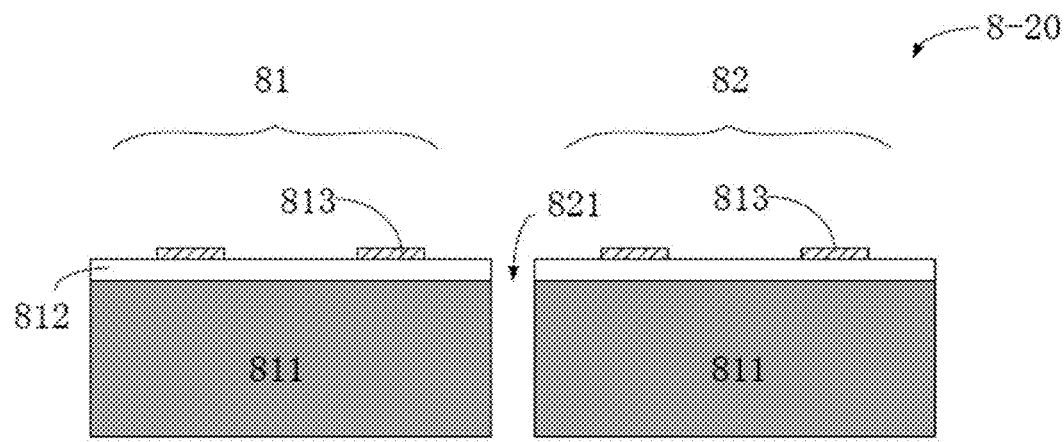
FIG. 43 is a cross-sectional view of a wafer structure 8-20 formed after the wafer structure 8-10 shown in FIG. 42 is subjected to a dicing process to form multiple individual chips 81 and 82 according to an embodiment of the present disclosure.

FIG. 43 is a cross-sectional view of a wafer structure 8-20 formed after the wafer structure 8-10 shown in FIG. 42 is subjected to a dicing process to form multiple individual chips 81 and 82. The dicing process is similar to that described in Embodiment 1 with reference to FIG. 2.

Figure 44:
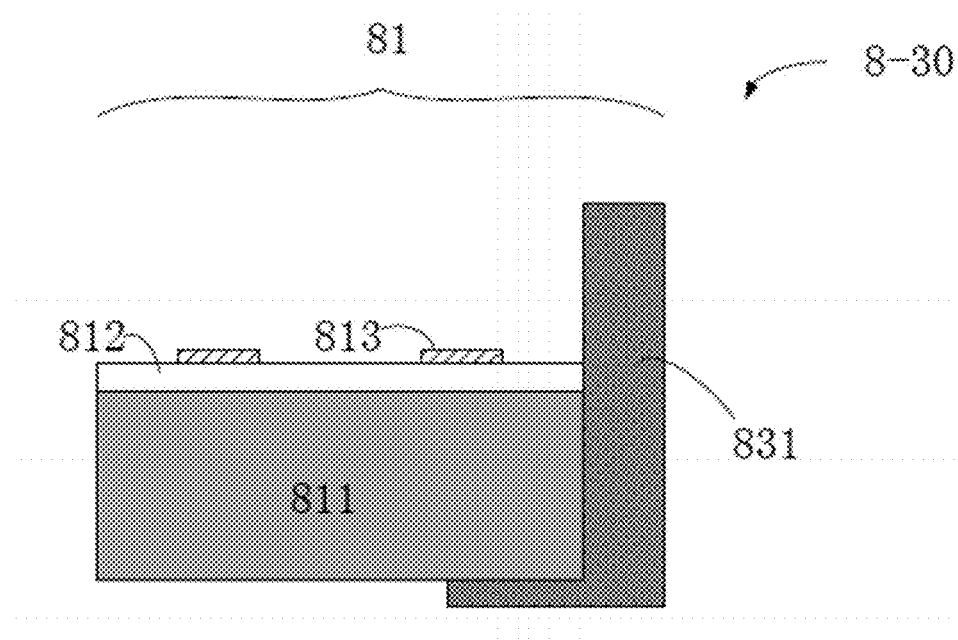
FIG. 44 is a cross-sectional view of a reusable sequencing chip 8-30 according to an embodiment of the present disclosure, which is formed by assembling the individual chip 81 or 82 formed in FIG. 43 with a handle structure 831.

FIG. 44 is a cross-sectional view of a reusable sequencing chip 8-30 formed by assembling one single chip 81 or 82 formed in FIG. 43 with a handle structure 831. The handle structure 831 functions in such a manner that the handle structure is fixed to one single chip to form a sequencing chip, and the sequencing chip can be grabbed and transferred for DNB loading and sequencing by means of the handle structure. FIG. 44 merely illustrates the handle structure in an "L" shape. Those skilled in the art should understand that any other handle structures that can achieve the above functions are included in the present disclosure, the number of the handle structures is not limited in the present disclosure, and one single chip can be packaged with multiple handle structures. The material of the handle structure can be selected from plastics or metals, which are compatible with DNB loading and sequencing reagents, low in cost, easy to process and resistant to aging and wearing. For example, the plastics include, but are not limited to, polymer plastics such as polyether-ether-ketone, polycarbonate, polymethyl methacrylate, etc., and the metals include, but are not limited to, aluminum alloy, stainless steel, etc. The single one chip and the handle structure are bonded together through a solid or liquid adhesive. Any other adhesives compatible with DNB loading and sequencing reagents can be used in the present disclosure.

Figure 45:
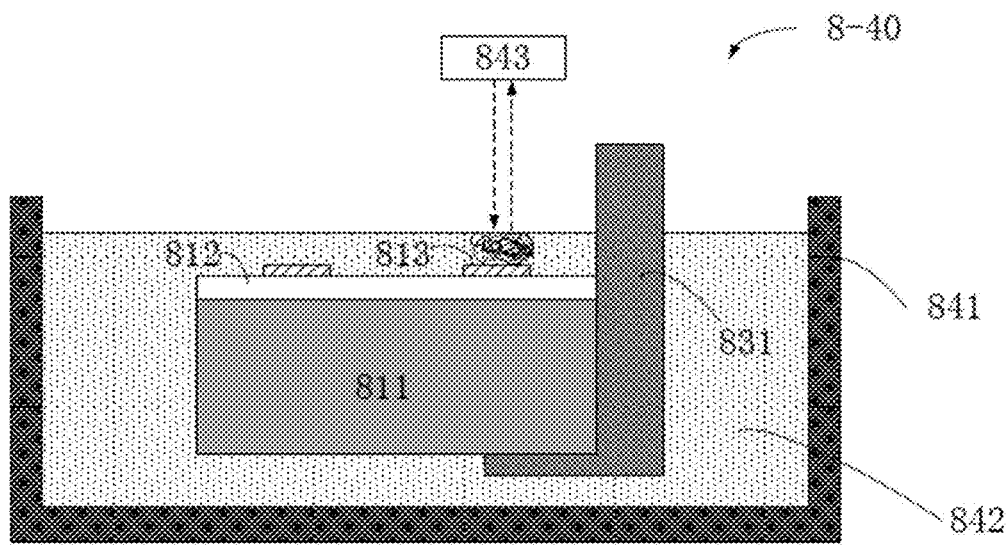
FIG. 45 is a schematic diagram illustrating that the assembled sequencing chip as shown in FIG. 44 is immersed into a container 841 containing a reagent 842 according to an embodiment of the present disclosure.

As shown in FIG. 45, the assembled sequencing chip shown in FIG. 44 is immersed into a container 841 containing a reagent 842. The reagent 842 can be any reagent required during the process of chip surface modification, DNB loading, and sequencing. In the process of chip surface modification, DNB loading, and sequencing, multiple containers 841 containing different reagents 842 may be used. By grabbing the handle structure on the sequencing chip, the sequencing chip can be transferred between different containers and reagents to perform different reactions. In FIG. 45, the DNB-binding site (the "spot" structure of the transition metal oxide layer) on the sequencing chip is loaded with a DNB. An excitation light source/camera 843 can be used to acquire light signals of different wavelengths and energy emitted by the DNB, so as to perform the sequencing operation.

After a complete sequencing operation is finished, the sequencing chip in such a package structure can be treated and reused. The specific processing method is described as below.

After the sequencing is finished, the sequencing chip is pre-treated, the handle structure is removed to completely expose the entire chip, and then the chip is immersed in an SC1 washing solution (Slide Clean 1, 50 mM potassium hydroxide solution containing Triton) for 10 min, then the chip was taken out, the surface of the chip is repeatedly cleaned 3 with deionized water 3 times or more, and the chip is placed in a nitrogen stream to be dried completely.

The SC1 washing solution can be replaced by an SC2 washing solution. The specific operation steps are as below. The handle structure is removed from the sequencing chip after sequencing, the chip is placed in the SC2 washing solution (Slide Clean 2, a mixture of ammonium hydroxide and hydrogen peroxide in a certain ratio), the washing solution is heated to 80° C. and keeps the chip for 5 min, then the chip is taken out and repeatedly cleaned three times or more with deionized water, and the chip is placed in a nitrogen stream to be dried completely.

The cleaning with the washing solution described above can be replaced by plasma drying, which includes: after the sequencing, placing the sequencing chip in an argon plasma atmosphere for 30 minutes, taking out, cleaning the chip with deionized water to remove dust, and placing the chip in a nitrogen stream to dry completely.

Figure 46:
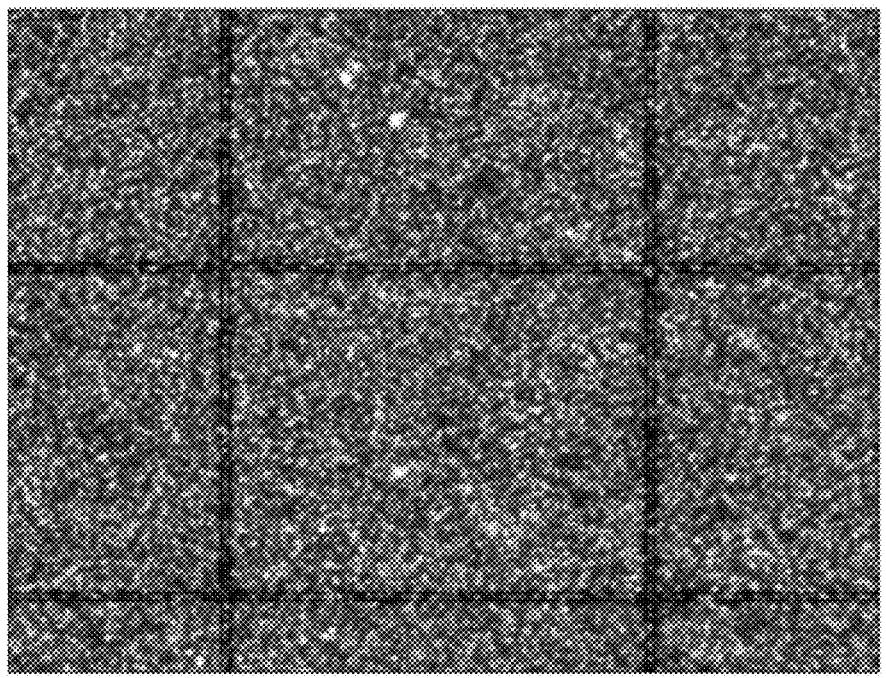
FIG. 46 is a fluorescence image of an unmodified transition metal oxide chip surface according to an embodiment of the present disclosure, obtained by changing DNB loading conditions.
Figure 47:
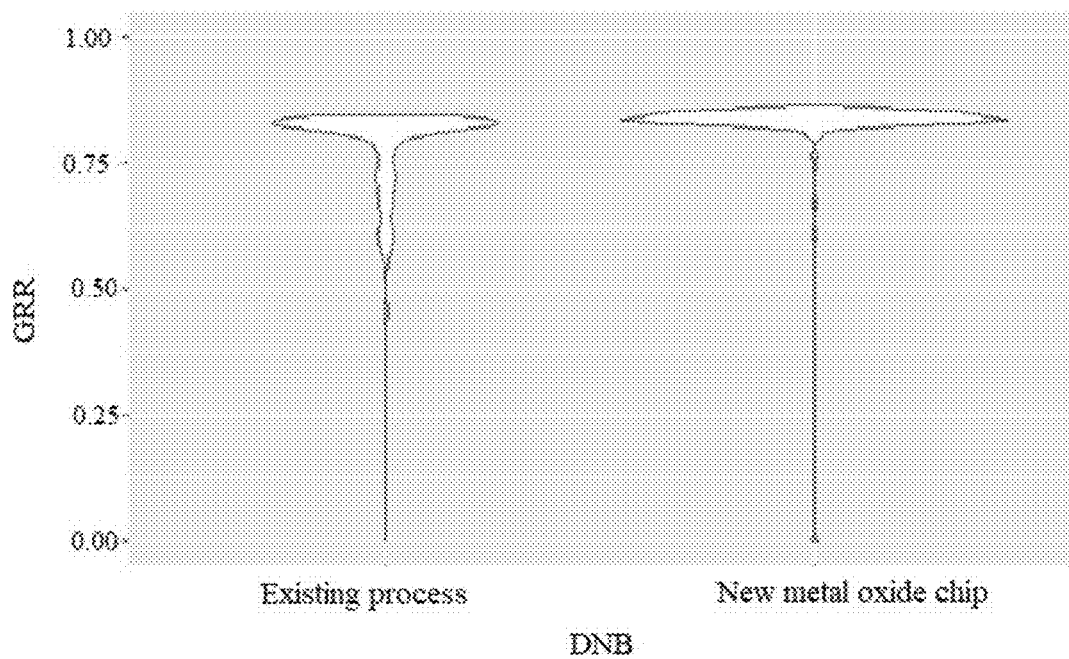
FIG. 47 is a diagram illustrating sequencing results on a Zebra platform according to an embodiment of the present disclosure.

Embodiment 9: Formation of a Microarray by Changing Loading Conditions Without Chip Surface Modification A silicon dioxide surface is used to simulate the non-binding site region, and transition metal oxide surface of titanium dioxide or tantalum pentoxide is used to simulate the binding site region. titanium dioxide. The three types of surfaces are cleaned by using a plasma cleaner, and then further cleaned with ethanol. A DNB solution (160 BP, 10 ng/μl), which is conditionally optimized by changing pH and a surfactant content of the solution, is used to load DNBs on the surface of the chip. After the loading of DNBs is completed, the DNBs are fluorescently labeled using cy3 dye, and then the surface of the chip is analyzed with a fluorescence microscope. The results are shown in FIG. 46, in which the bright spots are the loaded DNBs, the black lines are the area where the non-functional regions are relatively concentrated and a density of the functional regions is relatively lower, i.e., not adsorbing DNBs. A sequencing chip is formed by assembling such a chip according to the aforementioned packaging method, and the sequencing chip is placed on a Zebra platform for sequencing. The sequencing results are shown in FIG. 47. The DNB loading using the new transition metal oxide array chip has higher loading success rate (GRR value) than that using the chip manufactured by the existing process.

Conclusion: Due to the different surface properties of metal oxides and silicon dioxide, through changing the pH, the surfactant, and other components of the DNB solution, DNBs can be selectively adsorbed by the functional regions on the surface of the chip.

Figure 48:
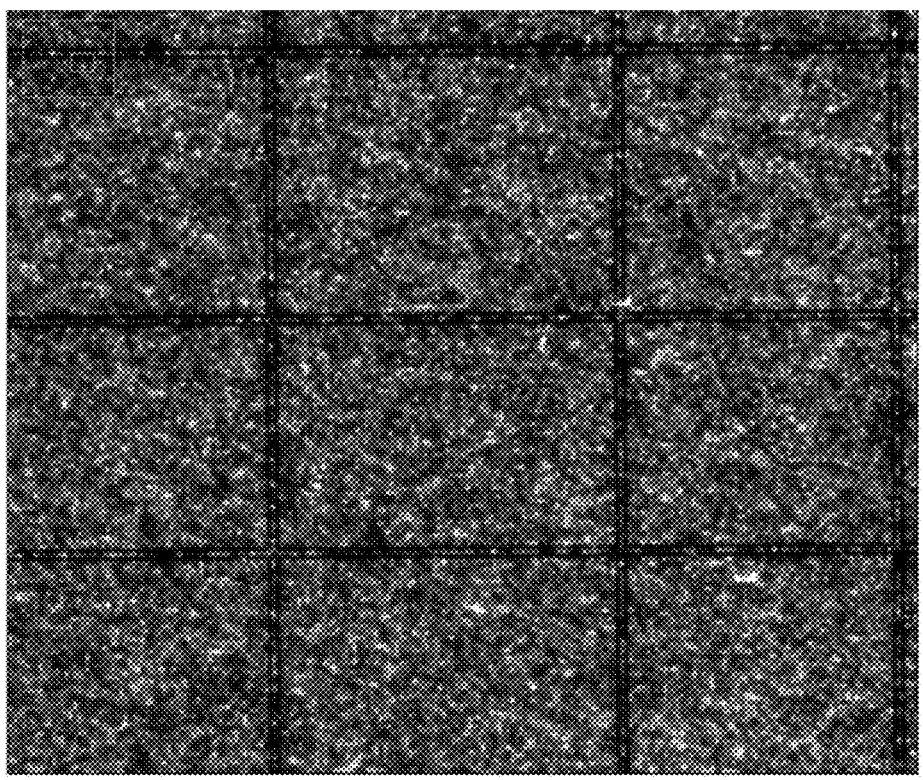
FIG. 48 is a fluorescence image after a transition metal oxide chip surface is subjected to a selective amination modification and then DNBs are loaded according to an embodiment of the present disclosure.

Embodiment 10: Detection of Effect on DNB Adsorption After Performing Selective Functionalization on Silicon Crystal Having an Array of Transition Metal Oxide Spots A silicon crystal chip having an array of transition metal oxide spots is cleaned with a plasma cleaner and ethanol, then is immersed into an aminoethylphosphonic acid solution (10 mM) for 24 hours. Then the silicon crystal chip is taken out, and the surface is cleaned with ethanol and water. Elemental analysis is conducted on each of the three types of surfaces using X-ray photoelectron spectrometer. The results indicate that, before and after amination, the silicon dioxide surface does not contain phosphorus components, while a phosphorus concentration on the titanium dioxide and tantalum pentoxide surface is increased from 0 before the amination to 2% after the amination. The DNB solution (160 BP, 10 ng/µl), which is identical to that used in sequencing, is used for loading DNBs on the surface of the chip. After DNB loading is finished, the DNBs are fluorescently labeled using cy3 dye, and then the surface of the chip was analyzed using a fluorescence microscope. The results are shown in FIG. 48. It can be seen from FIG. 48 that the transition metal oxide modified by aminophosphonic acid has a good adsorption effect on DNBs, and the silicon dioxide non-binding region (as illustrated with black lines in the figure) has fairly limited ability to adsorb DNBs.

The silicon crystal chip having an array of transition metal oxide spots is manufactured by oxidizing a surface of silicon dioxide wafer available in the industry, and then plating an array of transition metal oxide spots through ALD.

Conclusion: the silicon dioxide surface has no aminophosphonic acid component, and the aminophosphonic acid component is detected on the titanium dioxide and tantalum pentoxide surface, which proves the selectivity of the phosphonic acid reaction. The modified surface allows the transition metal oxide region to be selectively aminated, and enables the functional regions on the surface of the chip to specifically adsorb DNBs.

Figure 49:
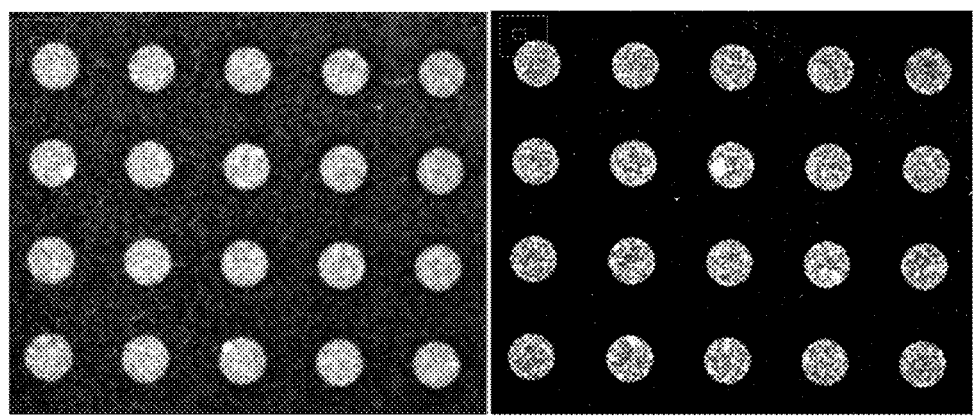
FIG. 49 is a fluorescence image according to an embodiment of the present disclosure, which obtained after the transition metal oxide region is subjected to an amination, the non-functional silicon dioxide region is subjected to a copolymer modification, and then DNBs are loaded, left: control group, right: experimental group.

Embodiment 11: Detection of Effect After Further Modifying Non-Functional Regions With Copolymer Containing Polyethylene Glycol In this embodiment, a chip with special design was used. The transition metal oxide regions on the chip have a size of 200 µm, and spaced apart from each other with a spacing of 500 µm. After the chip is cleaned and modified with aminophosphonic acid as described in Embodiment 9, the chip is immersed in an aqueous solution (10 mg/ml) of polyethyleneimine-polyethylene glycol (PEI-PEG) copolymer for 10 min, and then cleaned with pure water. Then a DNB solution (160 BP, 10 ng/µl), which is the same as that used in sequencing, is used to load DNBs on the surface of the chip. After DNB loading is finished, the DNBs are fluorescently labeled by using cy3 dye, and then the surface of the chip was analyzed using a fluorescence microscope. The results are shown in FIG. 49. It can be seen from FIG. 49 that the non-specific adsorption of the surface is further reduced after the silicon dioxide non-binding region is treated with the copolymer.

Conclusion: the adsorption of DNBs and impurities on the non-functional regions of the surface of the chip can be further reduced by using copolymer containing polyethylene glycol.

Figure 50:
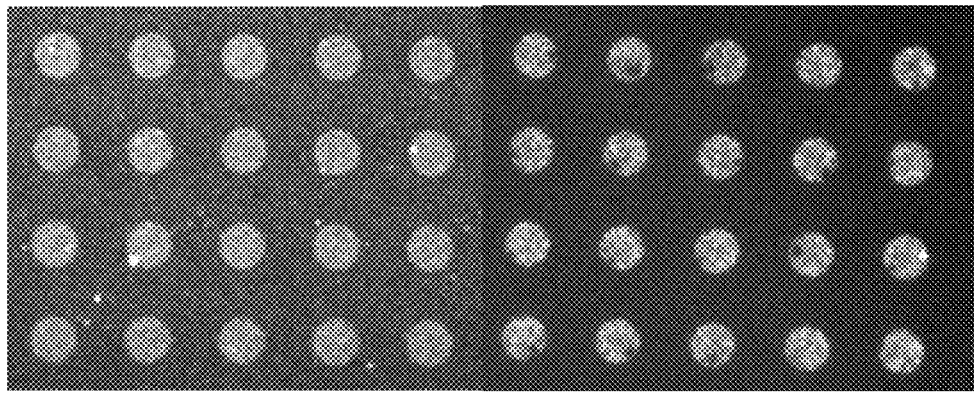
FIG. 50 is a fluorescence image for detecting effects of further modifying non-functional regions with a silane coupling agent containing polyethylene glycol according to an embodiment of the present disclosure, left: control group, right: experimental group.

Embodiment 12: Detection of Effect After Further Modifying Non-Functional Regions With Silane Coupling Agent Containing Polyethylene Glycol A silicon crystal chip having an array of transition metal oxide spots is cleaned with a plasma cleaner and ethanol, and then placed in a silane coupling agent solution modified with alendronic acid and polyethylene glycol. After a period of reaction, the silicon crystal chip was taken out, and cleaned with ethanol and water. Then a DNB solution (160 BP, 10 ng/µl), which is the same as that used in sequencing, is used to load DNBs on the surface of the chip. After DNB loading is completed, the DNBs were fluorescently labeled by using cy3 dye, and then the surface of the chip was analyzed using a fluorescence microscope, as shown in FIG. 50.

Conclusion: the adsorption of DNBs and impurities on the non-functional regions of the silicon dioxide surface can be further reduced by using the silane coupling agent containing polyethylene glycol.

In the specification, descriptions with reference to the terms "an embodiment", "some embodiments", "examples", "specific examples", or "some examples" etc. mean that specific features, structures, materials or characteristics described in conjunction with the embodiment or example are included in at least one embodiment or example of the present disclosure. In this specification, the above terms do not necessarily refer to the same embodiment or example. Moreover, the mentioned specific features, structures, materials or characteristics can be combined in a suitable manner in any one or more embodiments or examples. In addition, those skilled in the art can combine the different embodiments or examples and combine the features of the different embodiments or examples described in this specification, as long as they are not contradictory to each other.

Although the embodiments of the present disclosure have been illustrated and described above, it shall be understood that the above-mentioned embodiments are illustrative and should not be construed as limitations of the present disclosure. Those skilled in the art can make changes, modifications, replacements and variations to the above-mentioned embodiments within the scope of the present disclosure.

What is claimed is:

1. A chip matrix, comprising:
    a wafer, wherein the wafer has cutting lines that are evenly distributed on the wafer;
    a first silicon oxide layer, wherein the first silicon oxide layer is made of silicon oxide and is formed on an upper surface of the wafer;
    a transition metal oxide layer, wherein the transition metal oxide layer is made of a transition metal oxide and is formed on an upper surface of the first silicon oxide layer; and a second silicon oxide layer, wherein the transition metal oxide layer is of a continuous layer structure, and the second silicon oxide layer is made of silicon oxide and formed on an upper surface of the transition metal oxide layer as a plurality of wells that are connected to each other; or wherein the transition metal oxide layer consists of a plurality of transition metal oxide spots that are unconnected to each other, and the second silicon oxide layer is formed on the upper surface of the first silicon oxide layer located among the plurality of transition metal oxide spots that are unconnected to each other, wherein the wafer is a silicon wafer, the second silicon oxide layer has a thickness ranging from 40 nm to 60 nm.

2. The chip matrix according to claim 1, wherein the transition metal oxide layer has a thickness ranging from 5 nm to 15 nm, and the first silicon oxide layer has a thickness ranging from 80 nm to 100 nm.

3. The chip matrix according to claim 1, wherein, when the transition metal oxide layer is of a continuous layer structure, the transition metal oxide layer at a bottom of each well of the second silicon oxide layer is modified by amino groups; or when the transition metal oxide layer consists of a plurality of transition metal oxide spots, the plurality of transition metal oxide spots are modified by amino groups; and optionally, the second silicon oxide layer is modified with polyethylene glycol.

4. The chip matrix according to claim 3, wherein the amino groups are connected to at least a part of transition metal oxide molecules in the transition metal oxide layer through chemical bonds;

optionally, the chemical bonds are formed by the at least part of transition metal oxide molecules and phosphate groups of aminophosphonic acid-based compounds.

5. The chip matrix according to claim 3, wherein the polyethylene glycol is provided by at least one selected from polyethyleneimine-polyethylene glycol and a silane coupling agent containing polyethylene glycol;

when the polyethylene glycol is provided by the polyethyleneimine-polyethylene glycol, and the polyethyleneimine-polyethylene glycol is electrostatically adsorbed on a surface of the first silicon oxide layer or a surface of the second silicon oxide layer; and when the polyethylene glycol is provided by the silane coupling agent containing polyethylene glycol, and the silane coupling agent containing polyethylene glycol is connected to the first silicon oxide layer or the second silicon oxide layer through a —Si—O—Si-chain.

6. The chip matrix according to claim 1, wherein the transition metal oxide comprises at least one of titanium dioxide, zirconium dioxide, tantalum pentoxide, niobium hexaoxide, or hafnium dioxide.

7. A sequencing chip, comprising a chip body, wherein the chip body comprises a number of chip units obtained by cutting the chip matrix according to claim 1 along the cutting lines of the wafer.

8. The sequencing chip according to claim 7, wherein the sequencing chip is reusable.

9. A method for manufacturing the chip matrix according to claim 1, the method comprising: performing surface modification on the wafer, wherein the surface modification comprises: treating a surface of the wafer with a transition metal oxide to form the transition metal oxide layer, wherein the transition metal oxide layer is formed on an upper surface of the first silicon oxide layer, the first silicon oxide layer is provided on the upper surface of the wafer, and the silicon oxide layer is made of silicon oxide, and the wafer has cutting lines evenly distributed on the wafer.

10. The method according to claim 9, wherein the first silicon oxide layer is formed in advance on the upper surface of the wafer by low-temperature plasma chemical vapor deposition, plasma enhanced chemical vapor deposition, sputtering, or atomic layer deposition.

11. The method according to claim 9, wherein the surface modification of the wafer is performed by thin film deposition, photolithography, or etching to form the transition metal oxide layer in form of a continuous layer or in form of arrayed spots.

12. The method according to claim 11, wherein, for the transition metal oxide layer in form of a continuous layer, the method further comprises forming, with silicon oxide, a second silicon oxide layer in form of continuous wells on an upper surface of the transition metal oxide layer;

for the transition metal oxide layer in form of arrayed spots, the method further comprises depositing silicon oxide between the spots of the transition metal oxide layer to form a second silicon oxide layer.

13. The method according to claim 9, further comprising performing amination treatment on the transition metal oxide, wherein the amination treatment is performed by reacting transition metal oxide with an aminophosphonic acid-based compound.

14. The method according to claim 9, further comprising performing a surface modification on the first silicon oxide layer or the second silicon oxide layer to introduce polyethylene glycol on the first silicon oxide layer or the second silicon oxide layer; and the polyethylene glycol is provided by at least one of polyethyleneimine-polyethylene glycol or a silane coupling agent containing polyethylene glycol;

optionally, when the polyethylene glycol is provided by polyethyleneimine-polyethylene glycol, the surface modification is performed by electrostatic adsorption of polyethyleneimine-polyethylene glycol on a surface of the first silicon oxide layer or a surface of the second silicon oxide layer;

optionally, when the polyethylene glycol is provided by the silane coupling agent containing polyethylene glycol, the surface modification is performed by condensation reaction of the silane coupling agent containing polyethylene glycol with hydroxyl groups of the first silicon oxide layer or the second silicon oxide layer, wherein the hydroxyl groups are provided by Si—OH generated after the first silicon oxide layer or the second silicon oxide layer is ionized and adsorbs hydroxide ions in water.

15. A method for manufacturing a sequencing chip, comprising:

assembling a chip unit, wherein the chip unit is obtained by cutting a chip matrix along cutting lines of a wafer layer of the chip matrix, the chip matrix is as defined in claim 1.

16. The method according to claim 15, wherein said assembling comprises placing the chip unit in a supporting frame including a liquid inlet and outlet, and bonding the chip unit to the supporting frame with a glue or adhesive, a fluid channel being formed between the frame and the chip unit.

17. The method according to claim 16, wherein, when the wafer is a silicon wafer, said assembling comprises: bonding the chip unit to the support frame with an upper surface of the chip unit facing upward, and placing a cover glass on the upper surface of the chip unit to obtain the sequencing chip.

18. The method according to claim 16, wherein, when the wafer is a quartz wafer or a glass wafer, said assembling comprises: bonding the chip unit to the support frame with a lower surface of the chip unit facing upward to obtain the sequencing chip.

19. A sequencing method, comprising performing sequencing using the sequencing chip according to claim 7.

20. A chip matrix, comprising:
- a wafer, wherein the wafer has cutting lines that are evenly distributed on the wafer;
- a first silicon oxide layer, wherein the first silicon oxide layer is made of silicon oxide and is formed on an upper surface of the wafer;
- a transition metal oxide layer, wherein the transition metal oxide layer is made of a transition metal oxide and is formed on an upper surface of the first silicon oxide layer; and
- a second silicon oxide layer, wherein the transition metal oxide layer is of a continuous layer structure, and the second silicon oxide layer is made of silicon oxide and formed on an upper surface of the transition metal oxide layer as a plurality of wells that are connected to each other; or wherein the transition metal oxide layer consists of a plurality of transition metal oxide spots that are unconnected to each other, and the second silicon oxide layer is formed on the upper surface of the first silicon oxide layer located among the plurality of transition metal oxide spots that are unconnected to each other, wherein the wafer is a quartz wafer, the second silicon oxide layer has a thickness ranging from 100 nm to 200 nm.

21. The chip matrix according to claim 20, wherein the transition metal oxide layer has a thickness ranging from 10 nm to 20 nm, and the first silicon oxide layer has a thickness ranging from 80 nm to 100 nm.

* * * * *